(12) United States Patent
Yamazaki et al.

(10) Patent No.: US 8,809,856 B2
(45) Date of Patent: Aug. 19, 2014

(54) SEMICONDUCTOR DEVICE

(71) Applicant: Semiconductor Energy Laboratory Co., Ltd., Atsugi (JP)

(72) Inventors: Shunpei Yamazaki, Tokyo (JP); Miyuki Hosoba, Kanagawa (JP); Junichiro Sakata, Kanagawa (JP); Hideaki Kuwabara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/784,908

(22) Filed: Mar. 5, 2013

(65) Prior Publication Data

US 2013/0175526 A1    Jul. 11, 2013

Related U.S. Application Data

(60) Continuation of application No. 13/717,806, filed on Dec. 18, 2012, which is a division of application No. 12/846,603, filed on Jul. 29, 2010, now Pat. No. 8,384,079.

(30) Foreign Application Priority Data

Jul. 31, 2009    (JP) ................................. 2009-180077

(51) Int. Cl.
*H01L 29/786*    (2006.01)
*H01L 27/12*    (2006.01)

(52) U.S. Cl.
CPC ........ *H01L 29/7869* (2013.01); *H01L 27/1225* (2013.01)
USPC .......................................................... 257/43

(58) Field of Classification Search
CPC ..................... H01L 27/1225; H01L 27/12114; H01L 27/1222; H01L 29/7869; H01L 29/786

USPC ............................................................ 257/99
See application file for complete search history.

(56) References Cited

U.S. PATENT DOCUMENTS 5,731,856 A    3/1998    Kim et al.
5,744,864 A    4/1998    Cillessen et al.

(Continued)

FOREIGN PATENT DOCUMENTS

EP    1737044 A1    12/2006
EP    1981085 A1    10/2008

(Continued)

OTHER PUBLICATIONS

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

(Continued)

*Primary Examiner* — Nikolay Yushin
(74) *Attorney, Agent, or Firm* — Fish & Richardson P.C.

(57) ABSTRACT

An object is to provide a semiconductor device having a structure in which parasitic capacitance between wirings can be efficiently reduced. In a bottom gate thin film transistor using an oxide semiconductor layer, an oxide insulating layer used as a channel protection layer is formed above and in contact with part of the oxide semiconductor layer overlapping with a gate electrode layer, and at the same time an oxide insulating layer covering a peripheral portion (including a side surface) of the stacked oxide semiconductor layer is formed. Further, a source electrode layer and a drain electrode layer are formed in a manner such that they do not overlap with the channel protection layer. Thus, a structure in which an insulating layer over the source electrode layer and the drain electrode layer is in contact with the oxide semiconductor layer is provided.

28 Claims, 35 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,838,308 B2 | 1/2005 | Haga |
| 7,022,556 B1 | 4/2006 | Adachi |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,405,432 B2 | 7/2008 | Adachi |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,110,436 B2 | 2/2012 | Hayashi et al. |
| 8,143,115 B2 | 3/2012 | Omura et al. |
| 8,148,721 B2 | 4/2012 | Hayashi et al. |
| 8,148,779 B2 | 4/2012 | Jeong et al. |
| 8,188,480 B2 | 5/2012 | Itai |
| 8,193,045 B2 | 6/2012 | Omura et al. |
| 8,203,143 B2 | 6/2012 | Imai |
| 8,212,247 B2 | 7/2012 | Kang et al. |
| 8,297,991 B2 | 10/2012 | Adachi |
| 8,445,902 B2 | 5/2013 | Sato et al. |
| 8,476,665 B2 | 7/2013 | Adachi |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0043447 A1 | 3/2006 | Ishii et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0001374 A1 | 1/2009 | Inoue et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0006833 A1 | 1/2010 | Ha et al. |
| 2010/0025678 A1 | 2/2010 | Yamazaki et al. |
| 2010/0032665 A1 | 2/2010 | Yamazaki et al. |
| 2010/0051937 A1 | 3/2010 | Kaji et al. |
| 2010/0051938 A1 | 3/2010 | Hayashi et al. |
| 2010/0051949 A1 | 3/2010 | Yamazaki et al. |
| 2010/0065844 A1 | 3/2010 | Tokunaga |
| 2010/0072467 A1 | 3/2010 | Yamazaki et al. |
| 2010/0078633 A1 | 4/2010 | Watanabe |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0140612 A1 | 6/2010 | Omura et al. |
| 2010/0176388 A1 | 7/2010 | Ha et al. |
| 2010/0258805 A1 | 10/2010 | Ikeda et al. |
| 2010/0283049 A1 | 11/2010 | Sato et al. |
| 2011/0024740 A1 | 2/2011 | Yamazaki et al. |
| 2011/0024750 A1 | 2/2011 | Yamazaki et al. |
| 2011/0024751 A1 | 2/2011 | Yamazaki et al. |
| 2011/0037068 A1 | 2/2011 | Yamazaki et al. |
| 2011/0193083 A1 | 8/2011 | Kim et al. |
| 2012/0168750 A1 | 7/2012 | Hayashi et al. |
| 2012/0273779 A1 | 11/2012 | Yamazaki et al. |
| 2012/0273780 A1 | 11/2012 | Yamazaki et al. |
| 2012/0280230 A1 | 11/2012 | Akimoto et al. |
| 2013/0286372 A1 | 10/2013 | Adachi |

FOREIGN PATENT DOCUMENTS

| | | |
|---|---|---|
| EP | 2226847 A2 | 9/2010 |
| EP | 2278618 A1 | 1/2011 |
| GB | 2153589 A | 8/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |

(56) References Cited

FOREIGN PATENT DOCUMENTS

| | | |
|---|---|---|
| JP | 63-239117 A | 10/1988 |
| JP | 63-265818 A | 11/1988 |
| JP | 05-251705 A | 9/1993 |
| JP | 08-264794 A | 10/1996 |
| JP | 09-139503 A | 5/1997 |
| JP | 11-505377 A | 5/1999 |
| JP | 2000-044236 A | 2/2000 |
| JP | 2000-150900 A | 5/2000 |
| JP | 2000-357586 A | 12/2000 |
| JP | 2001-085320 A | 3/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-051115 A | 2/2005 |
| JP | 2006-100760 A | 4/2006 |
| JP | 2006-332497 A | 12/2006 |
| JP | 2007-073559 A | 3/2007 |
| JP | 2007-096055 A | 4/2007 |
| JP | 2007-123861 A | 5/2007 |
| JP | 2007-258675 A | 10/2007 |
| JP | 2008-060419 A | 3/2008 |
| JP | 2008-218495 A | 9/2008 |
| JP | 2009-010362 A | 1/2009 |
| JP | 2009-099953 A | 5/2009 |
| JP | 2009-135380 A | 6/2009 |
| JP | 2009-141002 A | 6/2009 |
| JP | 2009-231613 A | 10/2009 |
| JP | 2009-272427 A | 11/2009 |
| JP | 2010-016347 A | 1/2010 |
| JP | 2010-040552 A | 2/2010 |
| JP | 2010-067954 A | 3/2010 |
| JP | 2010-161373 A | 7/2010 |
| JP | 2010-165961 A | 7/2010 |
| JP | 2010-263182 A | 11/2010 |
| JP | 2011-023695 A | 2/2011 |
| KR | 2008-0016238 A | 2/2008 |
| KR | 2008-0060397 A | 7/2008 |
| WO | WO 2004/114391 A1 | 12/2004 |
| WO | WO 2006/025609 A2 | 3/2006 |
| WO | WO-2008/069056 | 6/2008 |
| WO | WO-2008/069255 | 6/2008 |
| WO | 2008/105250 A1 | 9/2008 |
| WO | WO 2008/149873 A1 | 12/2008 |
| WO | 2009/041713 A2 | 4/2009 |
| WO | WO 2009/072532 A1 | 6/2009 |
| WO | WO-2009/136645 | 11/2009 |

OTHER PUBLICATIONS

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display,"AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4a conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Appied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, p. 21-008, with full English translation.

Authorized Officer Mitsuo Kawamoto, International Search Report, PCT Application No. PCT/JP2010/062019, mailed Aug. 24, 2010, 2 pages.

Authorized Officer Mitsuo Kawamoto, Written Opinion, PCT Application No. PCT/JP2010/062019, mailed Aug. 24, 2010, 5 pages.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

(56) References Cited

OTHER PUBLICATIONS

Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTS) for AMLCDS," Journal of the SID, 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N. et al., "SPINEL,YBFE2O4, and YB2FE3O7 Types of Structures for Compounds in the IN2O3 and SC2O3—A2O3—Bo Systems [A; Fe, Ga, or Al; B: Mg, Mn, Fe, Ni, Cu,or Zn] At Temperatures Over 1000° C," Journal of Solid State Chemistry, 1985, vol. 60, pp. 382-384.
Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits, 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.
Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350° C," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.

(56) References Cited

OTHER PUBLICATIONS

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

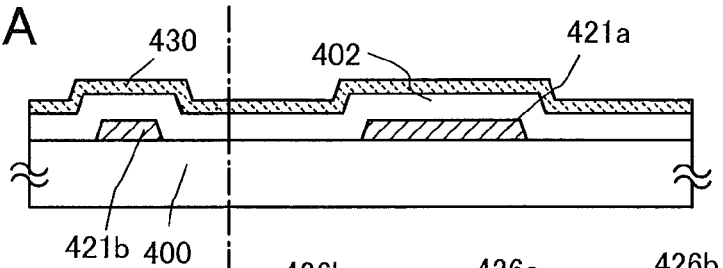
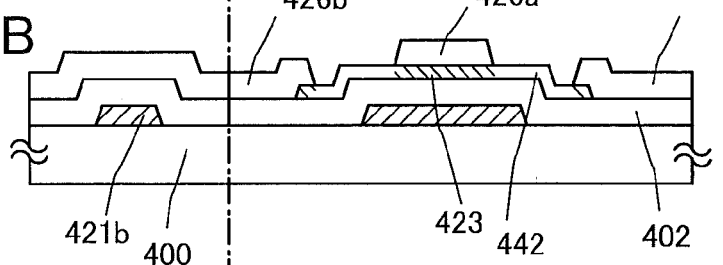
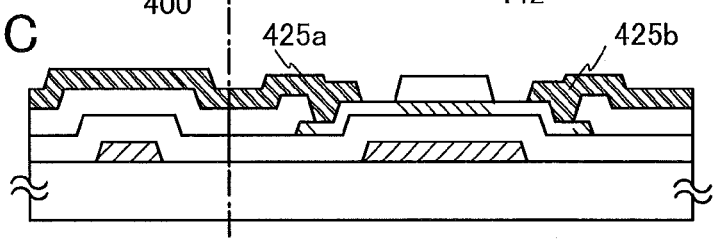
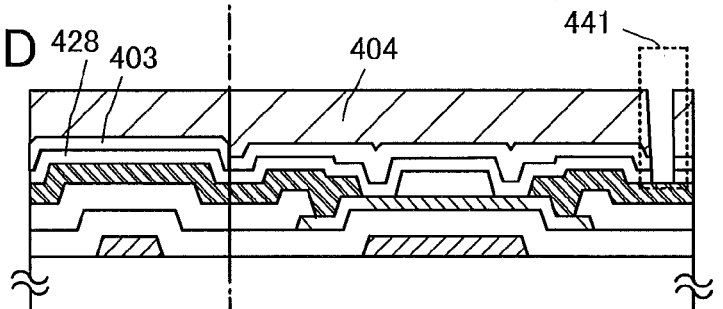
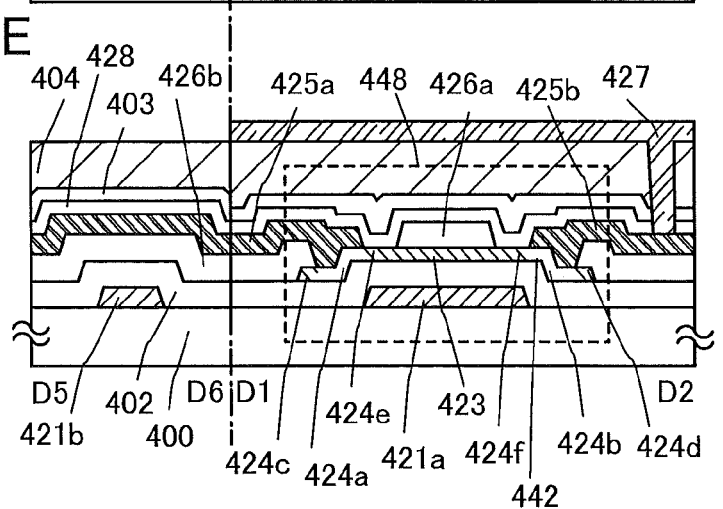

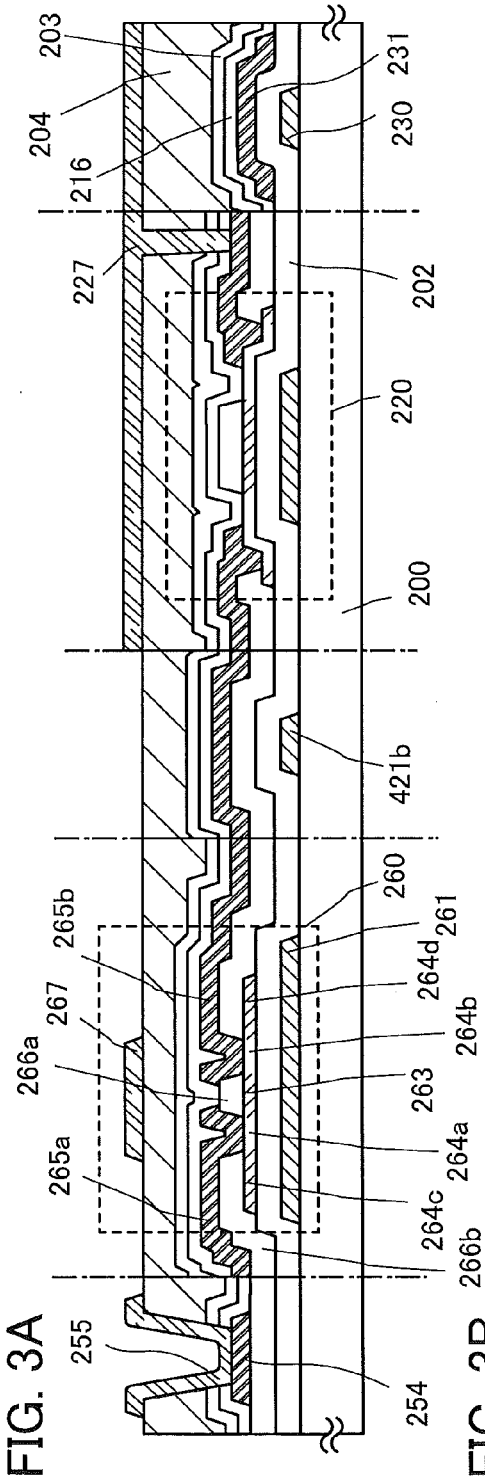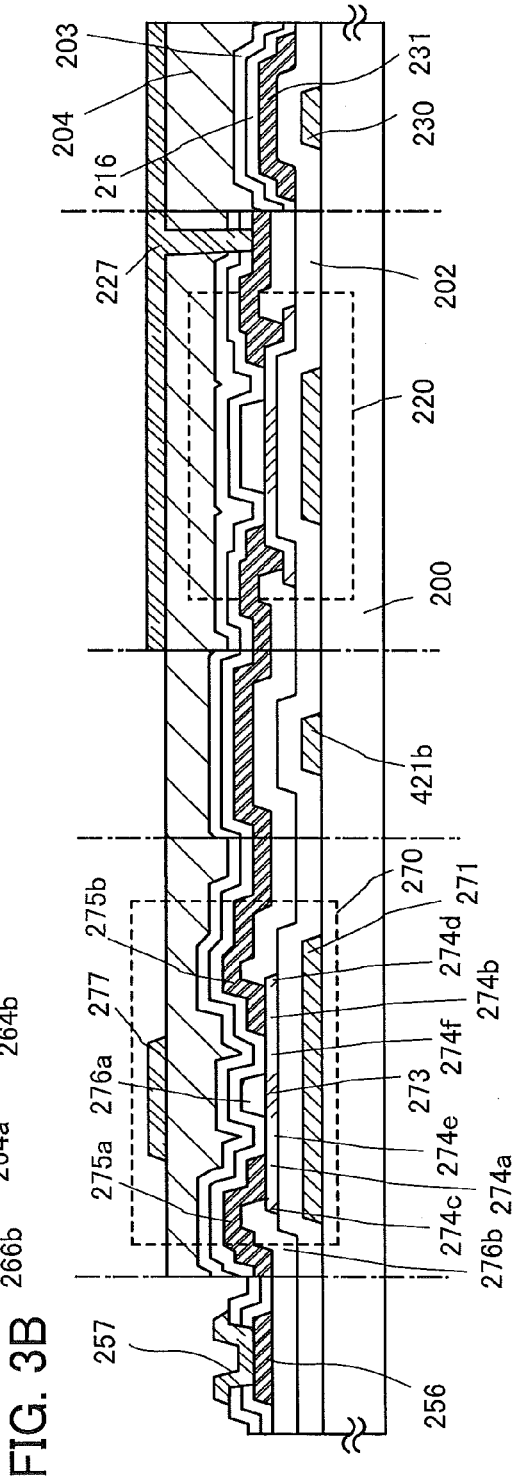

FIG. 4A1
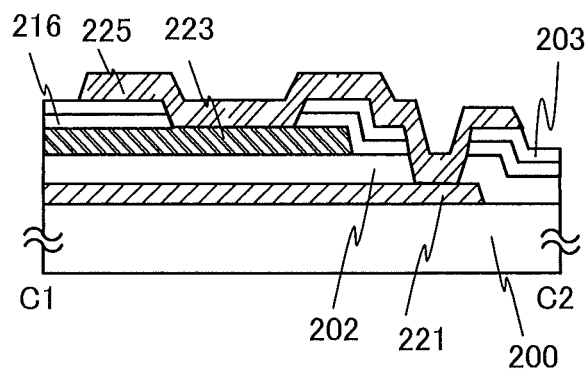
FIG. 4A2
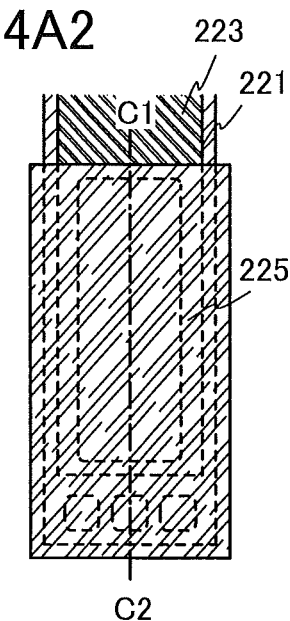
FIG. 4B1
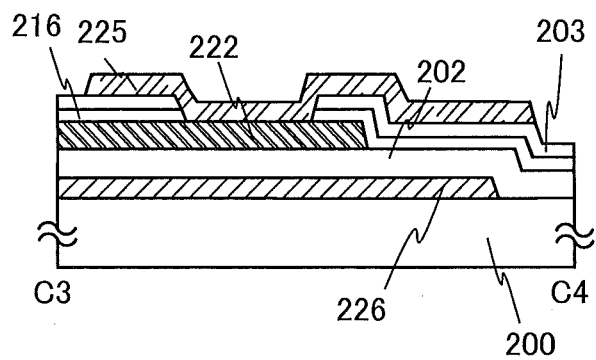
FIG. 4B2
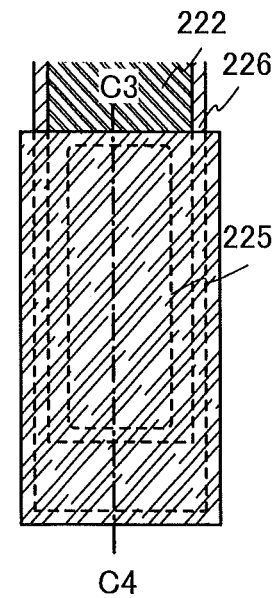

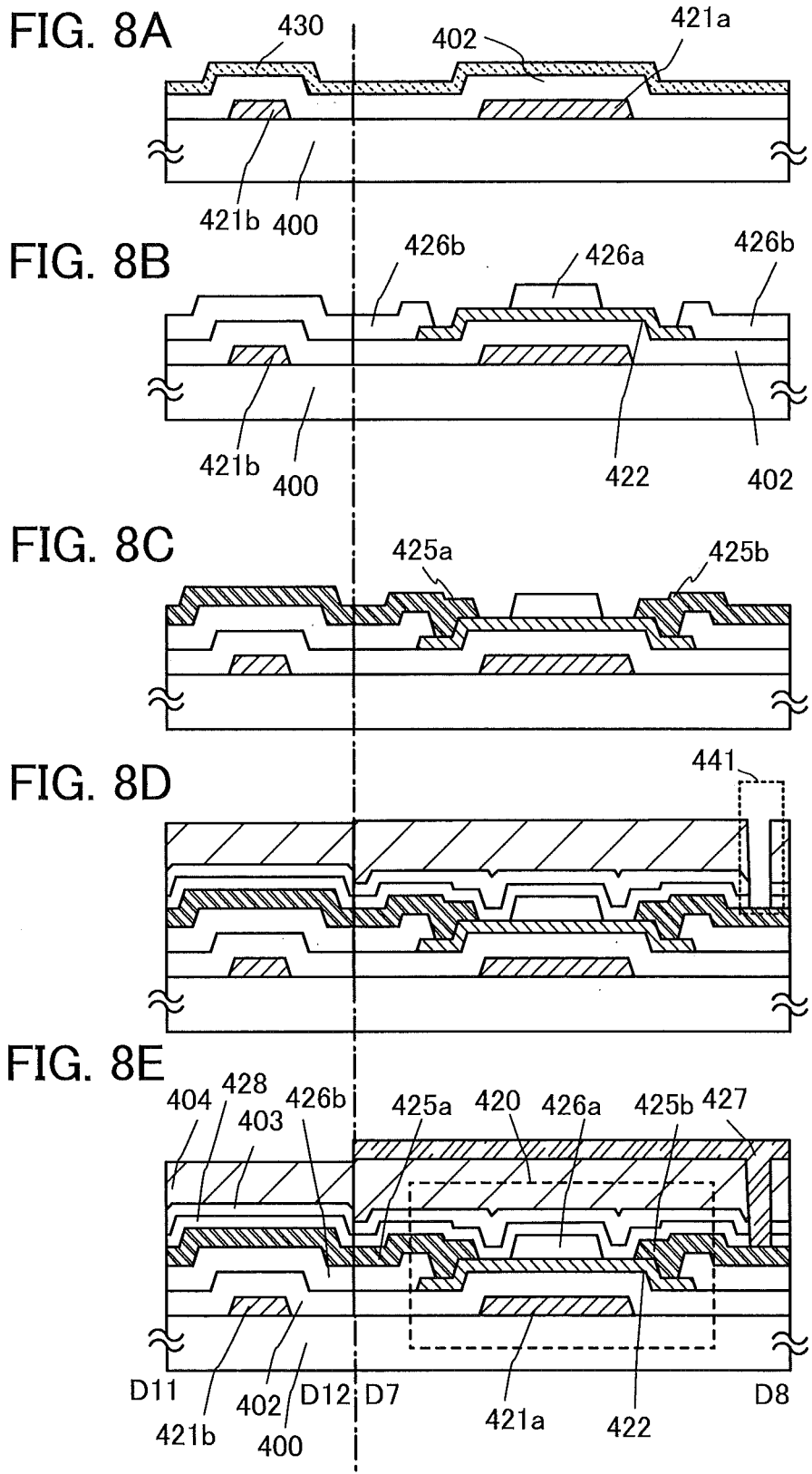

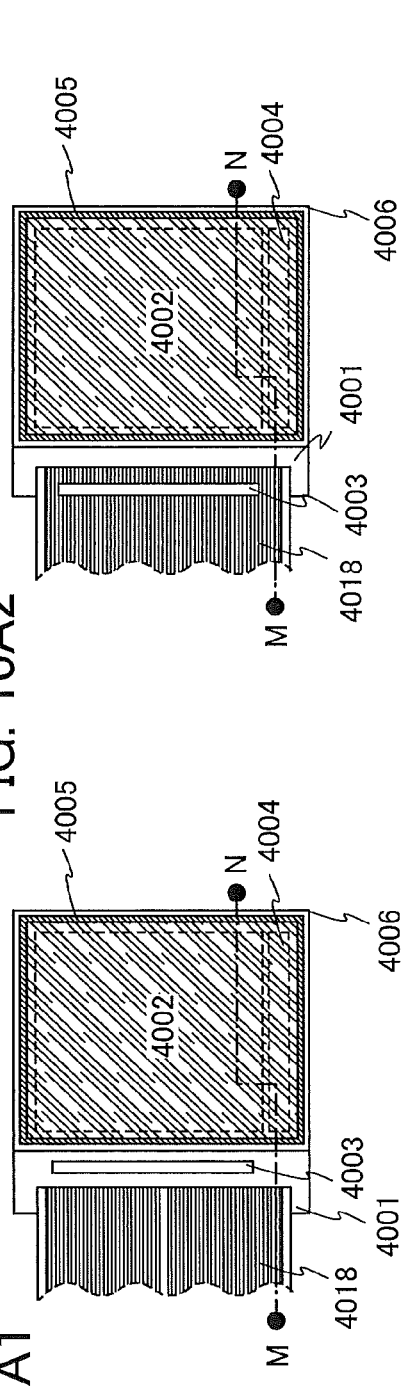
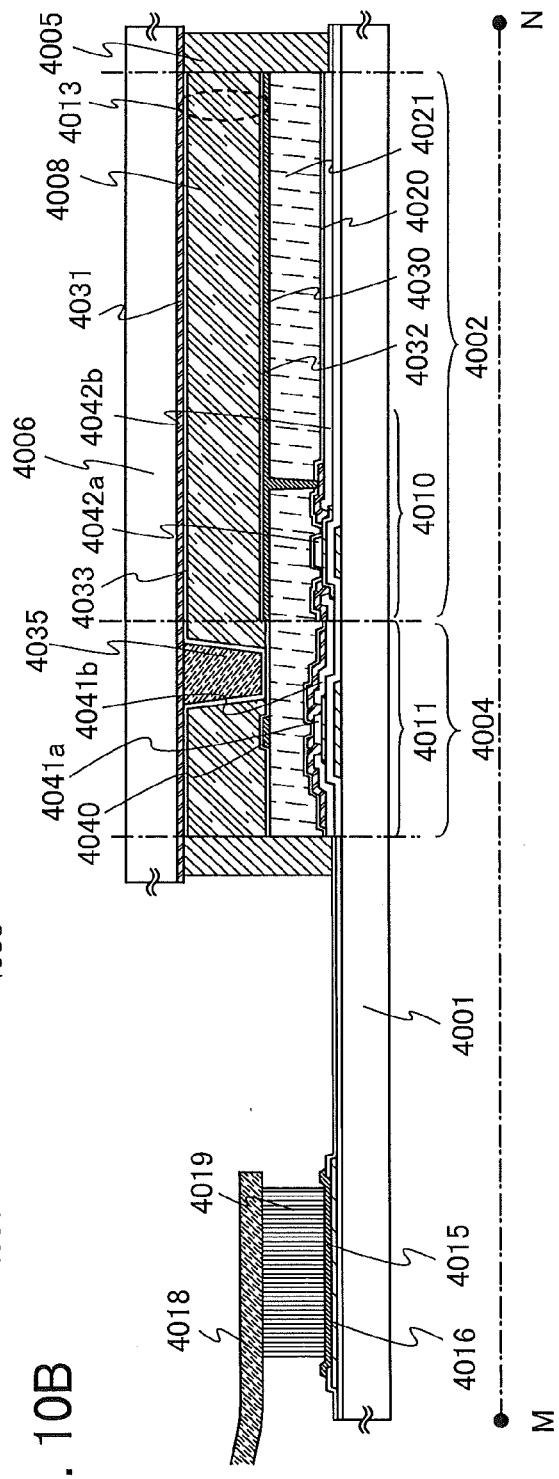

SEMICONDUCTOR DEVICE

CROSS-REFERENCE TO RELATED APPLICATIONS

This application is a continuation of U.S. application Ser. No. 13/717,806, filed Dec. 18, 2012, now pending, which is a divisional of U.S. application Ser. No. 12/846,603, filed Jul. 29, 2010, now U.S. Pat. No. 8,384,079, which claims the benefit of a foreign priority application filed in Japan as Serial No. 2009-180077 on Jul. 31, 2009, all of which are incorporated by reference.

TECHNICAL FIELD

The present invention relates to a semiconductor device using an oxide semiconductor and a manufacturing method thereof.

In this specification, a semiconductor device generally means a device which can function by utilizing semiconductor characteristics, and an electrooptic device, a semiconductor circuit, and electronic equipment are all semiconductor devices.

BACKGROUND ART

In recent years, much attention has been directed to a technique for forming a thin film transistor (TFT) by using a semiconductor thin film (with a thickness of approximately several nanometers to several hundred nanometers) which is formed over a substrate having an insulating surface. Thin film transistors are applied to a wide range of electronic devices such as ICs or electro-optical devices, and there is an expectation for immediate development of thin film transistors to be used, especially, as switching elements for image display devices. Various metal oxides are used for a variety of applications. Indium oxide is a well-known material and is used as a transparent electrode material which is necessary for liquid crystal displays and the like.

Some metal oxides exhibit semiconductor characteristics. Examples of such metal oxides having semiconductor characteristics include tungsten oxide, tin oxide, indium oxide, zinc oxide, and the like. Thin film transistors in which a channel formation region is formed of such metal oxides having semiconductor characteristics are known (Patent Documents 1 and 2).

REFERENCE

Patent Documents

[Patent Document 1] Japanese Published Patent Application No. 2007-123861
[Patent Document 2] Japanese Published Patent Application No. 2007-096055

DISCLOSURE OF INVENTION

In the case where a plurality of thin film transistors is formed over an insulating surface, there is a portion where a gate wiring and a source wiring, for example, intersect each other. At the portion where the gate wiring and the source wiring intersect each other, an insulating layer serving as a dielectric is provided between the gate wiring and the source wiring whose potential is different from that of the gate wiring, whereby a capacitance is formed. This capacitance can be referred to as a parasitic capacitance between wirings, and may cause distortion of a signal waveform. In addition, when the parasitic capacitance is large, delay in transmission of a signal may occur.

Further, an increase in the parasitic capacitance leads to a cross talk phenomenon in which an electric signal leaks between wirings or an increase in power consumption.

Furthermore, in an active matrix display device, particularly when a large parasitic capacitance is formed between a signal wiring supplying a video signal and another wiring or an electrode, display quality may deteriorate.

Further, when a circuit is miniaturized, a distance between wirings is reduced and the parasitic capacitance between the wirings may be increased.

An object of one embodiment of the present invention is to provide a semiconductor device having a structure which enables a sufficient reduction in parasitic capacitance between wirings.

In the case where a plurality of circuits which are different from each other are formed on an insulating surface, formation of a pixel portion and a drive circuit over one substrate, for example, requires excellent switching characteristics such as a high on-off ratio of a thin film transistor used for the pixel portion. As for a thin film transistor used for the drive circuit, a high operation speed is required. A thin film transistor used for the drive circuit preferably operates at a high speed, since writing time of a display image is reduced, particularly as the definition of a display device is increased.

Another object is to provide a semiconductor device in which various circuits are formed over one substrate and various thin film transistors corresponding to the required characteristics of the various circuits are provided while complication of a process and an increase in manufacturing costs are prevented.

In a bottom-gate thin film transistor, an oxide insulating layer serving as a channel protective layer is formed in contact with part of the oxide semiconductor layer overlapping with a gate electrode layer. In the same step as formation of the oxide insulating layer, an oxide insulating layer covering a peripheral portion (including a side surface) of the oxide semiconductor layer is formed.

The oxide insulating layer covering the periphery portion (including the side surface) of the oxide semiconductor layer increases a distance between the gate electrode layer and wiring layers (such as a source wiring layer and a capacitor wiring layer) formed over or at the periphery of the gate electrode layer, whereby parasitic capacitance can be reduced. The oxide insulating layer covering the periphery portion of the oxide semiconductor layer is formed in the same formation step as the channel protective layer. Therefore, parasitic capacitance can be reduced without an increase in the number of fabrication steps.

The oxide insulating layer covering the periphery portion (including the side surface) of the oxide semiconductor layer enables a reduction in parasitic capacitance and suppression of distortion of a signal waveform.

In order to reduce parasitic capacitance, an insulating material having a low dielectric constant is preferably used for the oxide insulating layer between the wirings.

One embodiment of the present invention disclosed in this specification is a semiconductor device including: a gate electrode layer over an insulating surface; a gate insulating layer over the gate electrode layer; an oxide semiconductor layer over the gate insulating layer; an oxide insulating layer over the oxide semiconductor layer; a source electrode layer and a drain electrode layer over the oxide semiconductor layer; and an insulating layer over the source electrode layer and the drain electrode layer. The oxide semiconductor layer includes a first region in contact with the oxide insulating layer, a second region in contact with the source electrode layer or the drain electrode layer, and a third region in contact with the insulating layer. In the first region, a channel formation region overlaps with the gate electrode layer with the gate insulating layer interposed therebetween. The third region is between the channel formation region and the second region.

With the above structure, at least one of the above problems can be solved.

The drain electrode layer formed of a metal electrode of Ti or the like is in contact with part of an upper surface of the oxide semiconductor layer, and a high-resistance drain region (also referred to as a HRD region) which overlaps with the drain electrode layer and is an oxygen-deficient region is formed. Further, the source electrode layer is in contact with part of the upper surface of the oxide semiconductor layer, and a high-resistance source region (also referred to as a HRS region) which is an oxygen-deficient region, and overlaps with the source electrode layer, is formed.

The source electrode layer and the drain electrode layer do not overlap with the channel formation region in the oxide semiconductor layer. Also, the source electrode layer and the drain electrode layer overlap with the gate electrode layer with the gate insulating layer interposed therebetween in an extremely small area or do not overlap with the gate insulating layer. Accordingly, a reduction in parasitic capacitance is achieved. Furthermore, the width of the oxide insulating layer functioning as a channel protection layer is smaller than the distance between a side surface of the source electrode layer and a side surface of the drain electrode layer which faces the side surface of the source electrode layer. When the oxide insulating layer functioning as the channel protection layer is designed so as to have a small width (length in a channel length direction) for higher speed operation of the thin film transistor, the distance between the side surface of the source electrode layer and the side surface of the drain electrode layer which faces the side surface of the source electrode layer is also reduced, which may lead to short-circuit the source electrode layer and the drain electrode layer. Therefore, increasing the distance between the side surfaces is effective.

Further, in the above structure, the oxide insulating layer functioning as the channel protection layer is formed by a sputtering method using an inorganic insulating film, typically a silicon oxide film, a silicon nitride oxide film, an aluminum oxide film, an aluminum oxynitride film, or the like.

In the above structure, the oxide semiconductor layer has a region in which the upper surface of the oxide semiconductor layer does not overlap with the oxide insulating layer, nor with the drain electrode layer or the source electrode layer, i.e., a third region. The width of this third region in the channel length direction depends on a position where the oxide semiconductor layer is patterned and a position where the drain electrode layer and the source electrode layer are patterned. When the width of this third region in the channel length direction is large, an off-current of the thin film transistor can be reduced. In contrast, when the width of this third region in the channel length direction is small, the operation of the thin film transistor can be speeded up.

The insulating layer in contact with the third region is also formed by a sputtering method using an inorganic insulating film, typically a silicon oxide film, a silicon nitride oxide film, an aluminum oxide film, an aluminum oxynitride film, or the like. Note that when the insulating layer in contact with the third region is formed using the same material as the oxide insulating layer functioning as the channel protection layer, the oxide insulating layer functioning as the channel protection layer can be called a first oxide insulating layer and the insulating layer in contact with the third region can be called a second oxide insulating layer, rendering the boundary between the first and second insulating semiconductors unclear.

As the oxide semiconductor layer, a thin film of $InMO_3(ZnO)_m$ (m>0), for example, is fainted. The thin film is used as an oxide semiconductor layer to fabricate a thin film transistor. Note that M denotes one metal element or a plurality of metal elements selected from Ga, Fe, Ni, Mn, and Co. For example, M may be Ga, or M may contain the above metal element in addition to Ga: M may be Ga and Ni, Ga and Fe, or the like. Further, in addition to the metal element contained as M, the oxide semiconductor may contain a transition metal element, such as Fe or Ni, or oxide of the transition metal element as an impurity element. In this specification, among the oxide semiconductor layers whose composition formulas are represented by $InMO_3(ZnO)_m$ (m>0), an oxide semiconductor whose composition formula includes at least Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

As the metal oxide applied to the oxide semiconductor layer, any of the following metal oxide can be applied besides the above: In—Sn—Zn—O-based metal oxide; In—Al—Zn—O-based metal oxide; Sn—Ga—Zn—O-based metal oxide; Al—Ga—Zn—O-based metal oxide; Sn—Al—Zn—O-based metal oxide; In—Zn—O-based metal oxide; Sn—Zn—O-based metal oxide; Al—Zn—O-based metal oxide; In—O-based metal oxide; Sn—O-based metal oxide; and Zn—O-based metal oxide. Alternatively, silicon oxide may be included in the oxide semiconductor layer formed using the above metal oxide.

The source and drain electrode layers in the above structures are formed using any of an element selected from Ti, Mo, W, Al, Cr, Cu, and Ta, an alloy including any of the elements as a component, an alloy including a combination of any of the elements, and the like. Each of the source electrode layer and the drain electrode layer is not limited to a single layer containing the above-described element and may be a stack of two or more layers.

An embodiment for realizing the above structure is a method of forming a semiconductor device, including the steps of: forming a gate electrode layer over a substrate having an insulating surface; forming a gate insulating layer over the gate electrode layer; forming an oxide semiconductor layer over the gate insulating layer; dehydrating or dehydrogenating the oxide semiconductor layer, wherein the oxide semiconductor layer is then prevented from being exposed to air and from further water or hydrogen contamination; forming an oxide insulating layer being in contact with part of the oxide semiconductor layer and covering a peripheral portion and a side surface of the oxide semiconductor layer; forming a source electrode layer and a drain electrode layer over the oxide insulating layer; and forming an insulating layer in contact with the oxide insulating layer, the source electrode layer, the drain electrode layer, and the oxide semiconductor layer.

Dehydration or dehydrogenation is performed by heat treatment in an atmosphere of an inert gas such as nitrogen or a rare gas (such as argon or helium) at a temperature greater than or equal to 400° C. and less than the strain point of the substrate, preferably greater than or equal to 420° C. and less than or equal to 570° C., so that the level of impurities such as moisture included in the oxide semiconductor layer is reduced.

It can be said that, by heat treatment in an atmosphere of an inert gas such as nitrogen or a rare gas (e.g., argon or helium), the oxide semiconductor layer is changed into an oxygen-deficient oxide semiconductor layer to have lower resistance, i.e., becomes an n-type (n⁻-type) oxide semiconductor layer and that then, by formation of an oxide insulating film in contact with the oxide semiconductor layer and heat treatment after the formation, the oxide semiconductor layer is placed in an oxygen-excess state to have higher resistance, i.e., becomes an i-type oxide semiconductor layer. In addition, it can also be said that solid phase oxidation by which the oxide semiconductor layer is placed in an oxygen-excess state is performed. Thus, it is possible to manufacture and provide a semiconductor device including a highly reliable thin film transistor having favorable electric characteristics.

Conditions of the heat treatment are such that when the oxide semiconductor layer is measured at up to 450° C. by TDS (Thermal Desorption Spectroscopy) after the dehydration or dehydrogenation, two peaks of water, or at least one peak at around 300° C. is not detected. Therefore, a thin film transistor including oxide semiconductor layer that has been subjected to the dehydration or dehydrogenation is measured at up to 450° C. by TDS, at least the peak of water at around 300° C. is not detected.

In addition, when the temperature is lowered from a heat temperature T at which the dehydration or dehydrogenation is performed, it is important to prevent entry of water or hydrogen by using the same furnace that has been used for the dehydration or dehydrogenation, in such a manner that the oxide semiconductor layer is not exposed to air. When a thin film transistor is formed using the oxide semiconductor layer obtained in such a manner that it has lower resistance, i.e., becomes an n-type (n⁻-type) oxide semiconductor layer by the dehydration or dehydrogenation and then has higher resistance to become an i-type semiconductor layer, the threshold voltage of the thin film transistor can be positive, so that a so-called normally-off switching element can be realized. It is desirable for a semiconductor device (a display device) that a channel be formed with a threshold voltage having a positive value and as close to 0 V as possible. If the threshold voltage of the thin film transistor is negative, it tends to be normally on; in other words, current flows between the source electrode and the drain electrode even when the gate voltage is 0 V. In an active-matrix display device, electric characteristics of thin film transistors included in a circuit are important and performance of the display device is dependent on the electric characteristics of thin film transistors. Among the electric characteristics of thin film transistors, a threshold voltage (Vth) is particularly important. When the threshold voltage value is high or is on the minus side even with high field effect mobility, the circuit is difficult to control. A thin film transistor in which the value of the threshold voltage is high and the absolute value of the threshold voltage is large might not be able to achieve a switching function and might be a load when the transistor is driven at low voltage. In the case of an n-channel thin film transistor, it is preferable that a channel is formed and drain current begins to flow after the positive voltage is applied as a gate voltage. A transistor in which a channel is not formed unless the driving voltage is increased and a transistor in which a channel is formed and drain current flows even in the case of the negative voltage state are unsuitable for a circuit.

In addition, a gas atmosphere in which the temperature is lowered from the heating temperature T may be switched to a gas atmosphere different from the gas atmosphere in which the temperature is raised to the heating temperature T. For example, cooling is performed by using the same furnace that is used for the dehydration or dehydrogenation and by filling the furnace with a high-purity oxygen gas, a high-purity $N_2O$ gas, or ultra-dry air (having a dew point of −40° C. or less, preferably −60° C. or less) without exposure to air.

With use of oxide semiconductor film obtained in such a manner that moisture contained in the film is reduced by the heat treatment for the dehydration and dehydrogenation and slow cooling (or cooling) is performed in an atmosphere containing no moisture (the dew point temperature of which is less than or equal to −40° C. or preferably, less than or equal to −60° C.), electric characteristics of a thin film transistor are improved and a thin film transistor having mass productivity and high performance is realized.

In this specification, heat treatment in an inert gas atmosphere of nitrogen or a rare gas (such as argon or helium) is referred to as heat treatment for dehydration or dehydrogenation. In this specification, dehydrogenation does not refer only to elimination of $H_2$ by this heat treatment, and the dehydration or dehydrogenation refers to elimination of H, OH, and the like as well, for the sake of convenience.

By the heat treatment in the atmosphere of an inert gas such as nitrogen or a rare gas (argon, helium, or the like), the oxide semiconductor layer is changed into an oxygen-deficient oxide semiconductor layer to have lower resistance, i.e., becomes an n-type (e.g., n⁻-type) oxide semiconductor layer.

A region which overlaps with the drain electrode layer and is the oxygen-deficient high-resistance drain (also referred to as HRD) region is formed. Further, a region which overlaps with the source electrode layer and is the oxygen-deficient high-resistance source (also referred to as HRS) region is formed.

Specifically, the carrier concentration of the high-resistance drain region is greater than or equal to $1\times10^{18}/cm^3$ and is at least higher than the carrier concentration of the channel formation region (less than $1\times10^{18}/cm^3$). Note that the carrier concentration in this specification is obtained by Hall effect measurement at room temperature.

The channel formation region is formed by placing at least part of the dehydrated or dehydrogenated oxide semiconductor layer in an oxygen-excess state to have higher resistance, i.e., to become an i-type region. Note that as the treatment for making the dehydrated or dehydrogenated oxide semiconductor layer in an oxygen-excess state, deposition of an oxide insulating film which is in contact with the dehydrated or dehydrogenated oxide semiconductor layer by a sputtering method, heat treatment after the deposition of the oxide insulating film, heat treatment after the deposition of the oxide insulating film in an atmosphere containing oxygen, cooling treatment in an oxygen atmosphere after heat treatment in an inert gas atmosphere after the deposition of the oxide insulating film, cooling treatment in ultra-dry air (having a dew point of −40° C. or less, preferably −60° C. or less) after heat treatment in an inert gas atmosphere after the deposition of the oxide insulating film, or the like is performed.

Further, in order to make part of the dehydrated or dehydrogenated oxide semiconductor layer (a portion overlapping with a gate electrode layer) serve as the channel formation region, the semiconductor layer can be selectively placed in an oxygen-excess state and have higher resistance, i.e., becomes an i-type semiconductor layer.

Accordingly, it is possible to manufacture and provide a semiconductor device including a highly reliable thin film transistor having favorable electric characteristics.

Note that by forming the high-resistance drain region in the oxide semiconductor layer overlapping with the drain electrode layer, the reliability can be improved when a drive circuit is formed. Specifically, by forming the high-resistance drain region, the drain electrode layer, the high-resistance drain region, and the channel formation region can vary in conductivity. Therefore, in the case where the thin film transistor operates with the drain electrode layer connected to a wiring for supplying a high power supply potential VDD, the high-resistance region serves as a buffer and a high electric field is not applied locally even if the high electric field is applied between the gate electrode layer and the drain electrode layer, which leads to an increase in the withstand voltage of the transistor.

In addition, by the formation of the high-resistance drain region in part of the oxide semiconductor layer which overlaps with the drain electrode layer (and with the source electrode layer), reliability can be improved when a drive circuit is formed. In particular, by forming the high-resistance drain region, leakage current between the drain electrode layer and the source electrode layer of the transistor flows through the drain electrode layer, the high-resistance drain region on the drain electrode layer side, the channel formation region, the high-resistance source region on the source electrode layer side, and the source electrode layer in this order. In this case, in the channel formation region, leakage current flowing from the high-resistance drain region on the drain electrode layer side to the channel formation region can be concentrated in the vicinity of an interface between the channel formation region and the gate insulating layer which has high resistance when the transistor is off. Thus, the amount of leakage current in a back channel portion (part of a surface of the channel formation which is apart from the gate electrode layer) can be reduced.

Moreover, as a display device including a drive circuit, a light-emitting display device in which a light-emitting element is used and a display device in which an electrophoretic display element is used, which is also referred to as an "electronic paper", are given in addition to a liquid crystal display device.

In the light-emitting display device using a light-emitting element, a plurality of thin film transistors are included in a pixel portion, and the pixel portion includes a region where a gate electrode of a thin film transistor is connected to a source wiring or a drain wiring of another thin film transistor. In addition, a drive circuit of the light-emitting display device using a light-emitting element includes a region where a gate electrode of a thin film transistor is connected to a source wiring or a drain wiring of the thin film transistor.

Since a thin film transistor is easily broken due to static electricity or the like, a protective circuit for protecting the thin film transistor for the pixel portion is preferably provided over the same substrate as a gate line or a source line. The protective circuit is preferably formed with a non-linear element including an oxide semiconductor layer.

Note that the ordinal numbers such as "first" and "second" in this specification are used for convenience and do not indicate the order of steps and the stacking order of layers. In addition, the ordinal numbers in this specification do not denote particular names which specify the present invention.

It is possible to manufacture a thin film transistor with reduced parasitic capacitance in which the peripheral portion of the oxide semiconductor layer is covered with the oxide insulating layer. Furthermore, by increasing the distance between the source electrode layer and the drain electrode layer, a thin film transistor in which an off-current is reduced can be realized.

BRIEF DESCRIPTION OF DRAWINGS

FIGS. 2A to 2E are process cross-sectional views of one embodiment of the present invention.

FIGS. 3A and 3B are cross-sectional views of one embodiment of the present invention.

FIGS. 4A1 to 4B2 are cross-sectional views and top views of one embodiment of the present invention.

FIGS. 8A to 8E are process cross-sectional views of a fabrication process of an embodiment of the present invention.

FIGS. 10A-1 to 10B each illustrate a semiconductor device.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, one embodiment of a semiconductor device and a manufacturing method of the semiconductor device will be described with reference to FIGS. 1A to 1C and FIGS. 2A to 2E.

Figure 1A:
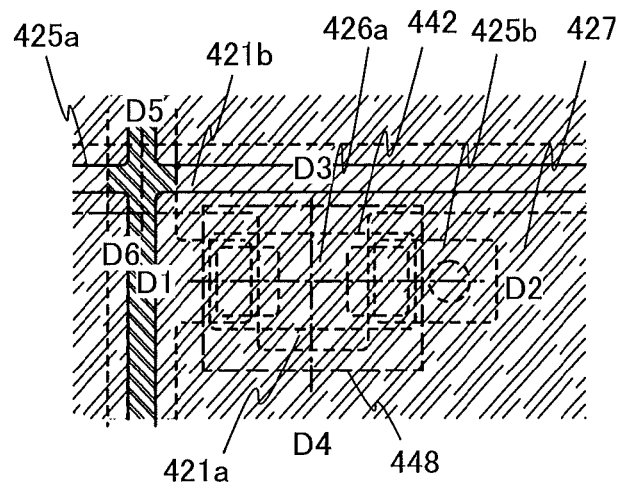
FIGS. 1A to 1C are a top view and cross-sectional views of one embodiment of the present invention.
Figure 1B:
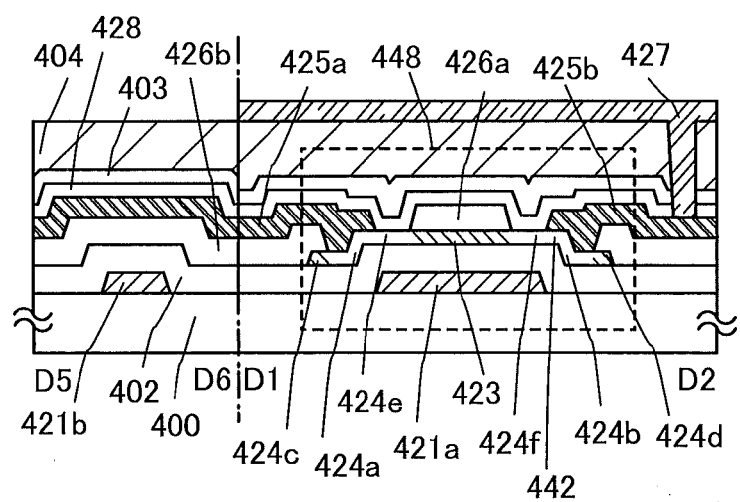
Figure 1C:
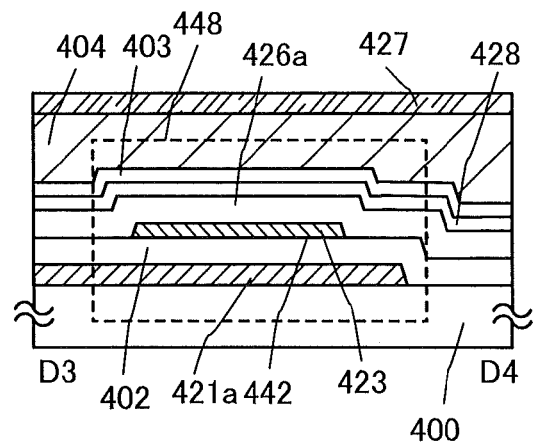

FIG. 1A is a top view of a channel-protection type thin film transistor 448 provided in a pixel, and FIG. 1B is a cross-sectional view taken along line D1-D2 and D5-D6 of FIG. 1A. FIG. 1C is a cross-sectional view taken along line D3-D4. Note that FIG. 2E is the same as FIG. 1B.

The thin film transistor 448 provided in the pixel is a channel-protection (also called channel-stop) type thin film transistor, which includes, over a substrate 400 having an insulating surface, a gate electrode layer 421a, a gate insulating layer 402, an oxide semiconductor layer 442 including a channel formation region 423, an oxide insulating layer 426a functioning as a channel protective layer, a source electrode layer 425a, and a drain electrode layer 425b. In addition, an insulating layer 428 is provided to cover the thin film transistor 448 and be in contact with the oxide insulating layer 426a, the source electrode layer 425a, and the drain electrode layer 425b. A protective insulating layer 403 and a planarizing insulating layer 404 are stacked over the insulating layer 428. Over the planarizing insulating layer 404, a pixel electrode layer 427 is provided, which is in contact with the drain electrode layer 425b and thus is electrically connected to the thin film transistor 448.

The thin film transistor 448 for a pixel has the oxide semiconductor layer 442 which includes: a high-resistance source region 424a which overlaps with the source electrode layer; a high-resistance drain region 424b which overlaps with the drain electrode layer; a high-resistance source region 424e which does not overlap with the source electrode layer; a high-resistance drain region 424f which does not overlap with the drain electrode layer; and the channel formation region 423. Note that the high-resistance source region 424a is formed in contact with a lower surface of the source electrode layer 425a. The high-resistance drain region 424b is formed in contact with the lower surface of the drain electrode layer 425b. Even when a high electric field is applied, the two high-resistance drain regions or the two high-resistance source regions function as buffers, so that the thin film transistor 448 is prevented from being supplied with a high electric field locally and has an improved withstand voltage.

In FIG. 1B, the channel formation region refers to a region in the oxide semiconductor layer which is sandwiched, together with the gate insulating layer, between the oxide insulating layer 426a and the gate electrode layer. Therefore, the channel length L of the thin film transistor 448 is equal to the width of the oxide insulating layer 426a in the channel length direction. Note that the channel length L of the thin film transistor 448 means the length of the oxide semiconductor layer at the interface with the oxide insulating layer 426a, i.e., the base of a trapezoid which represents the oxide insulating layer 426a in the cross-sectional view of FIG. 1B.

In a wiring intersection portion where a gate wiring and a source wiring intersect each other, the gate insulating layer 402 and an oxide insulating layer 426b are provided between the gate electrode layer 421b and the source electrode layer 425a so that parasitic capacitance can be reduced. Note that although the oxide insulating layer 426a which overlaps with the channel formation region 423 and the oxide insulating layer 426b which does not overlap with the channel formation region 423 are denoted by different reference letters, they are layers formed by using the same material and formation step.

A process for forming the thin film transistor 448 and the wiring intersection portion over one substrate is described below with reference to FIGS. 2A to 2E. Not only the pixel portion but also a drive circuit may be formed, and they can be formed over the same substrate by the same process.

First, after a conductive film is formed over the substrate 400 having an insulating surface, the gate electrode layers 421a and 421b are formed by a first photolithography step. Further, in the pixel portion, a capacitor wiring layer is formed by using the same material and the same first photolithography step as the gate electrode layers 421a and 421b. When the drive circuit is formed in addition to the pixel portion and needs to have a capacitor, another capacitor wiring layer is formed in the drive circuit. Note that a resist mask may be formed by an inkjet method. When the resist mask is formed by an inkjet method, manufacturing costs can be reduced because a photomask is not used.

As the material of the gate electrode layers 421a and 421b, an element selected from Al, Cr, Ta, Ti, Mo, or W, an alloy including the above element, an alloy including any of these elements in combination, and the like, can be used. As the conductive film for forming the gate electrode layers 421a and 421b, a light-transmitting conductive film may be used. Indium oxide ($In_2O_3$), an indium oxide-tin oxide alloy ($In_2O_3$—$SnO_2$, abbreviated to ITO), or the like can be used.

In this specification, a film transmitting visible light means a film having a thickness such as to have a transmittance of visible light of 75% to 100%. In the case where the film has conductivity, the film is referred to as a transparent conductive film. Further, a conductive film which is semi-transmissive with respect to visible light may be used for a metal oxide applied to the gate electrode layer, the source electrode layer, the drain electrode layer, the pixel electrode layer, another electrode layer, and the wiring layer. The conductive film which is semi-transmissive with respect to visible light indicates a film having a transmittance of visible light of 50% to 75%.

In the case where a glass substrate is used and the temperature at which the heat treatment to be performed later is high, a glass substrate whose strain point is 730° C. or more is preferably used. As a glass substrate, a glass material such as aluminosilicate glass, aluminoborosilicate glass, or barium borosilicate glass is used, for example. Note that by containing a larger amount of barium oxide (BaO) than that of boric oxide, a glass substrate is heat-resistant and of more practical use. Thus, a glass substrate containing BaO and $B_2O_3$ in which the amount of BaO is larger than that of $B_2O_3$ is preferably used.

Note that, instead of the glass substrate described above, a substrate formed of an insulator such as a ceramic substrate, a quartz substrate, or a sapphire substrate may be used as the glass substrate 400. Alternatively, crystallized glass or the like can be used.

An insulating film serving as a base film may be provided between the substrate 400 and the gate electrode layers 421a and 421b. The base film has the function of preventing diffusion of an impurity element from the substrate 400, and can have a single-layer or stacked-layer structure using one or more of a silicon nitride film, a silicon oxide film, a silicon nitride oxide film, and a silicon oxynitride film.

Next, the gate insulating layer 402 is formed over the gate electrode layers 421a and 421b.

The gate insulating layer 402 can be a single layer of a silicon oxide layer, a silicon nitride layer, a silicon oxynitride layer, or a silicon nitride oxide layer, or a stacked layer thereof by a plasma CVD method, a sputtering method, or the like. For instance, a silicon oxynitride layer may be formed by a plasma CVD method using $SiH_4$, oxygen, and nitrogen as a film formation gas. The gate insulating layer 402 has a thickness from 100 nm to 500 nm inclusive. In the case of a stacked structure, a first gate insulating layer having a thickness from 50 nm to 200 nm inclusive and a second gate insulating layer having a thickness from 5 nm to 300 nm inclusive are stacked in this order.

In this embodiment, the gate insulating layer 402 is a silicon nitride layer having a thickness of 200 nm or less and formed by a plasma CVD method.

Next, over the gate insulating layer 402, an oxide semiconductor film 430 is formed to a thickness greater than or equal to 5 nm and less than or equal to 200 nm, preferably greater than or equal to 10 nm and less than or equal to 20 nm (see FIG. 2A). The oxide semiconductor film 430 preferably has a thickness as small as 50 nm or less so as to be amorphous even when the heat treatment for dehydration or dehydrogenation follows the formation of the oxide semiconductor film 430. By reducing the thickness of the oxide semiconductor film, crystallization thereof can be suppressed when the heat treatment follows the formation of the oxide semiconductor layer.

As the oxide semiconductor film 430, an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film is used. In this embodiment, the oxide semiconductor film 430 is formed using an In—Ga—Zn—O-based oxide semiconductor target by a sputtering method. Alternatively, the oxide semiconductor film 430 can be formed by a sputtering method in a rare gas (typically argon) atmosphere, an oxygen atmosphere, or an atmosphere of a rare gas (typically argon) and oxygen. When a sputtering method is employed, it is preferable that deposition be performed using a target containing a 2 to 10 wt % $SiO_2$ and that $SiOx$ ($x>0$) which inhibits crystallization be contained in the oxide semiconductor film 430 so as to prevent crystallization at the time of the heat treatment for dehydration or dehydrogenation in a later step.

The oxide semiconductor layer is preferably an oxide semiconductor containing In, more preferably an oxide semiconductor containing In and Ga. In order to obtain an i-type (intrinsic) oxide semiconductor, subjecting the oxide semiconductor to dehydration or dehydrogenation is effective.

In this embodiment, an In—Ga—Zn—O-based oxide semiconductor film is used.

Here, the oxide semiconductor film is formed using an oxide semiconductor target containing In, Ga, and Zn ($In_2O_3$:$Ga_2O_3$:$ZnO$=1:1:1 [molar ratio]) under conditions where the distance between the substrate and the target is 100 mm, the pressure is 0.2 Pa, and the direct current (DC) power supply is 0.5 kW in an atmosphere containing argon and oxygen (argon:oxygen=30 sccm:20 sccm, the proportion of the oxygen flow is 40%). Note that use of a pulse direct current (DC) power supply is preferable because dust can be reduced and the film thickness can be uniform in this case. The In—Ga—Zn—O-based non-single-crystal film is formed to a thickness of 5 nm to 200 nm. In this embodiment, as the oxide semiconductor film, an In—Ga—Zn—O-based non-single-crystal film having a thickness of 20 nm is formed using the In—Ga—Zn—O-based oxide semiconductor target by a sputtering method.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used to form an insulating film, while a DC sputtering method is mainly used to form a metal film.

In addition, there is also a multi-source sputtering apparatus in which a plurality of targets of different materials can be set. With the multi-source sputtering apparatus, films of different materials can be formed and stacked in the same chamber, or a film can be formed of plural kinds of materials by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by a sputtering method, there are also a reactive sputtering method in which a target substance and a sputtering gas component are chemically reacted with each other during deposition to form a thin compound film thereof, and a bias sputtering in which a voltage is also applied to a substrate during deposition.

Then, the oxide semiconductor film 430 is processed into island-shaped oxide semiconductor layers by a second photolithography step. The resist mask for forming the island-shaped semiconductor layers may be formed by an inkjet method. Formation of the resist mask by an inkjet method does not require a photomask, which results in a reduction in manufacturing costs.

Next, the oxide semiconductor layer is subjected to dehydration or dehydrogenation. First heat treatment for dehydration or dehydrogenation is performed at a temperature greater than or equal to 400° C. and less than the strain point of the substrate, preferably 425° C. or more. Note that in the case where the temperature is 425° C. or more, the heat treatment time may be one hour or less, whereas in the case where the temperature is less than 425° C., the heat treatment time is longer than one hour. Here, the substrate is introduced into an electric furnace which is one of heat treatment apparatuses, and the heat treatment of the oxide semiconductor layer is performed in a nitrogen atmosphere. After that, the oxide semiconductor layer is not exposed to air, which prevents the oxide semiconductor layer from further water or hydrogen contamination; thus, an oxide semiconductor layer is obtained. In this embodiment, one furnace employed in the heat treatment is continuously used up to the time when the temperature is lowered from the heat temperature T at which dehydration or dehydrogenation of the oxide semiconductor layer is performed to a temperature low enough to prevent reincorporation of water. Specifically, slow cooling is performed in a nitrogen atmosphere up to the time when the temperature becomes less than the heat temperature T by 100° C. or more. Without being limited to a nitrogen atmosphere, the dehydration or dehydrogenation is performed in a rare gas atmosphere, such as helium, neon, or argon.

Note that in the first heat treatment, it is preferable that moisture, hydrogen, and the like be not contained in nitrogen or a rare gas such as helium, neon, or argon. In addition, nitrogen or a rare gas such as helium, neon, or argon which is introduced into the heat treatment apparatus preferably has a purity of 6N (99.9999%) or more, more preferably 7N (99.99999%) or more (i.e., the concentration of impurities is 1 ppm or less, preferably 0.1 ppm or less).

Further, the oxide semiconductor film can be crystallized to be a micro crystal film or a polycrystalline film depending on a condition of the first heat treatment or a material of oxide semiconductor layer.

Alternatively, the first heat treatment for the oxide semiconductor layer can be performed with respect to the oxide semiconductor film 430 before it is processed into the island-shaped oxide semiconductor layers. In that case, after the first heat treatment, the substrate is taken out of the heating apparatus and a photolithography step is performed.

Furthermore, heat treatment (heating temperature is 400° C. or more and less than the distortion point of the substrate) may be performed in an inert gas atmosphere (e.g., nitrogen, helium, neon, or argon), an oxygen atmosphere, or reduced pressure before deposition of the oxide semiconductor film 430, so that impurities such as hydrogen and water in the gate insulating layer are removed.

Next, an oxide insulating film is formed over the gate insulating layer 402 and the oxide semiconductor layer by a sputtering method. Then, a resist mask is formed by a third photolithography step, and the oxide insulating layers 426a and 426b are formed by selective etching. After that, the resist mask is removed. At this stage, in the oxide semiconductor layer, there are regions in contact with the oxide insulating layers. Among these regions, the region that overlaps with the gate electrode layer with the gate insulating layer interposed therebetween and also overlaps with the oxide insulating layer 426a is the channel formation region. There is also the region that overlaps with the oxide insulating layer 426b covering the peripheral portion and side surface of the oxide semiconductor layer.

The oxide insulating film can be formed to a thickness at least 1 nm or more by a sputtering method, or the like, as appropriate, which is a method with which impurities such as water and hydrogen are not mixed into the oxide insulating film. In this embodiment, a 300-nm-thick silicon oxide film is formed by a sputtering method, as the oxide insulating film. The substrate temperature in film formation may be greater than or equal to room temperature and less than or equal to 300° C. In this embodiment, the substrate is at room temperature. The formation of the silicon oxide film by a sputtering method can be performed in a rare gas (typically, argon) atmosphere, an oxygen atmosphere, or an atmosphere of a rare gas (typically, argon) and oxygen. As a target, a silicon oxide target or a silicon target can be used. For example, with use of a silicon target, a silicon oxide film can be formed by a sputtering method in an atmosphere of oxygen and nitrogen. As the oxide insulating film formed in contact with the oxide semiconductor layer whose resistance is reduced, an inorganic insulating film that does not include impurities such as moisture, a hydrogen ion, and OH⁻ and blocks entry of these from the outside is used. Specifically, a silicon oxide film, a silicon nitride oxide film, an aluminum oxide film, an aluminum oxynitride film, or the like is used.

Next, second heat treatment is performed in an inert-gas atmosphere or a nitrogen atmosphere, preferably at a temperature of 200° C. to 400° C. inclusive, e.g., of 250° C. to 350° C. inclusive (see FIG. 2B). For example, second heat treatment is performed at 250° C. for one hour in a nitrogen atmosphere. In the second heat treatment, heat is applied while the oxide insulating layer is in contact with end portions of the oxide semiconductor layer 442 which overlap with the oxide insulating layer 426b and with part of the region in the oxide semiconductor layer 442 which overlaps with the oxide insulating layer 426a. Note that in the second heat treatment, the oxide semiconductor layer 442 is heated with a portion that does not overlap with the oxide insulating layer being exposed. When heat treatment is performed in a nitrogen atmosphere or an inert-gas atmosphere where the oxide semiconductor layer 442 is exposed, resistance can be reduced in the high-resistance (i-type) region which is exposed in the oxide semiconductor layer 442. The oxide insulating layer 426a is provided above and in contact with the channel formation region of the oxide semiconductor layer 442, and functions as a channel protective layer.

Next, a conductive film is formed over the gate insulating layer 402, the oxide insulating layers 426a and 426b, and the oxide semiconductor layer 442. After that, through a fourth photolithography step, a resist mask is formed, and etching is performed selectively to form the source electrode layer 425a and the drain electrode layer 425b (see FIG. 2C). The conductive film is formed by a sputtering method, a vacuum evaporation method (e.g., an electron beam evaporation method, or the like), an arc discharge ion plating method, or a spray method. As the material of the conductive film, an element selected from Al, Cr, Cu, Ta, Ti, Mo, and W, an alloy containing any of these elements as a component, an alloy containing these elements in combination, and the like can be used. The conductive film is not limited to a single layer containing the above-described element and may be a stack of two or more layers. In this embodiment, the conductive film has a three-layer structure of a titanium film, an aluminum film, and a titanium film. Instead of a Ti film, a titanium nitride film may be used.

In the fourth photolithography step, only portions of the conductive film which are above and in contact with the oxide semiconductor layer are removed. By using an ammonia peroxide mixture (hydrogen peroxide:ammonia:water=5:2:2), or the like as an alkaline etchant so that only the portions of the conductive film which are above and in contact with the oxide semiconductor layer are thus removed, it is possible to selectively remove the conductive film and to leave the oxide semiconductor layer including an In—Ga—Zn—O-based oxide semiconductor.

The resist mask for forming the source electrode layer 425a and the drain electrode layer 425b may be formed by an inkjet method. Formation of the resist mask by an inkjet method does not require a photomask, which results in a reduction in manufacturing costs.

Next, the insulating layer 428 and the protective insulating layer 403 are formed over the oxide insulating layers 426a and 426b, the source electrode layer 425a, and the drain electrode layer 425b. In this embodiment, the insulating layer 428 made of a silicon oxide film and the protective insulating layer 403 made of a silicon nitride film are formed by using a sputtering method and stacked.

Note that the boundary between the oxide insulating layer 426a and the insulating layer 428 is illustrated in the drawings for better understanding, but is actually unclear because these layers are both silicon oxide films formed by a sputtering method.

Since an RF sputtering method allows high productivity, it is preferably used for deposition of the protective insulating layer 403. The protective insulating layer 403 is formed using an inorganic insulating film that does not contain impurities such as moisture, hydrogen ions, and OH⁻ and blocks entry of such impurities from the outside, typically a silicon nitride film, an aluminum nitride film, a silicon nitride oxide film, or an aluminum oxynitride film. Needless to say, the protective insulating layer 403 is a light-transmitting insulating film.

Then, the planarizing insulating layer 404 is formed over the protective insulating layer 403. The planarizing insulating layer 404 can be formed from an organic material having heat resistance, such as polyimide, acrylic resin, benzocyclobutene-based resin, polyamide, or epoxy resin. Other than such organic materials, it is also possible to use a low-dielectric constant material (a low-k material), a siloxane-based resin, PSG (phosphosilicate glass), BPSG (borophosphosilicate glass), or the like. The planarizing insulating layer 404 may be formed by stacking plural insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

The formation method of the planarizing insulating layer 404 is not limited to a particular method, and the following method can be used depending on the material: a sputtering method, an SOG method, a spin coating method, a dipping method, a spray coating method, a droplet discharge method (e.g., an inkjet method, screen printing, offset printing, or the like), and the like. Further, the planarizing insulating layer 404 can be formed with a doctor knife, a roll coater, a curtain coater, a knife coater, or the like.

Next, by performing a fifth photolithography step, a resist mask is formed, and the planarizing insulating layer 404, the insulating layer 428 and the protective insulating layer 403 are etched, so that a contact hole 441 which reaches the drain electrode layer 425b is formed. The resist mask is then removed (see FIG. 2D). As illustrated in FIG. 2D, the oxide insulating layer 426b is provided below the contact hole, which results in that the thickness of the planarizing insulating layer to be removed can be small as compared to the case where the oxide insulating layer is not provided below the contact hole; accordingly, etching time can be shortened. In addition, as compared to the case where the oxide insulating layer is not provided below the contact hole, the depth of the contact hole 441 can be shallow; accordingly, the coverage with a light-transmitting conductive film, which is formed later and located in a region overlapping with the contact hole 441, can be eased. Besides, a contact hole reaching the gate electrode layer 421b is also formed in this etching. A resist mask used for formation of the contact hole reaching the drain electrode layer 425b may be formed by an inkjet method. Formation of the resist mask by an inkjet method requires no photomask; thus, manufacturing costs can be reduced.

Next, a light-transmitting conductive film is formed. The light-transmitting conductive film can be formed using indium oxide ($In_2O_3$), an alloy of indium oxide and tin oxide ($In_2O_3$—$SnO_2$, abbreviated to ITO), or the like by a sputtering method, a vacuum evaporation method, or the like. Alternatively, an Al—Zn—O-based non-single-crystal film containing nitrogen (i.e., an Al—Zn—O—N-based non-single-crystal film), a Zn—O—N-based non-single-crystal film, or a Sn—Zn—O—N based non-single-crystal film may be used. Note that the percentage (atomic %) of zinc in the Al—Zn—O—N-based non-single-crystal film is 47 atomic % or less and is higher than that of aluminum in the non-single-crystal film; the percentage (atomic %) of aluminum in the non-single-crystal film is higher than that of nitrogen in the non-single-crystal film. Such a material is etched with a hydrochloric acid-based solution. However, since a residue is easily generated, particularly in ITO etching, an alloy of indium oxide and zinc oxide ($In_2O_3$—ZnO) may be used to improve etching processability.

Note that the unit of the percentage of components in the light-transmitting conductive film is atomic percent, and the percentage of components is evaluated by analysis using an electron probe X-ray microanalyzer (EPMA).

Next, by performing a sixth photolithography step, a resist mask is formed, an unnecessary portion is removed by etching to form a pixel electrode layer 427, and then, the resist mask is removed (see FIG. 2E).

Through the above steps, with use of the six masks, the thin film transistor 448 and the wiring intersection portion with reduced parasitic capacitance can be formed over one substrate. The thin film transistor 448 for a pixel is a channel-protective thin film transistor having the oxide semiconductor layer 442 which includes: the high-resistance source region 424a which overlaps with the source electrode layer; the high-resistance drain region 424b which overlaps with the drain electrode layer; the high-resistance source region 424e which does not overlap with the source electrode layer; the high-resistance drain region 424f which does not overlap with the drain electrode layer; and the channel formation region 423. Thus, even when a high electric field is applied, the two high-resistance drain regions or the two high-resistance source regions function as buffers, so that the thin film transistor 448 is prevented from being supplied with a high electric field locally and has an improved withstand voltage. Furthermore, by increasing the distance between the source electrode layer and the drain electrode layer, an off-current of the thin film transistor is reduced.

In addition, a storage capacitor formed with the capacitor wiring layer and the capacitor electrode, in which the gate insulating layer 402 is used as a dielectric, can be formed over the same substrate as the thin film transistor 448. By arranging the thin film transistor 448 and the storage capacitor in each pixel of a pixel portion in which pixels are arranged in a matrix form, one of the substrates for manufacturing an active matrix display device can be obtained. In this specification, such a substrate is referred to as an active matrix substrate for convenience.

Further, a thin film transistor for a drive circuit can be provided over the same substrate as the pixel portion. By providing the drive circuit and the pixel portion over one substrate, connection wirings between the drive circuit and an external signal can be shortened; thus, the size and costs of the semiconductor device can be reduced.

In the thin film transistor 448 for a pixel which is illustrated in FIG. 1B, the oxide semiconductor layer 442 is provided with a first region 424c and a second region 424d which overlap with the oxide insulating layer 426b and are positioned in the peripheral portion of the oxide semiconductor layer 442. The first region 424c and the second region 424d which are peripheral portions of the oxide semiconductor layer 442 are in an oxygen-excess state, as well as the channel formation region 423. By the first region 424c and the second region 424d, a leak current and parasitic capacitance can be reduced when the oxide semiconductor layer and a wiring having a potential different from the potential of the oxide semiconductor layer are arranged to be closed each other.

In terms of high integration, it is preferable that especially in the drive circuit, a plurality of wirings and a plurality of oxide semiconductor layers be arranged at small distances therebetween. In such a drive circuit, the first region 424c and the second region 424d are provided by overlapping the oxide semiconductor layer with the oxide insulating layer 426b, which is effective to reduce a leak current and parasitic capacitance. Further, in the case where a plurality of thin film transistors are arranged in series or in parallel, an oxide semiconductor layer is formed in one island among the plurality of thin film transistors, and the oxide semiconductor layer overlaps with the oxide insulating layer 426b, whereby isolation element is formed. Thus, a region overlapping with the oxide insulating layer 426b is an isolation element region. In such a manner, a plurality of thin film transistors can be arranged in a small area, so that the drive circuit can be highly integrated.

Embodiment 2

In this embodiment is described an example in which an active matrix liquid crystal display device is manufactured by using the thin film transistor described in Embodiment 1 to form a pixel portion and a drive circuit over one substrate.

FIG. 3A illustrates an example of a cross-sectional structure of the active matrix substrate.

Although only the thin film transistor in the pixel portion and the wiring intersection portion are shown in Embodiment 1, the thin film transistor in the drive circuit, the storage capacitor, the gate wiring, and a terminal portion of the source wiring are shown in this embodiment, as well as the thin film transistor and the wiring intersection portion. The capacitor, the gate wiring, and the terminal portion of the source wiring can be formed by the same process as the manufacturing process described in Embodiment 1.

In FIG. 3A, a thin film transistor 220 electrically connected to a pixel electrode layer 227 is of a channel-protection type and is provided in the pixel portion. In this embodiment, the transistor having the same structure as the thin film transistor 448 of Embodiment 1 is used.

A capacitor wiring layer 230, which is formed using the same light-transmitting conductive material and formation step as the gate electrode layer of the thin film transistor 220, overlaps with a capacitor electrode 231, with a gate insulating layer 202 serving as a dielectric interposed therebetween, thereby forming the storage capacitor. Note that the capacitor electrode 231 is formed using the same metal material and formation step as the source electrode layer and drain electrode layer of the thin film transistor 220.

Note that the storage capacitor is provided below the pixel electrode layer 227, and the capacitor electrode 231 is electrically connected to the pixel electrode layer 227.

An example in which the storage capacitor is formed using the capacitor electrode 231 and the capacitor wiring layer 230 is described in this embodiment, but there is no particular limitation on the structure forming the storage capacitor. For instance, the storage capacitor may be formed in such a manner that the pixel electrode layer overlaps with the gate wiring of an adjacent pixel with the planarizing insulating layer, the protective insulating layer, and the gate insulating layer interposed therebetween, without the provision of the capacitor wiring layer.

In FIG. 3A, the storage capacitor includes only the gate insulating layer 202 between the capacitor wiring layer and the capacitor electrode so that a large capacitance is formed, while the wiring intersection portion includes the gate insulating layer 202 and an oxide insulating layer 266b which are provided between the gate electrode layer 421b and a wiring formed above the gate electrode layer 421b so that parasitic capacitance is reduced. In the storage capacitor, in order that only the gate insulating layer 202 be provided between the capacitor wiring layer and the capacitor electrode, an etching condition or a material of the gate insulating layer is selected such that etching for removing the oxide insulating layer 266b allows only the gate insulating layer 202 to remain. In this embodiment, because the oxide insulating layer 266b is a silicon oxide film formed by a sputtering method and the gate insulating layer 202 is a silicon nitride film formed by a plasma CVD method, the selective removal can be realized. Note that when a material that causes the oxide insulating layer 266b and the gate insulating layer 202 to be removed under the same conditions is used, the thicknesses are preferably set such that at least part of the gate insulating layer can remain and form the capacitor even if the thickness of the gate insulating layer is partly reduced. Since the thickness of the gate insulating layer is preferably reduced in order to form large capacitance in the storage capacitor, the thickness of part of the gate insulating layer above the capacitor wiring may be reduced during the etching for removing the oxide insulating layer 266b.

A thin film transistor 260 is of a channel-protection type and is provided in the drive circuit. The thin film transistor 260 has a shorter channel length L than the thin film transistor 220 so that higher operation speed is realized. The channel length L of the thin film transistor of a channel-protection type which is provided in the drive circuit is preferably set to greater than or equal to 0.1 μm and less than or equal to 2 μm. The thin film transistor 260 has a structure in which a source electrode layer 265a and a drain electrode layer 265b are formed so as to overlap with the oxide insulating layer 266a, which is different from the structure of the thin film transistor 220.

The thin film transistor 260 includes: over a substrate 200 having an insulating surface, a gate electrode layer 261; the gate insulating layer 202; the oxide semiconductor layer having at least a channel formation region 263, a high-resistance source region 264a, and a high-resistance drain region 264b; the source electrode layer 265a; and the drain electrode layer 265b. Further, the oxide insulating layer 266a in contact with the channel formation region 263 is also provided.

The gate electrode layer of the thin film transistor 260 in the drive circuit may be electrically connected to a conductive layer 267 provided above the oxide semiconductor layer. In that case, a planarizing insulating layer 204, an insulating layer 216, a protective insulating layer 203, the oxide insulating layer 266b, and the gate insulating layer 202 are selectively etched using the same photomask as the contact hole for electrically connecting the drain electrode layer of the thin film transistor 220 to the pixel electrode layer 227, whereby a contact hole is formed. Through this contact hole, the conductive layer 267 is electrically connected to the gate electrode layer 261 of the thin film transistor 260 in the drive circuit.

For the insulating layer 216, an inorganic insulating film such as a silicon oxide film, an aluminum oxide film, a silicon oxynitride film, or an aluminum oxynitride film is used. In this embodiment, a silicon oxide film formed by a sputtering method is used.

For the protective insulating layer 203, an inorganic insulating film such as a silicon nitride film, an aluminum nitride film, a silicon nitride oxide film, or an aluminum oxynitride film is used. In this embodiment, a silicon nitride film formed by a sputtering method is used.

In the thin film transistor 260, the width of the gate electrode layer 261 (the width in the channel length direction) is larger than that of the oxide semiconductor layer. The oxide insulating layer 266b overlaps with a peripheral portion of the oxide semiconductor layer and also overlaps with the gate electrode layer 261. The oxide insulating layer 266b is used to increase the distance between the drain electrode layer 265b and the gate electrode layer 261, and to reduce the parasitic capacitance formed between the drain electrode layer 265b and the gate electrode layer 261. A first region 264c and a second region 264d in the oxide semiconductor layer which overlap with the oxide insulating layer 266b are in an oxygen-excess state like the channel formation region 263, and reduce leakage current and also reduce the parasitic capacitance.

Plural gate wirings, source wirings, and capacitor wiring layers are provided in accordance with the pixel density. In the terminal portion, plural first terminal electrodes at the same potential as the gate wiring, plural second terminal electrodes at the same potential as the source wiring, plural third terminal electrodes at the same potential as the capacitor wiring layer, and the like are arranged. The number of each of the terminal electrodes may be any number determined as appropriate by the practitioner.

In the terminal portion, the first terminal electrode at the same potential as the gate wiring can be formed using the same light-transmitting material as the pixel electrode layer 227. The first terminal electrode is electrically connected to the gate wiring through a contact hole reaching the gate wiring. The contact hole reaching gate wiring is formed in such a manner that the planarizing insulating layer 204, the insulating layer 216, the protective insulating layer 203, the oxide insulating layer 266b, and the gate insulating layer 202 are selectively etched using the same photomask as the contact hole for electrically connecting the drain electrode layer of the thin film transistor 220 to the pixel electrode layer 227.

The second terminal electrode 255 at the same potential as the source wiring 254 in the terminal portion can be formed using the same light-transmitting material as the pixel electrode layer 227. The second terminal electrode 255 is electrically connected to the source wiring 254 through a contact hole reaching the source wiring 254. The source wiring is a metal wiring formed using the same material and step as the source electrode layer 265a of the thin film transistor 260, and is at the same potential as the source electrode layer 265a.

The third terminal electrode at the same potential as the capacitor wiring layer 230 can be formed using the same light-transmitting material as the pixel electrode layer 227. A contact hole reaching the capacitor wiring layer 230 can be formed by using the same photomask and step as a contact hole for electrically connecting the capacitor electrode 231 to the pixel electrode layer 227.

When an active matrix liquid crystal display device is manufactured, an active matrix substrate and a counter substrate provided with a counter electrode are fixed with a liquid crystal layer therebetween. Note that a common electrode electrically connected to the counter electrode provided for the counter substrate is provided over the active matrix substrate, and the fourth terminal electrode electrically connected to the common electrode is provided in the terminal portion. This fourth terminal electrode is a terminal for setting the common electrode at a fixed potential such as GND or 0 V. The fourth terminal electrode can be formed using the same light-transmitting material as the pixel electrode layer 227.

When the gate electrode layer, the source electrode layer, the drain electrode layer, the pixel electrode layer, another electrode layer, and another wiring layer are formed using the same material, a common sputtering target or a common manufacturing apparatus can be used. Accordingly, the costs of the material of these layers and an etchant (or an etching gas) used in etching can be reduced, resulting in a reduction in manufacturing costs.

In the structure of FIG. 3A, when a photosensitive resin material is used for the planarizing insulating layer 204, the step of forming a resist mask can be omitted.

FIG. 3B illustrates a cross-sectional structure that is partly different from that illustrated in FIG. 3A. FIG. 3B is the same as FIG. 3A except that there is no planarizing insulating layer 204 in the terminal portion and except for the structure of the thin film transistor in the drive circuit. Therefore, components common to FIGS. 3A and 3B keep the same reference numerals, and are not described in detail again. In FIG. 3B, a thin film transistor 270 using a metal wiring is provided. The terminal electrode is also formed by using the same material and process as the metal wiring.

In the structure of FIG. 3B, a photosensitive resin material is used for the planarizing insulating layer 204, and the step of forming a resist mask is omitted. Thus, without use of a resist mask, a structure in which there is no planarizing insulating layer 204 in the terminal portion can be formed. When there is no planarizing insulating layer in the terminal portion, good connection to an FPC (Flexible Printed Circuit) can easily be obtained.

The thin film transistor 270 includes: over the substrate 200 having an insulating surface, a gate electrode layer 271; the gate insulating layer 202; the oxide semiconductor layer having at least a channel formation region 273, a high-resistance source region 274a, and a high-resistance drain region 274b; a source electrode layer 275a; and a drain electrode layer 275b. Further, an oxide insulating layer 276a in contact with the channel formation region 273 is also provided. Furthermore, the insulating layer 216 and the protective insulating layer 203 are formed over the source electrode layer 275a and the drain electrode layer 275b.

A first region 274c and a second region 274d in the oxide semiconductor layer which overlap with the oxide insulating layer 276b are in an oxygen-excess state like the channel formation region 273, and serve to reduce leakage current and also reduce the parasitic capacitance. A third region 274e in the oxide semiconductor layer which is in contact with the insulating layer 216 is provided between the channel formation region 273 and the high-resistance source region 274a. A fourth region 274f in the oxide semiconductor layer which is in contact with the insulating layer 216 is provided between the channel formation region 273 and the high-resistance drain region 274b. The third region 274e and the fourth region 274f in the oxide semiconductor layer which are in contact with the insulating layer 216 enables a reduction in off-current.

In the thin film transistor of a channel-protection type, when the source electrode layer and the drain electrode layer are provided over the oxide insulator layer having a small width which is reduced so as to shorten the channel length L of the channel formation region, a short circuit could be formed over the oxide insulating layer. Therefore, the source electrode layer 275a and the drain electrode layer 275b are provided so that their end portions are apart from the oxide insulating layer 276a having a small width.

The gate electrode layer of the thin film transistor 270 in the drive circuit may be electrically connected to a conductive layer 277 provided above the oxide semiconductor layer.

The second terminal electrode 257 at the same potential as the source wiring 256 in the terminal portion can be formed of the same light-transmitting material as the pixel electrode layer 227. The source wiring is a metal wiring formed using the same material and step as the source electrode layer 275a of the thin film transistor 270, and is at the same potential as the source electrode layer 275a.

Since a thin film transistor is easily broken due to static electricity or the like, a protective circuit is preferably provided over the same substrate as the pixel portion or the drive circuit. The protective circuit is preferably formed using a non-linear element including an oxide semiconductor layer. For example, protective circuits are provided between the pixel portion and a scan line input terminal and between the pixel portion and a signal line input terminal. In this embodiment, a plurality of protective circuits are provided so as to prevent breakage of the a pixel transistor and the like which can be caused when a surge voltage due to static electricity or the like is applied to a scan line, a signal line, and a capacitor bus line. Therefore, the protective circuit is formed so as to release charge to a common wiring when a surge voltage is applied to the protective circuit. Further, the protective circuit includes non-linear elements arranged in parallel to each other with the scan line therebetween. The non-linear element includes a two-terminal element such as a diode or a three-terminal element such as a transistor. For example, the non-linear element can also be formed through the same step as the thin film transistor 220 in the pixel portion, and can be made to have the same properties as a diode by connecting a gate terminal to a drain terminal of the non-linear element.

A structure in which the planarizing insulating layer 204 is not provided may be employed by omitting the step of forming the planarizing insulating layer 204. In this case, the pixel electrode layer 227 and the second terminal electrode 255 are provided above and in contact with the protective insulating layer 203.

This embodiment can be combined with Embodiment 1 as appropriate.

Embodiment 3

In this embodiment, an example of a structure of a terminal portion provided over the same substrate as the thin film transistor is described. Although an example of the terminal portion of the source wiring is described in Embodiment 2, a terminal portion of the source wiring which is different from the terminal portion described in Embodiment 2 and a terminal portion of the gate wiring are shown in this embodiment. Note that in FIGS. 4A1 to 4B2, components common to FIGS. 3A and 3B keep the same reference numerals.

FIGS. 4A1 and 4A2 respectively illustrate a cross-sectional view and a top view of the terminal portion of the gate wiring. FIG. 4A1 is the cross-sectional view taken along line C1-C2 of FIG. 4A2. In FIG. 4A1, a conductive layer 225 formed over a stack of the insulating layer 216 and the protective insulating layer 203 is a terminal electrode for connection which functions as an input terminal. Furthermore, in the terminal portion of FIG. 4A1, a first terminal 221 formed of the same material as the gate electrode layer 421*b* of FIG. 2E and a connection electrode layer 223 formed of the same material as the source wiring overlap with each other with the gate insulating layer 202 interposed therebetween, and are electrically connected to each other through the conductive layer 225.

FIGS. 4B1 and 4B2 are respectively a cross-sectional view and a top view of the terminal portion of the source wiring which is different from the source wiring terminal portion illustrated in FIG. 3B. FIG. 4B1 is the cross-sectional view taken along line C3-C4 of FIG. 4B2. In FIG. 4B1, a conductive layer 225 formed over a stack of the insulating layer 216 and the protective insulating layer 203 is the terminal electrode for connection which functions as an input terminal. Furthermore, in the terminal portion of FIG. 4B1, an electrode layer 226 formed of the same material as the gate wiring is located below and overlaps with a second terminal 222, which is electrically connected to the source wiring, with the gate insulating layer 202 interposed therebetween. The electrode layer 226 is not electrically connected to the second terminal 222. When the potential of the electrode layer 226 is set to a potential different from that of the second terminal 222, such as floating, GND, or 0 V, a capacitor for preventing noise or static electricity can be formed. In addition, the second terminal 222 is electrically connected to the conductive layer 225 through a contact hole formed in the stack of the insulating layer 216 and the protective insulating layer 203.

Plural gate wirings, source wirings, and capacitor wirings are provided in accordance with the pixel density. In the terminal portion, plural first terminals at the same potential as the gate wiring, plural second terminals at the same potential as the source wiring, plural third terminals at the same potential as the capacitor wiring, and the like are arranged. The number of each of the terminal electrodes may be any number determined as appropriate by the practitioner.

This embodiment can be combined with Embodiment 1 or 2 as appropriate.

Embodiment 4

In this embodiment, a description is provided of an example of a liquid crystal display device in which a liquid crystal layer is sealed between a first substrate and a second substrate, and a common connection portion electrically connected to the counter electrode provided for the second substrate is formed over the first substrate. Note that a thin film transistor is formed as a switching element over the first substrate, and the common connection portion is manufactured in the same process as the switching element in the pixel portion, thereby being obtained without complicating the process.

The common connection portion is provided in a position that overlaps with a sealant for bonding the first substrate and the second substrate, and is electrically connected to the counter electrode through conductive particles contained in the sealant. Alternatively, the common connection portion is provided in a position that does not overlap with the sealant (except for the pixel portion) and a paste containing conductive particles is provided separately from the sealant so as to overlap with the common connection portion, whereby the common connection portion is electrically connected to the counter electrode.

Figure 5A:
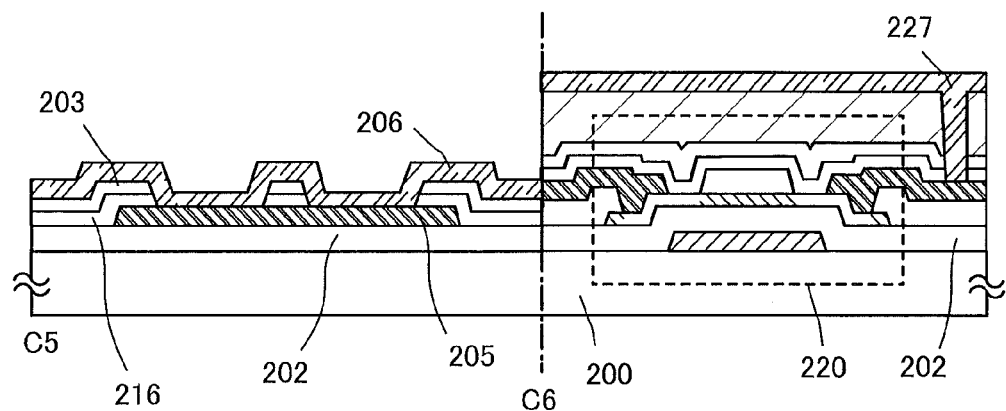
FIGS. 5A and 5B are respectively a cross-sectional view and a top view of one embodiment of the present invention.

FIG. 5A is a cross-sectional view of a semiconductor device in which a thin film transistor and a common connection portion are formed over one substrate.

In FIG. 5A, the thin film transistor 220 electrically connected to the pixel electrode layer 227 is of a channel-protection type and is provided in the pixel portion. In this embodiment, the thin film transistor 220 has the same structure as the thin film transistor 448 of Embodiment 1.

Figure 5B:
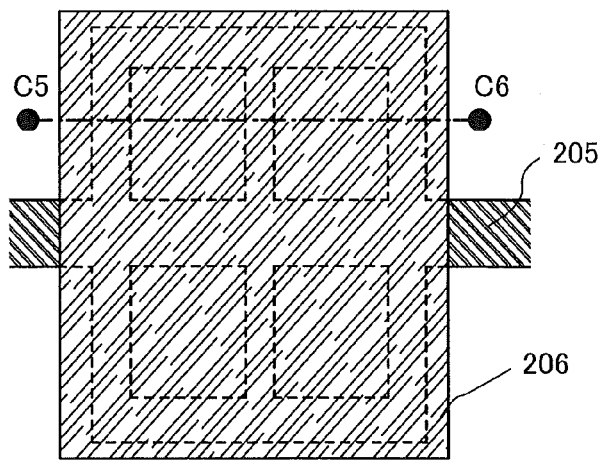

FIG. 5B illustrates an example of a top view of the common connection portion, and dashed line C5-C6 in FIG. 5B corresponds to a cross section of the common connection portion of FIG. 5A. Note that in FIG. 5B, components common to FIG. 5A keep the same reference numerals.

A common potential line 205 is provided over the gate insulating layer 202, and formed by using the same material and step as the source electrode layer and the drain electrode layer of the thin film transistor 220.

Also, the common potential line 205 is covered with the stack of the insulating layer 216 and the protective insulating layer 203. The stack of the insulating layer 216 and the protective insulating layer 203 has a plurality of opening portions overlapping with the common potential line 205. This opening portion is formed by using the same step as the contact hole that connects the drain electrode layer of the thin film transistor 220 to the pixel electrode layer 227.

Note that because of a significant difference in area, a distinction is made here between the contact hole in the pixel portion and the opening portion in the common connection portion. Further, in FIG. 5A, the pixel portion and the common connection portion are not illustrated on the same scale.

For example, the length of the dashed line C5-C6 in the common connection portion is about 500 μm while the width of the thin film transistor is less than 50 μm; thus, the common connection portion actually has an area ten times larger or more than an area of the thin film transistor. However, for simplicity, the pixel portion and the common connection portion are shown on different scales in FIG. 5A.

A common electrode layer 206 is provided over the stack of the insulating layer 216 and the protective insulating layer 203, and formed by using the same material and step as the pixel electrode layer 227 in the pixel portion.

In this manner, the common connection portion is manufactured in the same forming step as the switching element in the pixel portion.

The first substrate provided with the pixel portion and the common connection portion and the second substrate having the counter electrode are fixed with the sealant.

When the sealant is made to contain conductive particles, the pair of substrates are aligned so that the sealant overlaps with the common connection portion. For example, in a small liquid crystal panel, two common connection portions are arranged so as to overlap with the sealant at opposite corners of the pixel portion and the like. In a large liquid crystal panel, four or more common connection portions are arranged so as to overlap with the sealant.

Note that the common electrode layer 206 is an electrode in contact with the conductive particles contained in the sealant, and is electrically connected to the counter electrode of the second substrate.

When a liquid crystal injection method is used, the two substrates are fixed with the sealant, and then liquid crystals are injected between the pair of substrates. Alternatively, when a liquid crystal dropping method is used, the sealant is drawn on the second substrate or the first substrate, liquid crystals are dropped thereon, and then the two substrates are bonded to each other under a reduced pressure.

An example of the common connection portion electrically connected to the counter electrode is described in this embodiment, but without any limitation thereto, such a common connection portion can be used as a connection portion connected to any other wiring or an external connection terminal or the like.

This embodiment can be combined with any one of Embodiments 1 to 3 as appropriate.

Embodiment 5

An example in which the gate insulating layer has a single-layer structure is described in Embodiment 1 or Embodiment 2. In Embodiment 5, an example of a stacked structure will be described. Note that components common to FIGS. 6A and 6B and FIG. 3A or FIG. 3B keep the same reference numerals.

Figure 6A:
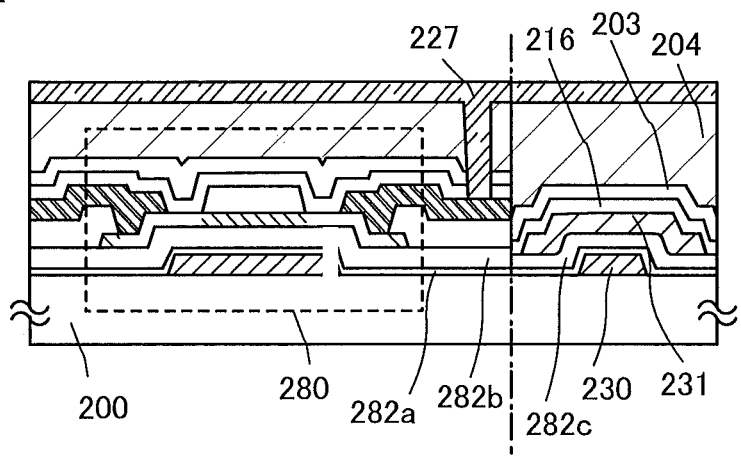
FIGS. 6A and 6B are cross-sectional views of one embodiment of the present invention.

In FIG. 6A, a thin film transistor 280 is an example of a channel protective thin film transistor provided in a pixel portion, in which a gate insulating layer has a two-layer structure. Note that except for the two-layer structure of the gate electrode layer, the thin film transistor 280 is the same as the thin film transistor 220.

In this embodiment, the gate insulating layer has a stacked structure of a first gate insulating layer 282a having a thickness greater than or equal to 50 nm and less than or equal to 200 nm and a second gate insulating layer 282b having a thickness greater than or equal to 50 nm and less than or equal to 300 nm. As the first gate insulating layer 282a, a silicon nitride film or a silicon nitride oxide film having a thickness of 100 nm is used. As the second gate insulating layer 282b, a silicon oxide film having a thickness of 100 nm is used.

Note that a storage capacitor is provided below the pixel electrode layer 227, and the capacitor electrode 231 is electrically connected to the pixel electrode layer 227.

In this embodiment, the storage capacitor is formed using the capacitor electrode 231 and the capacitor wiring layer 230.

In FIG. 6A, the storage capacitor includes only the gate insulating layer between the capacitor wiring and the capacitor electrode so as to have large capacitance.

This embodiment shows an example in which a silicon oxide film formed by a sputtering method is used as an oxide insulating layer 282b, and the second gate insulating layer formed using a silicon oxide film is etched to be thin when the oxide insulating layer overlapping with the capacitor wiring layer 230 is removed, whereby a third gate insulating layer 282c is formed. Note that the first gate insulating layer 282a is formed using a silicon nitride film or a silicon nitride oxide film, and functions as an etching stopper to prevent etching damage on the gate electrode layer or the substrate.

When the third gate insulating layer 282c has a small thickness, storage capacitance can be increased.

Figure 6B:
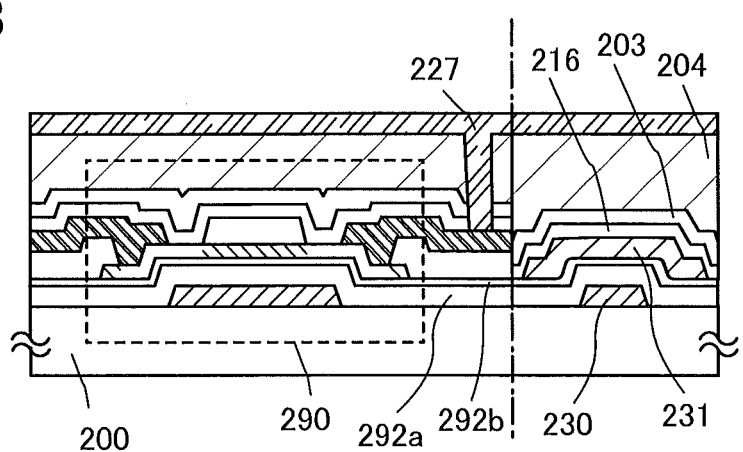

FIG. 6B illustrates a cross-sectional structure which is partly different from that in FIG. 6A.

In a thin film transistor 290 illustrated in FIG. 6B, a gate insulating layer has a stacked structure of a first gate insulating layer 292a having a thickness greater than or equal to 50 nm and less than or equal to 200 nm and a second gate insulating layer 292b having a thickness greater than or equal to 1 nm and less than or equal to 50 nm. As the first gate insulating layer 292a, a silicon oxide film having a thickness of 100 nm is used. As the second gate insulating layer 292b, a silicon nitride film or a silicon nitride oxide film having a thickness of 10 nm is used.

The thin film transistor 290 is an example of a channel protective thin film transistor provided in a pixel portion, in which the gate insulating layer has a two-layer structure. Note that except for the two-layer structure of the gate electrode layer, the thin film transistor 290 is the same as the thin film transistor 220.

This embodiment can be freely combined with any one of Embodiments 1 to 4.

Embodiment 6

In this embodiment, an example of a thin film transistor whose manufacturing process is partly different from that of Embodiment 1 will be described with reference to FIGS. 7A to 7C and FIGS. 8A to 8E. FIGS. 7A to 7C and FIGS. 8A to 8E are the same as FIGS. 1A to 1C and FIGS. 2A to 2E except for a difference in part of the process. Therefore, identical components are designated by the same reference numerals, and not described in detail again.

First, in accordance with Embodiment 1, a gate electrode layer, a gate insulating layer, and the oxide semiconductor film 430 are formed over a substrate; thus, steps up to and including the step shown FIG. 2A of Embodiment 1 are carried out. FIG. 2A is the same as FIG. 8A.

Then, the oxide semiconductor film 430 is processed into island-shaped oxide semiconductor layers by a second photolithography step.

Next, dehydration or dehydrogenation of the oxide semiconductor layer is performed. The temperature of first heat treatment for dehydration or dehydrogenation is set to greater than or equal to 400° C. and less than the strain point of the substrate, preferably 425° C. or more. Note that in the case of the temperature of 425° C. or more, the heat treatment time may be one hour or less, whereas in the case of the temperature less than 425° C., the heat treatment time is longer than one hour. Here, the substrate is introduced into an electric furnace, which is one of heat treatment apparatuses, and heat treatment of the oxide semiconductor layer is performed in a nitrogen atmosphere. Then, the oxide semiconductor layer is not exposed to air, which prevents further water or hydrogen contamination, so that an oxide semiconductor layer is obtained. After that, cooling is performed by introduction of a high-purity oxygen gas, a high-purity $N_2O$ gas, or ultra-dry air (having a dew point of −40° C. or less, preferably −60° C. or less) into the same furnace. It is preferable that the oxygen gas and the $N_2O$ gas do not include water, hydrogen, and the like. Alternatively, the purity of an oxygen gas or an $N_2O$ gas which is introduced into the heat treatment apparatus is preferably 6N (99.9999%) or more, more preferably 7N (99.99999%) or more (i.e., the impurity concentration of the oxygen gas or the $N_2O$ gas is 1 ppm or less, preferably 0.1 ppm or less).

Further, after the first heat treatment for dehydration or dehydrogenation, heat treatment may be performed at greater than or equal to 200° C. and less than or equal to 400° C., preferably greater than or equal to 200° C. and less than or equal to 300° C., in an atmosphere of an oxygen gas or an $N_2O$ gas.

Alternatively, the first heat treatment for the oxide semiconductor layer can be performed with respect to the oxide semiconductor film 430 before it is processed into the island-shaped oxide semiconductor layers. In that case, after the first heat treatment, the substrate is taken out of the heating apparatus and a photolithography step is performed.

Through the above process, the whole oxide semiconductor film is placed in an oxygen-excess state to have higher resistance, that is, becomes an i-type oxide semiconductor film.

Next, an oxide insulating film is formed over the gate insulating layer 402 and the oxide semiconductor layer by a sputtering method. Then, a resist mask is formed by a third photolithography step, and the oxide insulating layers 426a and 426b are formed by selective etching. After that, the resist mask is removed (see FIG. 8B).

Next, a conductive film is formed over the gate insulating layer 402, the oxide insulating layers 426a and 426b, and an oxide semiconductor layer 422. Then, a resist mask is formed by a fourth photolithography step, and the source electrode layer 425a and the drain electrode layer 425b are formed by selective etching (see FIG. 8C).

Next, in order to reduce variation in electric characteristics of the thin film transistors, heat treatment (preferably at greater than or equal to 150° C. and less than 350° C.) may be performed in an inert gas atmosphere or a nitrogen gas atmosphere. For example, heat treatment is performed at 250° C. for 1 hour in a nitrogen atmosphere.

Next, a stack of an insulating layer 428 and a protective insulating layer 403 is formed over the oxide insulating layers 426a and 426b, the source electrode layer 425a, and the drain electrode layer 425b.

Next, a planarizing insulating layer 404 is formed over the protective insulating layer 403.

Next, a fifth photolithography step is performed. A resist mask is formed, and the planarizing insulating layer 404, the protective insulating layer 403, and the insulating layer 428 are etched, so that the contact hole 441 which reaches the drain electrode layer 425b is formed. Then, the resist mask is removed (see FIG. 8D).

Next, a light-transmitting conductive film is formed.

Next, a sixth photolithography step is performed. A resist mask is formed, and unnecessary portion is removed by etching, so that the pixel electrode layer 427 is formed. Then, the resist mask is removed (see FIG. 8E).

Through the above process, a thin film transistor 420 and the wiring intersection portion with reduced parasitic capacitance can be manufactured over one substrate with the use of six masks.

The thin film transistor 420 used for a pixel is a channel protective thin film transistor which includes the oxide semiconductor layer 422 having a channel formation region.

Figure 7A:
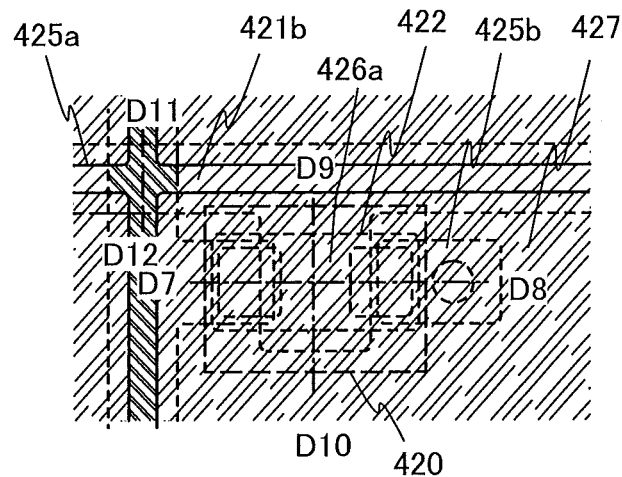
FIGS. 7A to 7C are a plan view and cross-sectional views of one embodiment of the present invention.
Figure 7B:
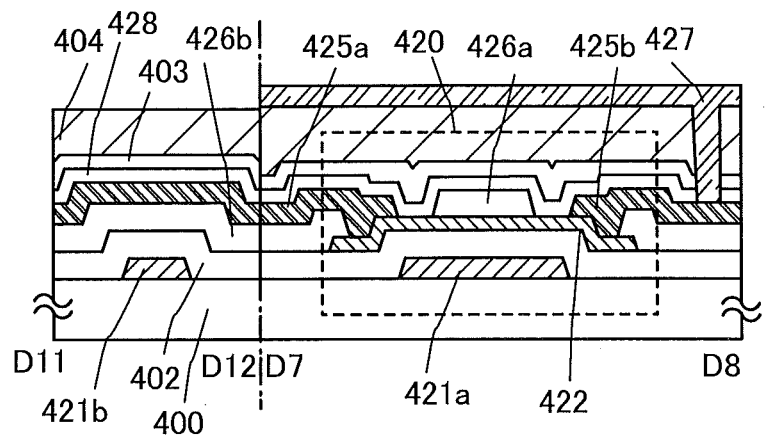
Figure 7C:
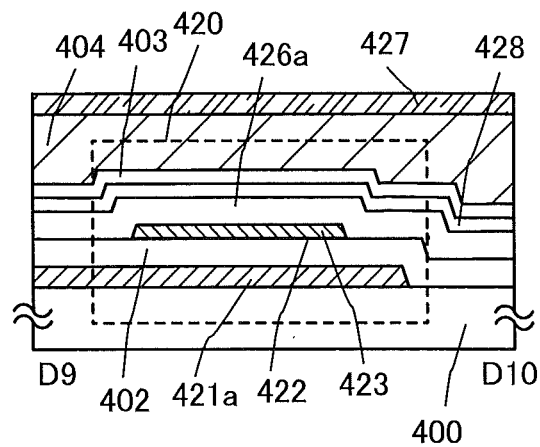

In addition, FIG. 7A is a plan view of the channel protective thin film transistor 420 which is provided in a pixel, and FIG. 7B is a cross-sectional view taken along line D7-D8 and line D11-D12 of FIG. 7A. FIG. 7C is a cross-sectional view taken along line D9-D10 of FIG. 7A. Note that FIG. 8E is the same as FIG. 7B.

This embodiment can be freely combined with any one of Embodiments 1 to 5.

Embodiment 7

Figure 9A:
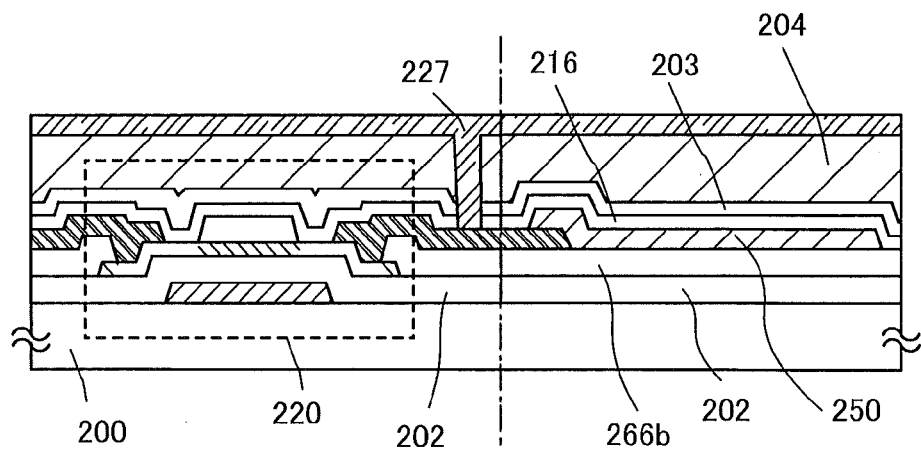
FIGS. 9A and 9B each illustrate a semiconductor device.

In this embodiment, an example of a structure of a storage capacitor, which is different from that of Embodiment 2, will be described with reference to FIGS. 9A and 9B. FIG. 9A is the same as FIG. 3A except for a difference in the structure of a storage capacitor. Therefore, identical components are designated by the same reference numerals and not described in detail again. Note that FIG. 9A illustrates a cross-sectional structure of the thin film transistor 220 in a pixel portion and the storage capacitor.

FIG. 9A illustrates an example in which the storage capacitor is formed of the pixel electrode layer 227 and a capacitor wiring layer 250 which overlaps with the pixel electrode layer 227, with the use of the protective insulating layer 203 and the planarizing insulating layer 204 as a dielectric. The capacitor wiring layer 250 is formed using a material that is different from the material of the drain electrode layer of the thin film transistor 220 in the pixel portion. The material of the capacitor wiring layer 250 is also different from the material of the oxide semiconductor layer of the thin film transistor 220. The capacitor wiring layer 250 is formed using a light-transmitting conductive film. Note that, in addition to the photomasks used in Embodiment 2, one more photomask for patterning of the capacitor wiring layer 250 is used. Etching for forming the capacitor wiring layer 250 is performed under conditions in which the exposed oxide semiconductor layer of the thin film transistor 220 is not removed.

In the storage capacitor illustrated in FIG. 9A, the pair of electrodes and the dielectric have a light-transmitting property, and thus the whole storage capacitor has a light-transmitting property. By making the storage capacitor have a light-transmitting property, improvement in aperture ratio of the pixel portion can be achieved.

Figure 9B:
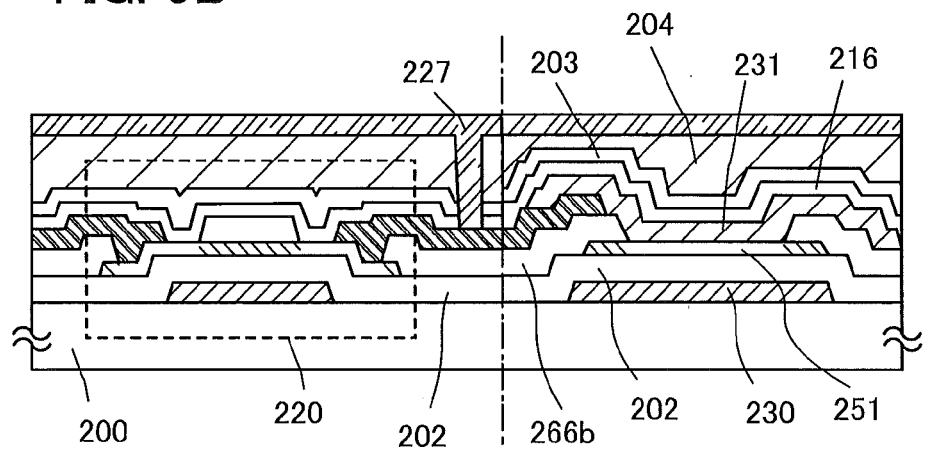

FIG. 9B illustrates an example of a storage capacitor having a structure different from that in FIG. 9A. FIG. 9B is also the same as FIG. 3A except for a difference in the structure of the storage capacitor. Therefore, identical components are designated by the same reference numerals and not described in detail again.

FIG. 9B illustrates an example in which a storage capacitor is formed of the capacitor wiring layer 230 and a stack of an oxide semiconductor layer 251 and the capacitor electrode 231 which overlap with the capacitor wiring layer 230 with the use of the gate insulating layer 202 as a dielectric. Further, the capacitor electrode 231 is stacked above and in contact with the oxide semiconductor layer 251 and functions as one of electrodes of the storage capacitor. Note that the oxide semiconductor layer 251 is formed using the same material and in the same forming step as the oxide semiconductor layer of the thin film transistor 220. The capacitor wiring layer 230 is formed using the same material and in the forming same step as the gate electrode layer of the thin film transistor 220; therefore, the capacitor wiring layer 230 is disposed so that it does not overlap with a gate wiring layer of the thin film transistor 220. In addition, the capacitor electrode 231 is electrically connected to the pixel electrode layer 227.

The material of the capacitor wiring layer 230 is also different from the material of the oxide semiconductor layer of the thin film transistor 220. The capacitor electrode 231 is formed using a light-transmitting conductive film. Note that in addition to the photomasks used in Embodiment 2, one more photomask for patterning of the capacitor electrode 231 is used. Etching for forming the capacitor electrode 231 is performed under conditions in which the exposed oxide semiconductor layer of the thin film transistor 220 is not removed.

Also in the storage capacitor illustrated in FIG. 9B, the pair of electrodes and the dielectric have a light-transmitting property, and thus the whole storage capacitor has a light-transmitting property.

The storage capacitors illustrated in FIGS. 9A and 9B have a light-transmitting property, and high definition of a displayed image is achieved by increasing the number of gate wirings, for example. Therefore, even when the pixel size is reduced, sufficient capacitance and a high aperture ratio can be obtained.

This embodiment can be freely combined with any of the other embodiments.

Embodiment 8

In this embodiment, an example will be described below in which at least some of drive circuits and a thin film transistor placed in a pixel portion are formed over one substrate.

The thin film transistor placed in the pixel portion is formed as described in any of Embodiments 1, 2, 5, and 6. Since the thin film transistor described in any of Embodiments 1, 2, 5, and 6 is an n-channel TFT, some of drive circuits that can be constituted by n-channel TFTs among the drive circuits are formed over the substrate where the thin film transistor in the pixel portion is formed.

Figure 14A:
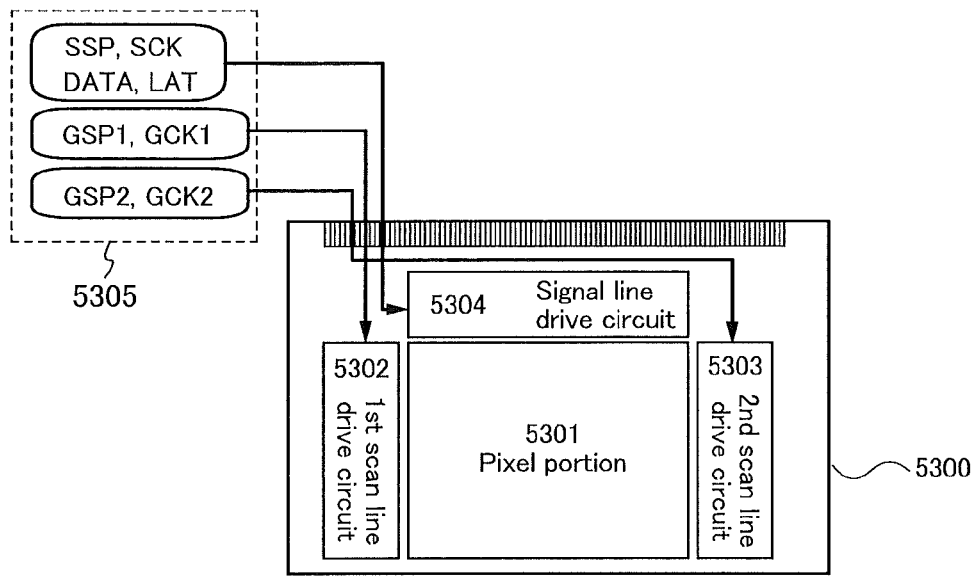
FIGS. 14A and 14B are block diagrams each illustrating a semiconductor device.

FIG. 14A illustrates an example of a block diagram of an active matrix display device. A pixel portion 5301, a first scan line drive circuit 5302, a second scan line drive circuit 5303, and a signal line drive circuit 5304 are provided over a substrate 5300 in the display device. In the pixel portion 5301, a plurality of signal lines extended from the signal line drive circuit 5304 are placed, and a plurality of scan lines extended from the first scan line drive circuit 5302 and the second scan line drive circuit 5303 are placed. Note that in crossing regions of the scan lines and the signal lines, pixels each having a display element are arranged in a matrix. The substrate 5300 of the display device is connected to a timing control circuit 5305 (also referred to as a controller or a control IC) through a connection portion such as a flexible printed circuit (FPC).

In FIG. 14A, the first scan line drive circuit 5302, the second scan line drive circuit 5303, and the signal line drive circuit 5304 are formed over the substrate 5300 where the pixel portion 5301 is formed. Consequently, the number of components of a drive circuit and the like which are externally provided is reduced, so that costs can be reduced. Moreover, the number of connections in the connection portion which are formed when wirings are extended from a drive circuit provided outside the substrate 5300 can be reduced, and the reliability or yield can be increased.

Note that the timing control circuit 5305 supplies, for example, a first scan line drive circuit start signal (GSP1) and a scan line drive circuit clock signal (GCK1) to the first scan line drive circuit 5302. Furthermore, the timing control circuit 5305 supplies, for example, a second scan line drive circuit start signal (GSP2) (which is also referred to as a start pulse) and a scan line drive circuit clock signal (GCK2) to the second scan line drive circuit 5303. Moreover, the timing control circuit 5305 supplies a signal line drive circuit start signal (SSP), a signal line drive circuit clock signal (SCK), video signal data (DATA, also simply referred to as a video signal), and a latch signal (LAT) to the signal line drive circuit 5304. Each clock signal may be a plurality of clock signals with shifted phases or may be supplied together with a signal (CKB) obtained by inverting the clock signal. Note that it is possible to omit one of the first scan line drive circuit 5302 and the second scan line drive circuit 5303.

Figure 14B:
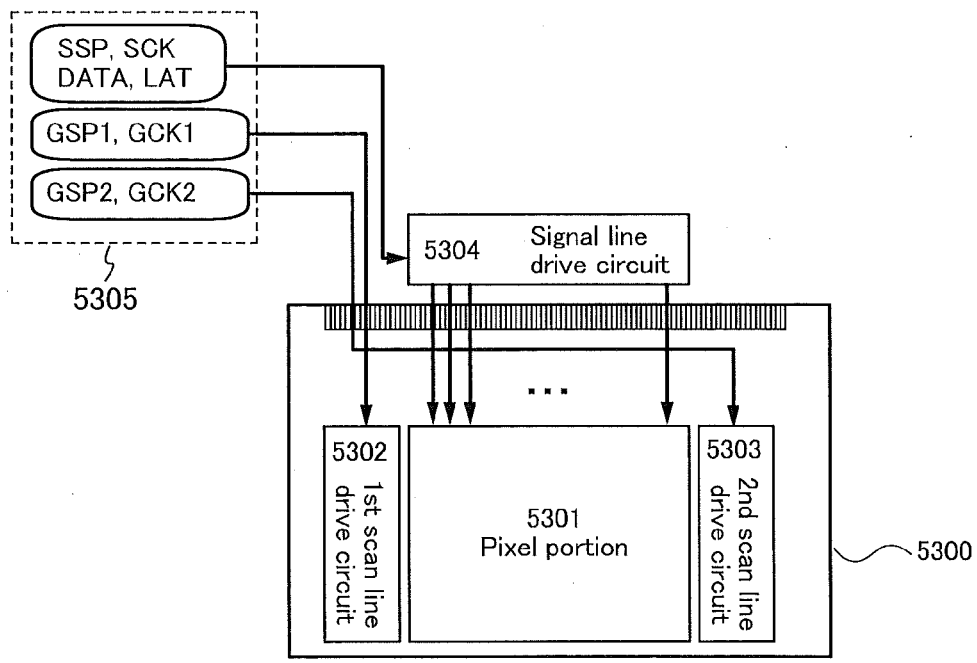

FIG. 14B illustrates a structure in which circuits with lower driving frequency (e.g., the first scan line drive circuit 5302 and the second scan line drive circuit 5303) are formed over the substrate 5300 where the pixel portion 5301 is formed, and the signal line drive circuit 5304 is formed over a substrate which is different from the substrate 5300 where the pixel portion 5301 is formed. With this structure, the drive circuits formed over the substrate 5300 can be constituted by thin film transistors whose field effect mobility is lower than that of transistors including a single crystal semiconductor. Thus, an increase in size of the display device, a reduction in costs, improvement in yield, or the like can be achieved.

Figure 15A:
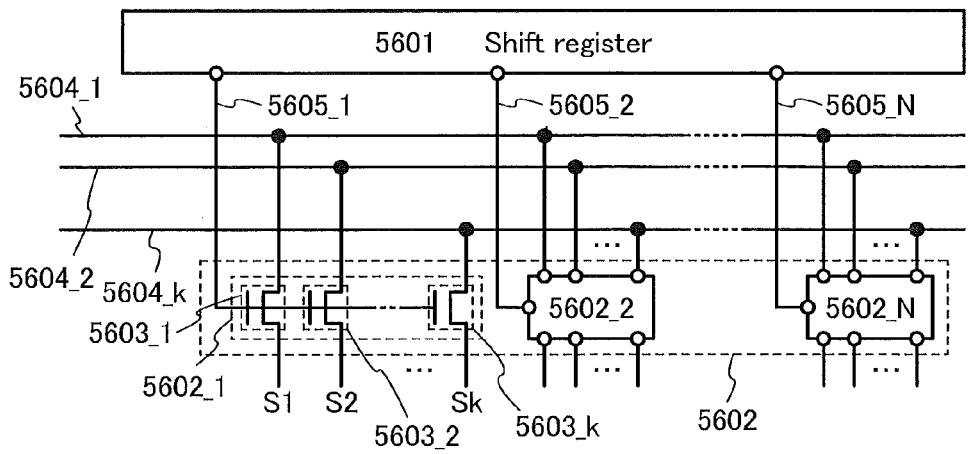
FIGS. 15A and 15B are a configuration of a signal line drive circuit and a timing chart illustrating the operation, respectively.
Figure 15B:
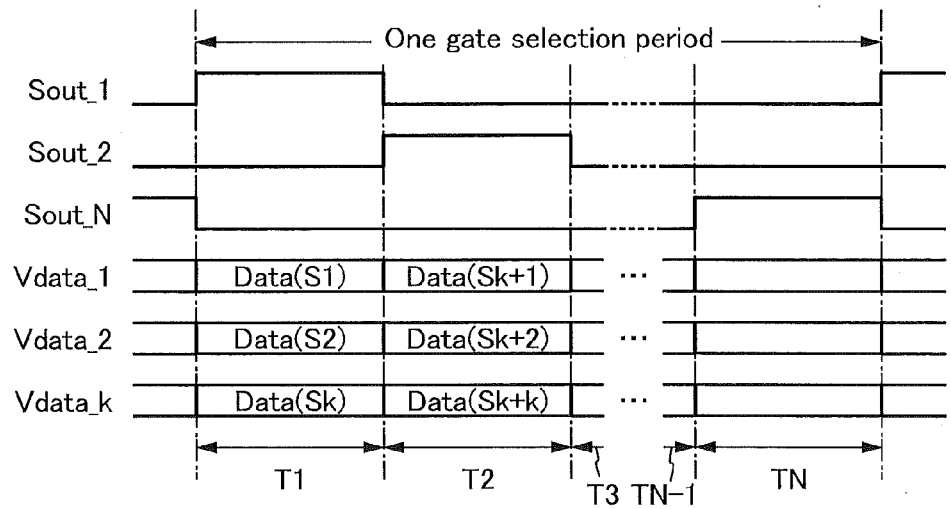

The thin film transistors in any of Embodiments 1, 2, 5, and 6 are n-channel TFTs. FIGS. 15A and 15B illustrate an example of a structure and operation of a signal line drive circuit constituted by n-channel TFTs.

The signal line drive circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_$k$ (k is a natural number). The example where the thin film transistors 5603_1 to 5603_$k$ are n-channel TFTs is described below.

A connection relation in the signal line drive circuit is described by using the switching circuit 5602_1 as an example. First terminals of the thin film transistors 5603_1 to 5603_$k$ are connected to wirings 5604_1 to 5604_$k$, respectively. Second terminals of the thin film transistors 5603_1 to 5603_$k$ are connected to signal lines S1 to Sk, respectively. Gates of the thin film transistors 5603_1 to 5603_$k$ are connected to a wiring 5605_1.

The shift register 5601 has the function of sequentially selecting the switching circuits 5602_1 to 5602_N by sequentially outputting H-level signals (also referred to as H signals or signals at a high power supply potential level) to wirings 5605_1 to 5605_N.

The switching circuit 5602_1 has the function of controlling conduction states between the wirings 5604_1 to 5604_$k$ and the signal lines S1 to Sk (electrical continuity between the first terminals and the second terminals), i.e., function of controlling whether potentials of the wirings 5604_1 to 5604_$k$ are supplied to the signal lines S1 to Sk. In this manner, the switching circuit 5602_1 functions as a selector. Moreover, the thin film transistors 5603_1 to 5603$k$ have the function of controlling conduction states between the wirings 5604_1 to 5604_$k$ and the signal lines S1 to Sk, respectively, i.e., function of supplying potentials of the wirings 5604_1 to

5604_k to the signal lines S1 to Sk, respectively. In this manner, each of the thin film transistors 5603_1 to 5603_k functions as a switch.

The video signal data (DATA) are input to each of the wirings 5604_1 to 5604_k. The video signal data (DATA) are often an analog signal that corresponds to an image signal or image data.

Next, the operation of the signal line drive circuit in FIG. 15A is described with reference to a timing chart in FIG. 15B. FIG. 15B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 5604_1 to 5604_k. Note that one operation period of the signal line drive circuit corresponds to one gate selection period in a display device. For example, one gate selection period is divided into periods T1 to TN. Each of the periods T1 to TN is a period for writing the video signal data (DATA) into a pixel in a selected row.

Note that signal waveform distortion and the like in each structure illustrated in drawings and the like in this embodiment are exaggerated for simplicity in some cases. Therefore, this embodiment is not necessarily limited to the scale illustrated in the drawings and the like.

In the periods T1 to TN, the shift register 5601 sequentially outputs H-level signals to the wirings 5605_1 to 5605_y. For example, in the period T1, the shift register 5601 outputs an H-level signal to the wiring 5605_1. Then, the thin film transistors 5603_1 to 5603_k are turned on, so that the wirings 5604_1 to 5604_k and the signal lines S1 to Sk are brought into conduction. At this time, Data(S1) to Data(Sk) are input to the wirings 5604_1 to 5604_k, respectively. The Data(S1) to Data(Sk) are written into pixels in a first to kth columns in the selected row through the thin film transistors 5603_1 to 5603_k, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when video signals are written into pixels by a plurality of columns; thus, insufficient writing of video signals can be prevented.

Note that any of the circuits constituted by the thin film transistors in any of Embodiments 1, 2, 5, and 6 can be used for the shift register 5601 and the switching circuit 5602. In that case, the shift register 5601 can be constituted by only n-channel transistors or only p-channel transistors.

One embodiment of a shift register which is used for part of the scan line drive circuit and/or the signal line drive circuit is described with reference to FIGS. 16A to 16D and FIGS. 17A and 17B.

The scan line drive circuit includes a shift register. Additionally, the scan line drive circuit may include a level shifter, a buffer, or the like in some cases. In the scan line drive circuit, a clock signal (CLK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to the scan line. Since the transistors in the pixels of one line have to be turned on at all once, a buffer that can supply a large current is used.

Figure 16A:
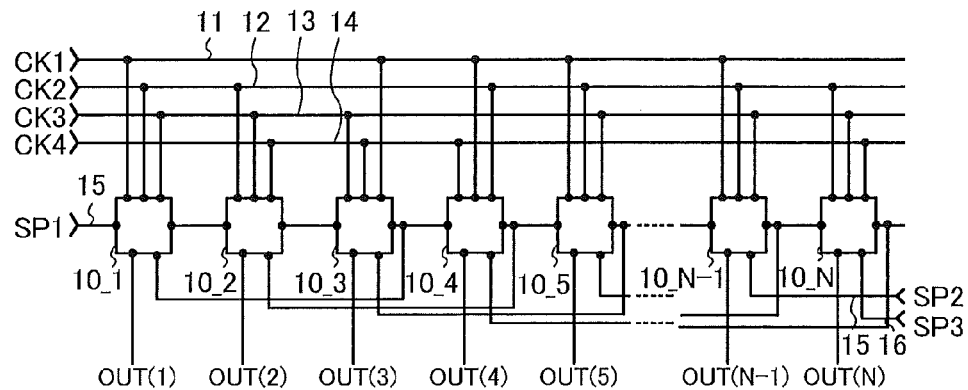
FIGS. 16A to 16D are circuit diagrams of a configuration of a shift register.

The shift register includes a first to Nth pulse output circuits 10_1 to 10_N (N is a natural number greater than or equal to 3) (see FIG. 16A). In the shift register illustrated in FIG. 16A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n of the second or subsequent stage (n is a natural number greater than or equal to 2 and less than or equal to N), a signal from the pulse output circuit of the preceding stage (such a signal is referred to as a preceding-stage signal OUT(n−1)(SR)) (n is a natural number greater than or equal to 2 and less than or equal to IV) is input. To the first pulse output circuit 10_1, a signal from the third pulse output circuit 10_3 of the stage following the next stage is input. Similarly, to the nth pulse output circuit 10_n of the second or subsequent stage, a signal from the (n+2)th pulse output circuit 10_(n+2) of the stage following the next stage (such a signal is referred to as a subsequent-stage signal OUT(n+2)(SR)) is input. Thus, the pulse output circuits of the respective stages output first output signals (OUT(1)(SR) to OUT(N)(SR)) to be input to the pulse output circuit of the subsequent stage and/or to the pulse output circuit of the stage before the preceding stage, and second output signals (OUT(1) to OUT(N)) to be input to another circuit or the like. Note that since the subsequent-stage signal OUT(n+2) is not input to the last two stages of the shift register as illustrated in FIG. 16A, a second start pulse SP2 and a third start pulse SP3 may be input to the pulse output circuits of the last two stages, for example.

Note that a clock signal (CK) is a signal that alternates between an H level and an L level (also referred to as an L signal or a signal at low power supply potential level) at regular intervals. Here, the first clock signal (CK1) to the fourth clock signal (CK4) are delayed by ¼ cycle sequentially. In this embodiment, driving or the like of the pulse output circuit is controlled with the first to fourth clock signals (CK1) to (CK4). Note that the clock signal is also referred to as GCK or SCK in some cases depending on a drive circuit to which the clock signal is input; the clock signal is referred to as CK in the following description.

A first input terminal 21, a second input terminal 22, and a third input terminal 23 are electrically connected to any of the first to fourth wirings 11 to 14. For example, in the first pulse output circuit 10_1 in FIG. 16A, the first input terminal 21 is electrically connected to the first wiring 11, the second input terminal 22 is electrically connected to the second wiring 12, and the third input terminal 23 is electrically connected to the third wiring 13. In the second pulse output circuit 10_2, the first input terminal 21 is electrically connected to the second wiring 12, the second input terminal 22 is electrically connected to the third wiring 13, and the third input terminal 23 is electrically connected to the fourth wiring 14.

Figure 16B:
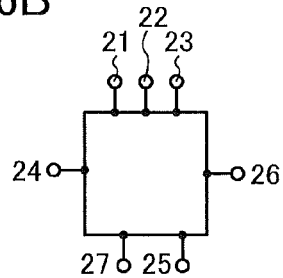

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 16B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1) (SR) is output from the first output terminal 26; and the second output signal OUT(1) is output from the second output terminal 27.

Figure 16C:
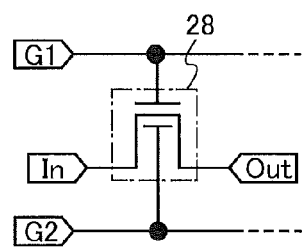

In the first to Nth pulse output circuits 10_1 to 10_N, the thin film transistor (TFT) having four terminals described in the above embodiment can be used in addition to a thin film transistor having three terminals. FIG. 16C illustrates the symbol of a thin film transistor 28 having four terminals which is described in the above embodiment. The symbol of the thin film transistor 28 illustrated in FIG. 16C represents the thin film transistor having four terminals which is described in any of Embodiments 1, 2, 5, and 6 and is used in the drawings and the like. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode. The thin film transistor 28 is an element which can control electric current between an IN terminal and an OUT terminal with a first control signal G1 which is input to a lower gate electrode and a second control signal G2 which is input to an upper gate electrode.

When an oxide semiconductor is used as a semiconductor layer including a channel formation region in a thin film transistor, the threshold voltage sometimes shifts in the positive or negative direction depending on a manufacturing process. For that reason, the thin film transistor in which an oxide semiconductor is used for a semiconductor layer including a channel formation region preferably has a structure with which the threshold voltage can be controlled. The threshold voltage of the thin film transistor 28 illustrated in FIG. 16C can be controlled to be at a desired level by providing gate electrodes above and below a channel formation region of the thin film transistor 28 with a gate insulating film interposed between the upper gate electrode and the channel formation region and between the lower gate electrode and the channel formation region, and by controlling a potential of the upper gate electrode and/or a potential of the lower gate electrode.

Next, an example of a specific circuit configuration of the pulse output circuit illustrated in FIG. 16B will be described with reference to FIG. 16D.

Figure 16D:
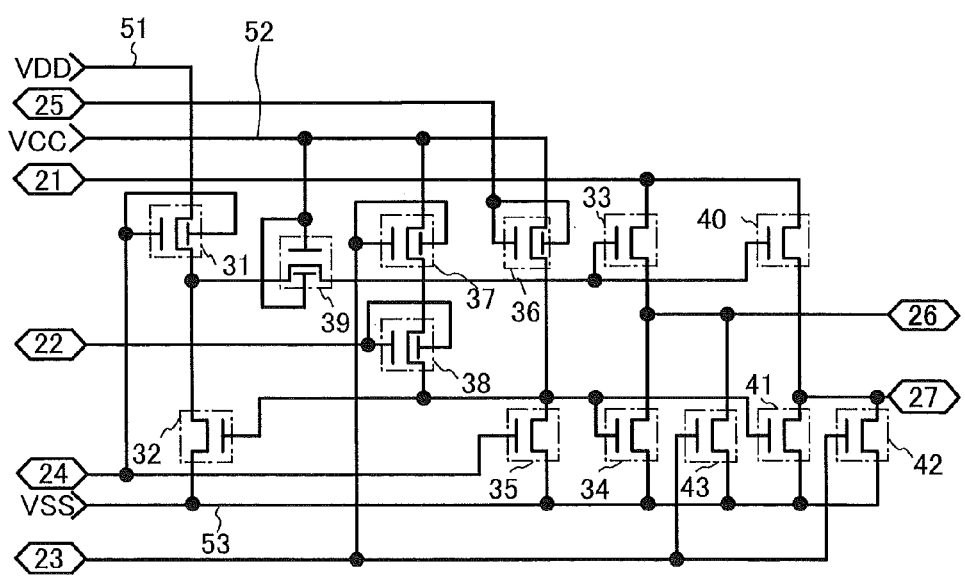

The pulse output circuit illustrated in FIG. 16D includes a first to thirteenth transistors 31 to 43 (see FIG. 16D). A signal or a power supply potential is supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied, in addition to the first to fifth input terminals 21 to 25, the first output terminal 26, and the second output terminal 27, which are described above. The relation of the power supply potentials of the power supply lines in FIG. 16D is as follows: the first power supply potential VDD is greater than or equal to the second power supply potential VCC, and the second power supply potential VCC is higher than the third power supply potential VSS. Note that the first to fourth clock signals (CK1) to (CK4) each alternate between an H level and an L level at regular intervals; the clock signal at the H level is VDD and the clock signal at the L level is VSS. By making the potential VDD of the power supply line 51 higher than the potential VCC of the power supply line 52, a potential applied to a gate electrode of a transistor can be lowered, a shift in threshold voltage of the transistor can be reduced, and deterioration of the transistor can be suppressed without an adverse effect on the operation of the transistor. Note that the thin film transistor 28 with four terminals is preferably used as the first transistor 31 and the sixth to ninth transistors 36 to 39 among the first to thirteenth transistors 31 to 43. The first transistor 31 and the sixth to ninth transistors 36 to 39 need to switch a potential of a node to which one electrode serving as a source or a drain is connected depending on a control signal of the gate electrode, and can reduce a malfunction of the pulse output circuit by quick response (sharp rising of on-current) to the control signal input to the gate electrode. By using the thin film transistor 28 with four terminals, the threshold voltage can be controlled, and a malfunction of the pulse output circuit can be further reduced.

In FIG. 16D, the first terminal of the first transistor 31 is electrically connected to the power supply line 51, a second terminal of the first transistor 31 is electrically connected to the first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 16D, a connection portion where the gate electrode of the third transistor 33, the gate electrode of the tenth transistor 40, and the second terminal of the ninth transistor 39 are connected is referred to as a node A. A connection portion where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B.

Figure 17A:
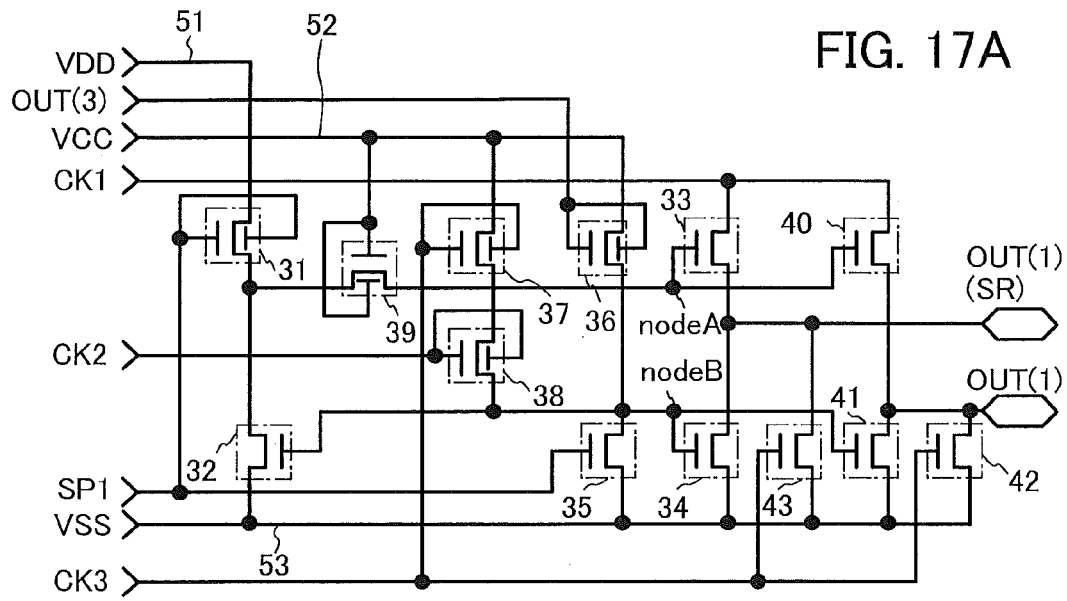
FIGS. 17A and 17B are respectively a diagram and a timing chart illustrating operation of a shift register.

FIG. 17A illustrates signals that are input to or output from the first to fifth input terminals 21 to 25 and the first and second output terminals 26 and 27 in the case where the pulse output circuit illustrated in FIG. 16D is applied to the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent-stage signal OUT(3) is input to the fifth input terminal 25; the first output signal OUT(1)(SR) is output from the first output terminal 26; and the second output signal OUT(1) is output from the second output terminal 27.

Note that a thin film transistor is an element having at least three terminals of a gate, a drain, and a source. The thin film transistor has a semiconductor including a channel region formed in a region overlapping with the gate. Current that flows between the drain and the source through the channel region can be controlled by controlling a potential of the gate. Here, since the source and the drain of the thin film transistor may interchange depending on the structure, the operating condition, and the like of the thin film transistor, it is difficult to define which is a source or a drain. Therefore, a region functioning as the source or the drain is not called the source or the drain in some cases. In that case, for example, such regions may be referred to as a first terminal and a second terminal.

Note that in FIG. 16D and FIG. 17A, a capacitor for performing bootstrap operation by bringing the node A into a floating state may be additionally provided. Furthermore, a capacitor having one electrode electrically connected to the node B may be additionally provided in order to hold a potential of the node B.

Figure 17B:
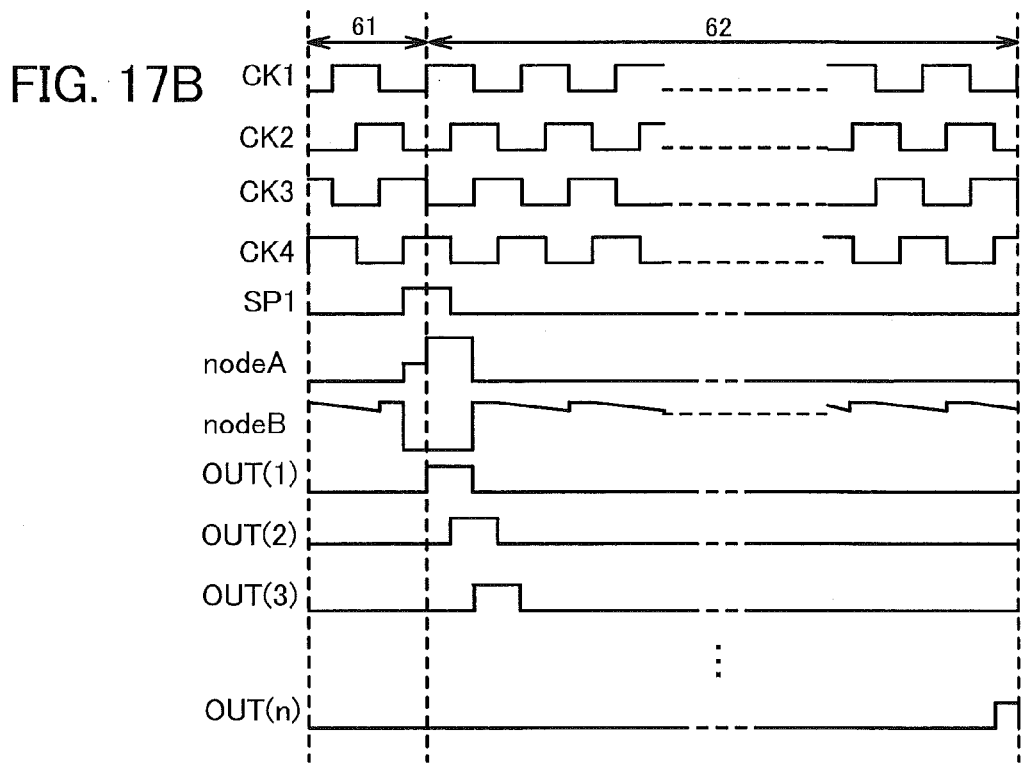

FIG. 17B is a timing chart of a shift register including a plurality of pulse output circuits illustrated in FIG. 17A. Note that when the shift register is included in a scan line drive circuit, a period 61 in FIG. 17B corresponds to a vertical retrace period and a period 62 corresponds to a gate selection period.

Note that by providing the ninth transistor 39 in which the second power supply potential VCC is applied to the gate as illustrated in FIG. 17A, the following advantages before and after bootstrap operation are obtained.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the first terminal of the first transistor 31, i.e., the terminal on the power supply line 51 side, comes to serve as a source of the first transistor 31. Consequently, in the first transistor 31, a high bias voltage is applied and thus significant stress is applied between the gate and the source and between the gate and the drain, which might cause deterioration of the transistor. On the other hand, with the ninth transistor 39 in which the second power supply potential VCC is applied to the gate electrode, an increase in potential of the second terminal of the first transistor 31 can be prevented while the potential of the node A is raised by bootstrap operation. That is, providing the ninth transistor 39 can lower the level of a negative bias voltage applied between the gate and the source of the first transistor 31. Thus, the circuit configuration in this embodiment can reduce a negative bias voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected between the second terminal of the first transistor 31 and the gate of the third transistor 33. Further, when the shift register including a plurality of pulse output circuits in this embodiment is included in a signal line drive circuit having a larger number of stages than a scan line drive circuit, the ninth transistor 39 can be omitted, which is advantageous in that the number of transistors is reduced.

Note also that an oxide semiconductor is used for semiconductor layers of the first to thirteenth transistors 31 to 43; thus, the off-current of the thin film transistors can be reduced, the on-current and field effect mobility can be increased, and the degree of deterioration of the transistors can be reduced. As a result, a malfunction in the circuit can be reduced. Moreover, the degree of deterioration of the transistor using an oxide semiconductor which is caused by application of a high potential to a gate electrode is smaller than that of deterioration of a transistor using amorphous silicon. Consequently, even when the first power supply potential VDD is supplied to the power supply line which supplies the second power supply potential VCC, the shift register can operate similarly and the number of power supply lines between circuits can be reduced; thus, the size of the circuit can be reduced.

Note that the shift register will achieve similar effect even when the connection relation is changed so that a clock signal which is supplied to the gate electrodes (the lower gate electrode and the upper gate electrode) of the seventh transistor 37 through the third input terminal 23 is a clock signal which is supplied to the gate electrodes (the lower gate electrode and the upper electrode) of the seventh transistor 37 through the second input terminal 22, and that a clock signal which is supplied to the gate electrodes (the lower gate electrode and the upper gate electrode) of the eighth transistor 38 through the second input terminal 22 is a clock signal which is supplied to the gate electrodes (the lower electrode and the upper electrode) of the eighth transistor 38 through the third input terminal 23. In the shift register illustrated in FIG. 17A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, a fall in potential of the node B, which is caused by a fall in potentials of the second input terminal 22 and the third input terminal 23, is caused twice by a fall in potential of the gate electrode of the seventh transistor 37 and a fall in potential of the gate electrode of the eighth transistor 38. On the other hand, in the case where a state of the seventh transistor 37 and the eighth transistor 38 in the shift register illustrated in FIG. 17A is changed as in the period 61 in FIG. 17B so that both the seventh transistor 37 and the eighth transistor 38 are on, then the seventh transistor 37 is on and the eighth transistor 38 is off, and then the seventh transistor 37 and the eighth transistor 38 are off; the fall in potential of the node B, which is caused by the fall in potentials of the second input terminal 22 and the third input terminal 23, is caused only once by the fall in potential of the gate electrode of the eighth transistor 38. Consequently, it is preferable to use the clock signal supplied to the gate electrodes (the lower gate electrode and the upper gate electrode) of the seventh transistor 37 from the third input terminal 23 and the clock signal supplied to the gate electrodes (the lower gate electrode and the upper gate electrode) of the eighth transistor 38 from the second input terminal 22 in order to reduce fluctuation in potential of the node B and thus to reduce noise.

In such a manner, an H-level signal is regularly supplied to the node B in a period during which the potentials of the first output terminal 26 and the second output terminal 27 are held at an L level; thus, a malfunction of the pulse output circuit can be suppressed.

Embodiment 9

By fabricating thin film transistors and using the thin film transistors for a pixel portion and for a driver circuit, a semiconductor device having a display function (also referred to as a display device) can be manufactured. Moreover, some or all of the drive circuits which include the thin film transistors, can be formed over the same substrate as the pixel portion, whereby a system-on-panel can be obtained.

The display device includes a display element. As a display element, a liquid crystal element (also referred to as a liquid crystal display element) or a light-emitting element (also referred to as a light-emitting display element) can be used. The light-emitting element includes in its category an element whose luminance is controlled by current or voltage, and specifically includes in its category an inorganic electroluminescent (EL) element, an organic EL element, and the like. Furthermore, the display device may include a display medium whose contrast is changed by an electric effect, such as electronic ink.

In addition, the display device includes a panel in which the display element is sealed, and a module in which an IC and the like including a controller are mounted on the panel. Furthermore, an element substrate, which is one embodiment before the display element is completed in a manufacturing process of the display device, is provided with a means for supplying current to the display element in each of a plurality of pixels. Specifically, the element substrate may be in a state in which only a pixel electrode of the display element is formed, a state in which a conductive film to be a pixel electrode is formed but is not etched yet to form the pixel electrode, or any other states.

Note that a display device in this specification refers to an image display device or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module having an integrated circuit (IC) that is directly mounted on a display element by a chip on glass (COG) method.

The appearance and a cross section of a liquid crystal display panel, which is one embodiment of a semiconductor device, will be described with reference to FIGS. 10A1, 10A2, and 10B. FIGS. 10A1 and 10A2 are plan views of panels in which thin film transistors 4010 and 4011 and a liquid crystal element 4013 are sealed between a first substrate 4001 and a second substrate 4006 with a sealant 4005. FIG. 10B is a cross-sectional view along line M-N in FIGS. 10A1 and 10A2.

The sealant 4005 is provided so as to surround a pixel portion 4002 and a scan line drive circuit 4004 which are provided over the first substrate 4001. The second substrate 4006 is provided over the pixel portion 4002 and the scan line drive circuit 4004. Consequently, the pixel portion 4002 and the scan line drive circuit 4004 are sealed together with a liquid crystal layer 4008, by the first substrate 4001, the sealant 4005, and the second substrate 4006. A signal line drive circuit 4003 which is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the drive circuit which is separately formed, and a COG (Chip On Glass) method, a wire bonding method, a TAB (Tape Automated Bonding) method, or the like can be used. FIG. 10A1 illustrates an example in which the signal line drive circuit 4003 is mounted by a COG method. FIG. 10A2 illustrates an example in which the signal line drive circuit 4003 is mounted by a TAB method.

The pixel portion 4002 and the scan line drive circuit 4004 provided over the first substrate 4001 include a plurality of thin film transistors. FIG. 10B illustrates the thin film transistor 4010 included in the pixel portion 4002 and the thin film transistor 4011 included in the scan line drive circuit 4004, as an example. Insulating layers 4041a, 4041b, 4042a, 4042b, 4020, and 4021 are provided over the thin film transistors 4010 and 4011.

Any of the highly reliable thin film transistors including the oxide semiconductor layers which are described in Embodiments 1, 2, 5, and 6 can be used as the thin film transistors 4010 and 4011. The thin film transistors 260 and 270 described in Embodiments 1, 2, 5, and 6 can be used as the thin film transistor 4011 for the drive circuit, and the thin film transistors 420, 448, 220, 280, and 290 can be used as the thin film transistor 4010 for a pixel. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011 for the drive circuit. The conductive layer 4040 is provided at the position overlapping with the channel formation region of the oxide semiconductor layer, whereby the amount of change in threshold voltage of the thin film transistor 4011 before and after the BT (Bias Temperature stress) test can be reduced. A potential of the conductive layer 4040 may be the same or different from that of a gate electrode layer of the thin film transistor 4011. The conductive layer 4040 can also function as a second gate electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are respectively provided with an insulating layer 4032 and an insulating layer 4033 functioning as alignment films, and the liquid crystal layer 4008 is sandwiched between the pixel electrode layer 4030 and the counter electrode layer 4031 with the insulating layers 4032 and 4033 therebetween.

Note that a light-transmitting substrate can be used as the first substrate 4001 and the second substrate 4006; glass, ceramics, or plastics can be used. Examples of plastics that can be used include a fiberglass-reinforced plastics (FRP) plate, a polyvinyl fluoride (PVF) film, a polyester film, or an acrylic resin film.

A spacer 4035 is a columnar spacer obtained by selective etching of an insulating film and provided in order to control the distance (a cell gap) between the pixel electrode layer 4030 and the counter electrode layer 4031. Alternatively, a spherical spacer may be used. The counter electrode layer 4031 is electrically connected to a common potential line formed over the same substrate as the thin film transistor 4010. The counter electrode layer 4031 and the common potential line can be electrically connected to each other through conductive particles arranged between a pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is only generated within a narrow range of temperature, a liquid crystal composition including a chiral agent at 5 wt % or more is used for the liquid crystal layer 4008 in order to improve the temperature range. The liquid crystal composition that includes liquid crystal exhibiting a blue phase and a chiral agent has a short response time of 1 msec or less and is optically isotropic; therefore, alignment treatment is not necessary and viewing angle dependence is small.

Note that this embodiment can also be applied to a transflective liquid crystal display device in addition to a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The stacked-layer structure of the polarizing plate and the coloring layer is not limited to that in this embodiment and may be set as appropriate depending on materials of the polarizing plate and the coloring layer or conditions of the manufacturing process. Further, a light-blocking film serving as a black matrix may be provided in a portion other than the display portion.

In the thin film transistor 4011, the insulating layer 4041a serving as a channel protective layer and the insulating layer 4041b covering a peripheral portion (including a side surface) of the oxide semiconductor layer are formed. In a similar manner, in the thin film transistor 4010, the insulating layer 4042a serving as a channel protective layer and the insulating layer 4042b covering a peripheral portion (including a side surface) of the oxide semiconductor layer are formed.

The insulating layers 4041b and 4042b which cover the peripheral portion (including the side surfaces) of the oxide semiconductor layer increases the distance between the gate electrode layer and a wiring layer (e.g., a source wiring layer or a capacitor wiring layer) over or in the periphery of the gate electrode layer, whereby parasitic capacitance can be reduced. The insulating layers 4041a, 4041b, 4042a, and 4042b may be formed using the same material and method as the oxide insulating layers 426a and 426b described in Embodiment 1. In addition, in order to reduce the surface roughness generated by the thin film transistors, the thin film transistors are covered with the insulating layer 4021 serving as a planarizing insulating film. Here, as the insulating layers 4041a, 4041b, 4042a, and 4042b, a silicon oxide film is formed by a sputtering method according to Embodiment 1.

The insulating layer 4020 is formed over the insulating layers 4041a, 4101b, 4042a, and 4042b. The insulating layer 4020 can be formed using the same material and method as the stack of the insulating layer 428 and the protective insulating layer 403 described in Embodiment 1. The insulating layer 4020 is illustrated as a single layer in FIG. 10B, but is the stack of the insulating layer 428 and the protective insulating layer 403 which are formed using different materials. Here, as the insulating layer 4020, a silicon oxide film formed by a sputtering method and a silicon nitride film formed by a plasma CVD method are stacked.

The insulating layer 4021 is formed as the planarizing insulating film. The insulating layer 4021 can be formed using the same material and method as the planarizing insulating layer 404 described in Embodiment 1, and a heat-resistant organic material such as polyimide, acrylic resin, benzocyclobutene-based resin, polyamide, or epoxy resin can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed from these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. The organic group may include a fluoro group.

There is no particular limitation on the method of forming the insulating layer 4021. Depending on the material, the insulating layer 4021 can be formed by a method such as sputtering method, an SOG method, a spin coating method, a dipping method, a spray coating method, or a droplet discharge method (e.g., an inkjet method, screen printing, or offset printing), or by using a tool (apparatus) such as a doctor knife, a roll coater, a curtain coater, a knife coater, or the like. When the baking step of the insulating layer 4021 and the annealing of the semiconductor layer are combined, a semiconductor device can be manufactured efficiently.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added.

Alternatively, a conductive composition including a conductive high molecular weight molecule (also referred to as a conductive polymer) can be used for the pixel electrode layer 4030 and the counter electrode layer 4031. The pixel electrode formed using a conductive composition preferably has a sheet resistance of 10000 Ω/square or less and a light transmittance of 70% or more at a wavelength of 550 nm. Further, the resistivity of the conductive high molecule included in the conductive composition is preferably 0.1 Ω·cm or less.

As the conductive high molecule, a so-called π-electron conjugated conductive polymer can be used. Examples are polyaniline and a derivative thereof, polypyrrole and a derivative thereof, polythiophene and a derivative thereof, and a copolymer of two or more of these materials.

Further, a variety of signals and potentials are supplied to the signal line drive circuit 4003 which is separately formed, the scan line drive circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 10A1, 10A2, and 10B illustrate the example in which the signal line drive circuit 4003 is formed separately and mounted on the first substrate 4001; however, this embodiment is not limited to this structure. The scan line drive circuit may be separately formed and then mounted, or only part of the signal line drive circuit or part of the scan line drive circuit may be separately formed and then mounted.

Figure 19:
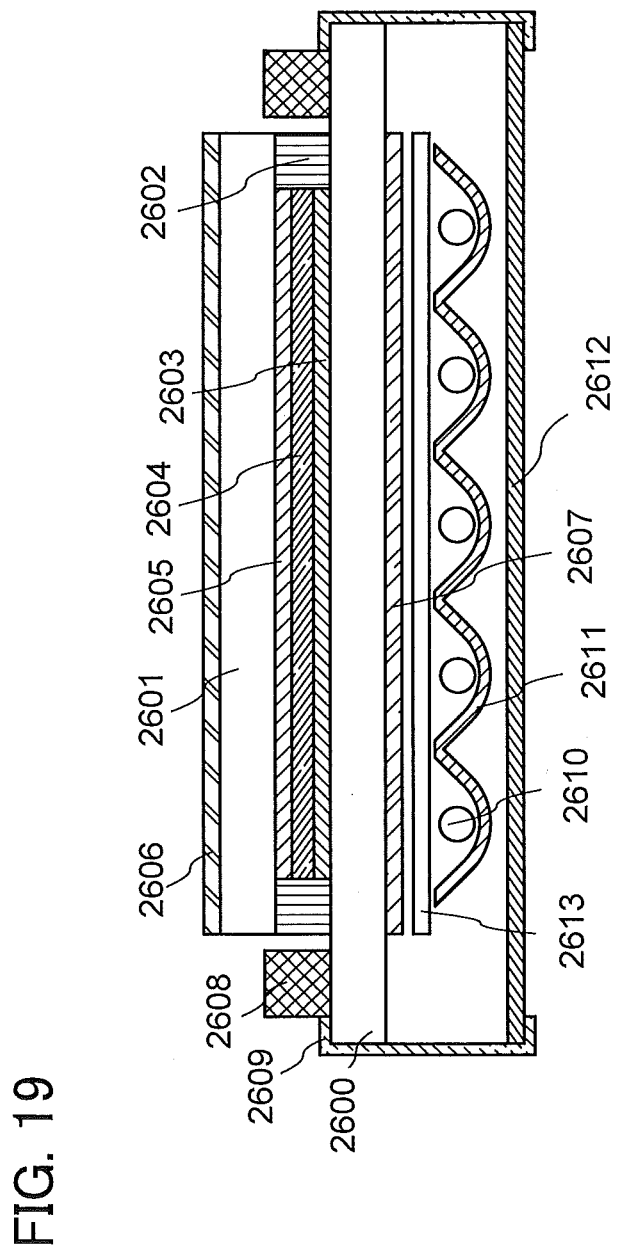
FIG. 19 illustrates a semiconductor device.

FIG. 19 illustrates an example of a liquid crystal display module which is formed as a semiconductor device using a TFT substrate 2600 manufactured according to the manufacturing method disclosed in this specification.

FIG. 19 illustrates an example of the liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be employed.

Through the above, a highly reliable liquid crystal display panel as a semiconductor device can be manufactured.

This embodiment can be implemented in appropriate combination with the structures described in the other embodiments.

Embodiment 10

An example of an electronic paper will be described as an example of a semiconductor device.

The semiconductor device can be used for an electronic paper in which electronic ink is driven by an element electrically connected to a switching element. The electronic paper is also called an electrophoretic display device (an electrophoretic display) and has advantages in that it has the same level of readability as plain paper, it has less power consumption than other display devices, and it can be made thin and lightweight.

There are a variety of modes of electrophoretic displays. The electrophoretic display includes a plurality of microcapsules dispersed in a solvent or a solute; each microcapsule containing first particles which are positively charged and second particles which are negatively charged. When electric field is applied to the microcapsules, the particles in the microcapsules move in opposite directions to each other and only the color of the particles gathered on one side is displayed. Note that the first particles or the second particles include a pigment, and do not move without an electric field. The first particles and the second particles have different colors (which may be colorless).

Thus, the electrophoretic display utilizes a so-called dielectrophoretic effect; in which a substance with high dielectric constant moves to a region with a high electric field.

A solution in which the above microcapsules are dispersed in a solvent is referred to as electronic ink. Electronic ink can be printed on a surface of glass, plastic, fabric, paper, or the like. Furthermore, by use of a color filter or particles that have a pigment, color display can also be achieved.

In addition, if a plurality of the above microcapsules are arranged as appropriate over an active matrix substrate so as to be interposed between two electrodes, an active matrix display device can be completed. Images can be displayed by application of an electric field to the microcapsules. For example, the active matrix substrate obtained using the thin film transistors described in Embodiments 1, 2, 5, and 6 can be used.

Note that the first particles and the second particles in the microcapsules may be formed from any one of a conductive material, an insulating material, a semiconductor material, a magnetic material, a liquid crystal material, a ferroelectric material, an electroluminescent material, an electrochromic material, and a magnetophoretic material, or formed from a composite material thereof.

Figure 18:
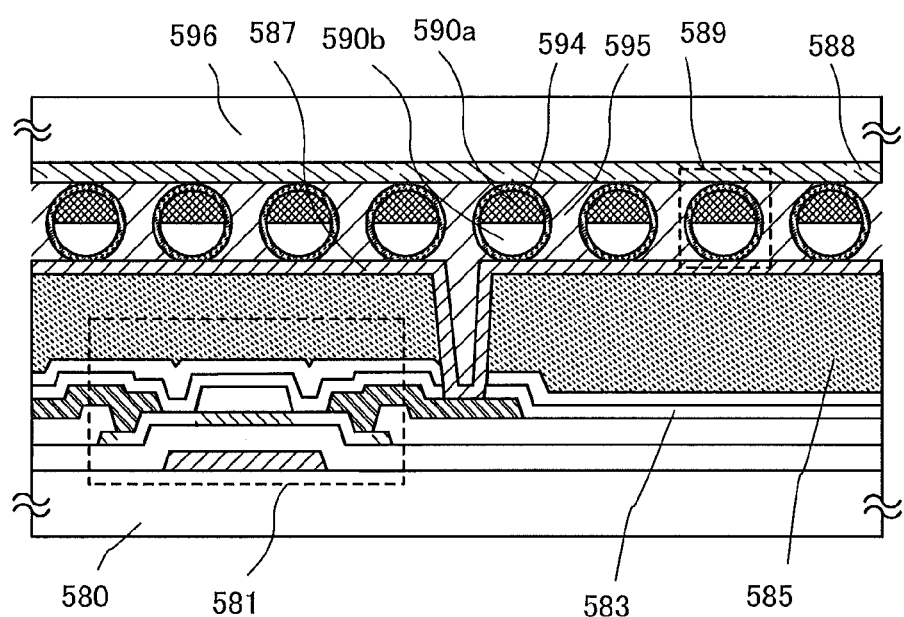
FIG. 18 illustrates a semiconductor device.

FIG. 18 illustrates an active matrix electronic paper as an example of a semiconductor device. A thin film transistor 581 used for the semiconductor device can be manufactured in a manner similar to that of the thin film transistor described in Embodiment 1 and is a highly reliable thin film transistor including an oxide semiconductor layer. The thin film transistor described in any of Embodiments 2, 5 and 6 can also be used as the thin film transistor 581 in this embodiment.

The electronic paper of FIG. 18 is an example of a display device in which a twisting ball display system is employed. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 is a bottom-gate thin film transistor and is covered with an insulating film 583 which is in contact with a semiconductor layer. A source electrode layer or a drain electrode layer of the thin film transistor 581 is in contact with a first electrode layer 587 through an opening formed in an insulating layer 585, whereby the thin film transistor 581 is electrically connected to the first electrode layer 587. Between the first electrode layer 587 and a second electrode layer 588 formed on a substrate 596, spherical particles 589 each having a black region 590a, a white region 590b, and a cavity 594 around the regions which is filled with liquid are provided. Space around the spherical particles 589 is filled with a filler 595 such as a resin. The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between the pair of substrates.

Instead of the twisting ball, an electrophoretic element can be used. A microcapsule having a diameter of about 10 mm to 200 mm in which transparent liquid, positively-charged white microparticles, and negatively-charged black microparticles are encapsulated, is used. In the microcapsules which are provided between the first electrode layer and the second electrode layer, when an electric field is applied by the first electrode layer and the second electrode layer, the white microparticles and the black microparticles move to opposite sides from each other, so that white or black can be displayed. A display element using this principle is an electrophoretic display element and is generally called an electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained Accordingly, a displayed image can be stored even if a semiconductor device having a display function (which may be referred to simply as a display device or a semiconductor device provided with a display device) is distanced from an electric wave source.

Through the above, a highly reliable electronic paper as a semiconductor device can be manufactured.

This embodiment can be implemented in appropriate combination with the structures described in the other embodiments.

Embodiment 11

An example of a light-emitting display device will be described as a semiconductor device. As a display element of the display device, a light-emitting element utilizing electroluminescence is described here. Light-emitting elements utilizing electroluminescence are classified according to whether a light-emitting material is an organic compound or an inorganic compound. In general, the former is referred to as an organic EL element and the latter is referred to as an inorganic EL element.

In an organic EL element, by application of voltage to a light-emitting element, electrons and holes are separately injected from a pair of electrodes into a layer containing a light-emitting organic compound, and current flows. Then, those carriers (i.e., electrons and holes) are recombined, and thus, the light-emitting organic compound is excited. When the light-emitting organic compound relaxes to the ground state from the excited state, light is emitted. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

Figure 12:
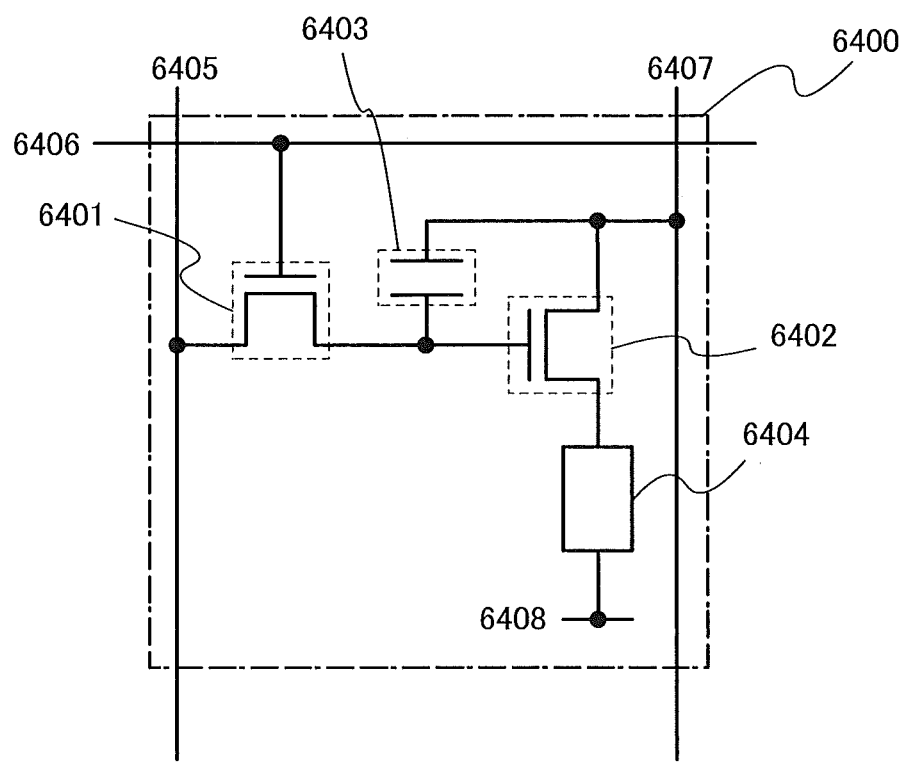
FIG. 12 illustrates a pixel equivalent circuit of a semiconductor device.

FIG. 12 illustrates an example of a pixel structure as an example of a semiconductor device which can be driven by a digital time grayscale method.

The structure and operation of a pixel which can be driven by a digital time grayscale method will be described. In this example, one pixel includes two n-channel transistors using an oxide semiconductor layer in a channel formation region.

A pixel 6400 includes a switching transistor 6401, a light-emitting element driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the light-emitting element driving transistor 6402. The gate of the light-emitting element driving transistor 6402 is connected to a power supply line 6407 through the capacitor 6403, a first electrode of the driving transistor 6402 is connected to the power supply line 6407, and a second electrode of the light-emitting element driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

Note that the second electrode (the common electrode 6408) of the light-emitting element 6404 is set to a low power supply potential. Note that the low power supply potential is a potential less than a high power supply potential which is supplied to the power supply line 6407. For example, GND or 0 V may be set as the low power supply potential. The difference between the high power supply potential and the low power supply potential is applied to the light-emitting element 6404 so that current flows through the light-emitting element 6404, whereby the light-emitting element 6404 emits light. Thus, each potential is set so that the difference between the high power supply potential and the low power supply potential is greater than or equal to a forward threshold voltage of the light-emitting element 6404.

When the gate capacitance of the light-emitting element driving transistor 6402 is used as a substitute for the capacitor 6403, the capacitor 6403 can be omitted. The gate capacitance of the light-emitting element driving transistor 6402 may be formed between a channel region and a gate electrode.

Here, in the case of employing a voltage-input voltage driving method, a video signal is input to the gate of the light-emitting element driving transistor 6402 to make the light-emitting element driving transistor 6402 completely turn on or off. I.e., the light-emitting element driving transistor 6402 operates in a linear region, and thus, a voltage higher than the voltage of the power supply line 6407 is applied to the gate of the light-emitting element driving transistor 6402. Note that a voltage greater than or equal to (power supply line voltage+$V_{th}$ of the light-emitting element driving transistor 6402) is applied to the signal line 6405.

In the case of employing an analog grayscale method instead of the digital time grayscale method, the same pixel structure as in FIG. 12 can be employed by inputting signals in a different way.

In the case of employing the analog grayscale method, a voltage greater than or equal to (forward voltage of the light-emitting element 6404+$V_{th}$ of the light-emitting element driving transistor 6402) is applied to the gate of the light-emitting element driving transistor 6402. The forward voltage of the light-emitting element 6404 refers to a voltage to obtain a desired luminance, and includes at least a forward threshold voltage. By inputting a video signal to enable the light-emitting element driving transistor 6402 to operate in a saturation region, current can be supplied to the light-emitting element 6404. In order that the light-emitting element driving transistor 6402 can operate in the saturation region, the potential of the power supply line 6407 is set higher than a gate potential of the light-emitting element driving transistor 6402. Since the video signal is an analog signal, current in accordance with the video signal flows in the light-emitting element 6404, and analog grayscale can be performed.

Note that the pixel structure is not limited to that illustrated in FIG. 12. For example, the pixel in FIG. 12 can further include a switch, a resistor, a capacitor, a transistor, a logic circuit, or the like.

Next, structures of the light-emitting element will be described with reference to FIGS. 13A to 13C. Here, a cross-sectional structure of a pixel will be described by taking an n-channel TFT as an example. TFTs 7001, 7011, and 7021 which are TFTs used for semiconductor devices illustrated in FIGS. 13A to 13C can be manufactured in a manner similar to that of the thin film transistor described in Embodiment 1. The TFTs 7001, 7011, and 7021 are highly reliable thin film transistors each including an oxide semiconductor layer. Alternatively, the thin film transistor described in any of Embodiments 2, 5, and 6 can be employed as the driving TFTs 7001, 7011, and 7021.

In order to extract light emitted from the light-emitting element, at least one of an anode and a cathode should be transparent. There are following structures of a light-emitting element which is formed over the same substrate as a thin film transistor: a top-emission structure in which light is extracted through the surface opposite to the substrate, a bottom-emission structure in which light is extracted through the surface of the substrate, and a dual-emission structure in which light is extracted through the surface opposite to the substrate and the surface of the substrate. The pixel structure can be applied to a light-emitting element having any of these emission structures.

A light-emitting element having a top-emission structure will be described with reference to FIG. 13A.

Figure 13A:
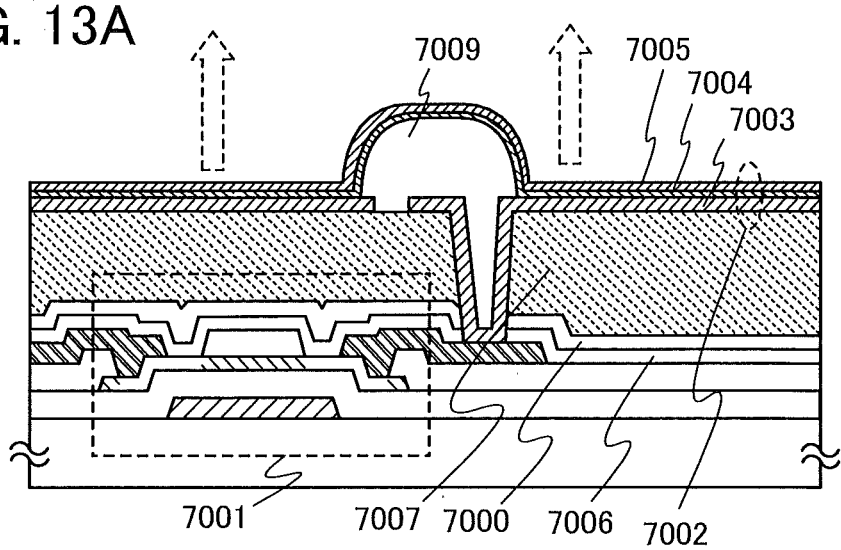
FIGS. 13A to 13C each illustrate a semiconductor device.

FIG. 13A is a cross-sectional view of a pixel in the case where the TFT 7001 is of an n-type and light is emitted from a light-emitting element 7002 through an anode 7005. In FIG. 13A, a cathode 7003 of the light-emitting element 7002 is electrically connected to the TFT 7001 via a contact hole made through a planarizing insulating layer 7007, a protective insulating layer 7000 and a insulating layer 7006, a partition wall 7009 is formed over the contact hole, and a light-emitting layer 7004 and the anode 7005 are stacked in this order over the cathode 7003. The cathode 7003 can be formed using any of conductive materials which have a low work function and which reflects light. For example, Ca, Al, CaF, Mg, Ag, AlLi, or the like is preferably used. The light-emitting layer 7004 may be formed as a single layer or a stack of plural layers. When the light-emitting layer 7004 is formed as a stack of plural layers, the light-emitting layer 7004 is formed by stacking an electron-injection layer, an electron-transport layer, a light-emitting layer, a hole-transport layer, and a hole-injection layer in this order over the cathode 7003. Note that not all of these layers need to be provided. The anode 7005 is formed of a light-transmitting conductive material. For example, the anode 7005 may be formed using a light-transmitting conductive film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the pixel illustrated in FIG. 13A, light is emitted from the light-emitting element 7002 to the anode 7005 side as indicated by an arrow.

Next, a light-emitting element having a bottom-emission structure will be described with reference to FIG. 13B. FIG. 13B is a cross-sectional view of a pixel in the case where the TFT 7011 for driving the light-emitting element is of an n-type and light is emitted from a light-emitting element 7012 through a cathode 7013. In FIG. 13B, the cathode 7013 of the light-emitting element 7012 is formed over a light-transmitting conductive film 7017 which is electrically connected to the TFT 7011 for driving the light-emitting element, and a light-emitting layer 7014 and an anode 7015 are stacked in this order over the cathode 7013. Note that a blocking film 7016 for reflecting or blocking light may be formed so as to cover the anode 7015 when the anode 7015 has a light-transmitting property. For the cathode 7013, any of conductive materials which have a low work function can be used as in the case of FIG. 13A. Note that the cathode 7013 is formed to a thickness with which the cathode 7013 transmits light (preferably, approximately 5 nm to 30 nm). For example, an aluminum film having a thickness of 20 nm can be used as the cathode 7013. Similarly to the case of FIG. 13A, the light-emitting layer 7014 may be formed using either a single layer or a stack of plural layers. The anode 7015 is not required to transmit light, but can be formed of a light-transmitting conductive material as in the case of FIG. 13A. As the blocking film 7016, a metal film which reflects light can be used for example; however, it is not limited to a metal film. For example, a resin to which a black pigment is added can also be used.

The light-emitting element 7014 corresponds to a region where the light-emitting layer 7014 is sandwiched between the cathode 7013 and the anode 7015. In the pixel illustrated in FIG. 13B, light is emitted from the light-emitting element 7012 to the cathode 7013 side as indicated by an arrow. Note that FIG. 13B illustrates an example in which a light-transmitting conductive film is used as the gate electrode layer, so that light is emitted from the light-emitting element 7012 through the gate electrode layer.

Next, a light-emitting element having a dual-emission structure will be described with reference to FIG. 13C. In FIG. 13C, the cathode 7023 of the light-emitting element 7022 is formed over a light-transmitting conductive film 7027 which is electrically connected to the TFT 7021 for driving the light-emitting element, and a light-emitting layer 7024 and an anode 7025 are stacked in this order over the cathode 7023. For the cathode 7023, any of conductive materials which have a low work function can be used as in the case of FIG. 13A. Note that the cathode 7023 is formed to a thickness with which the cathode 7023 transmits light. For example, a 20-nm-thick Al film can be used as the cathode 7023. Similarly to the case of FIG. 13A, the light-emitting layer 7024 may be formed using either a single layer or a stack of plural layers. The anode 7025 can be framed of a light-transmitting conductive material as in the case of FIG. 13A.

The light-emitting element 7022 corresponds to a region where the anode 7025, the light-emitting layer 7024 and the cathode 7023 overlap with each other. In the pixel illustrated in FIG. 13C, light is emitted from the light-emitting element 7022 to both the anode 7025 side and the cathode 7023 side as indicated by an arrow.

Although an organic EL element is described here as a light-emitting element, an inorganic EL element can alternatively be provided as a light-emitting element.

Although the example in which a thin film transistor (a TFT for driving a light-emitting element) which controls the driving of a light-emitting element is electrically connected to the light-emitting element has been described, a structure may be employed in which a TFT for current control is connected between the TFT and the light-emitting element.

Figure 13B:
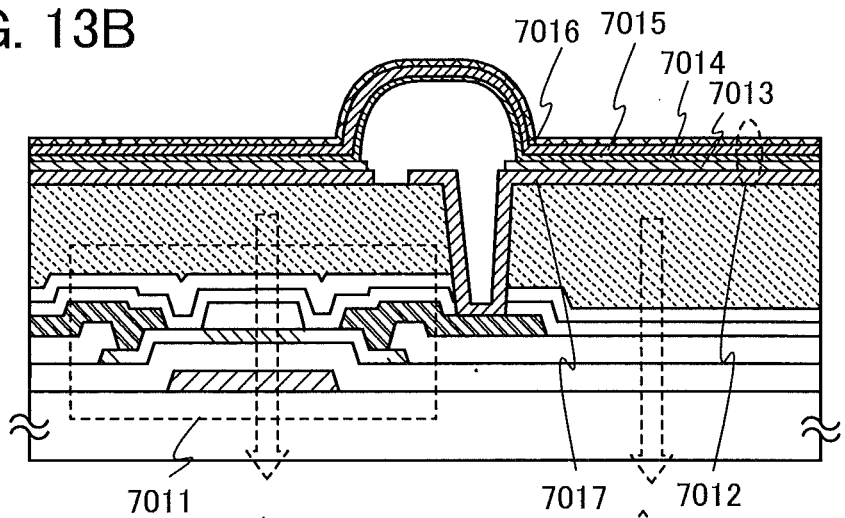
Figure 13C:
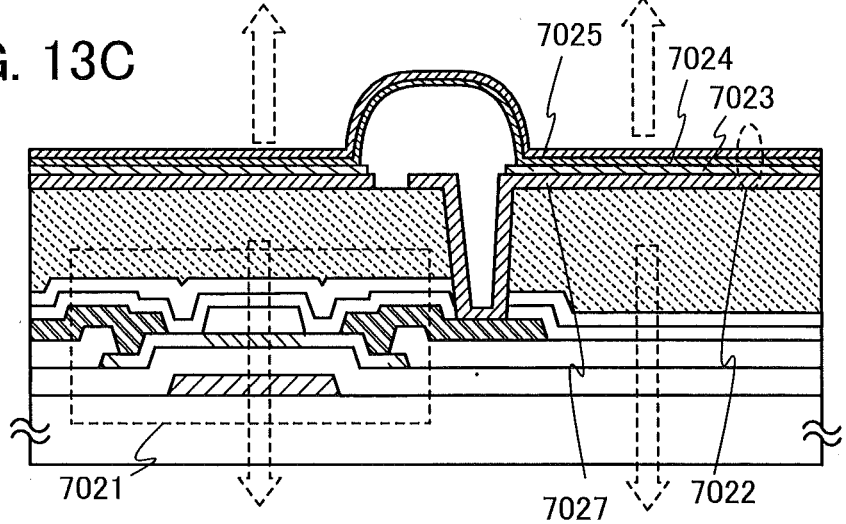

Note that the structure of the semiconductor device is not limited to those illustrated in FIGS. 13A to 13C and can be modified in various ways based on the spirit of techniques according to the present invention.

Figure 11A:
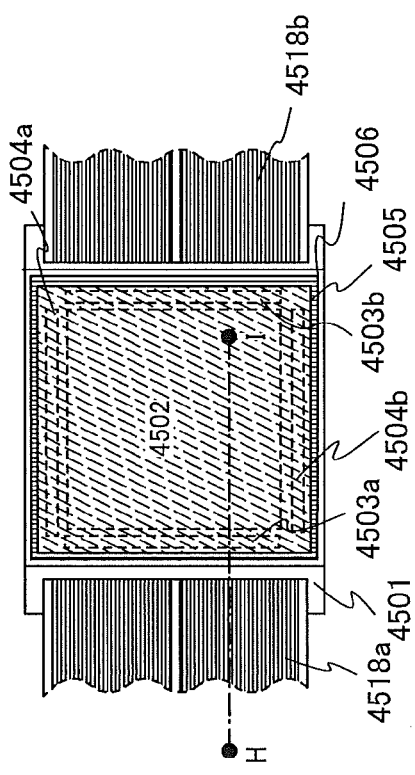
FIGS. 11A and 11B each illustrate a semiconductor device.
Figure 11B:
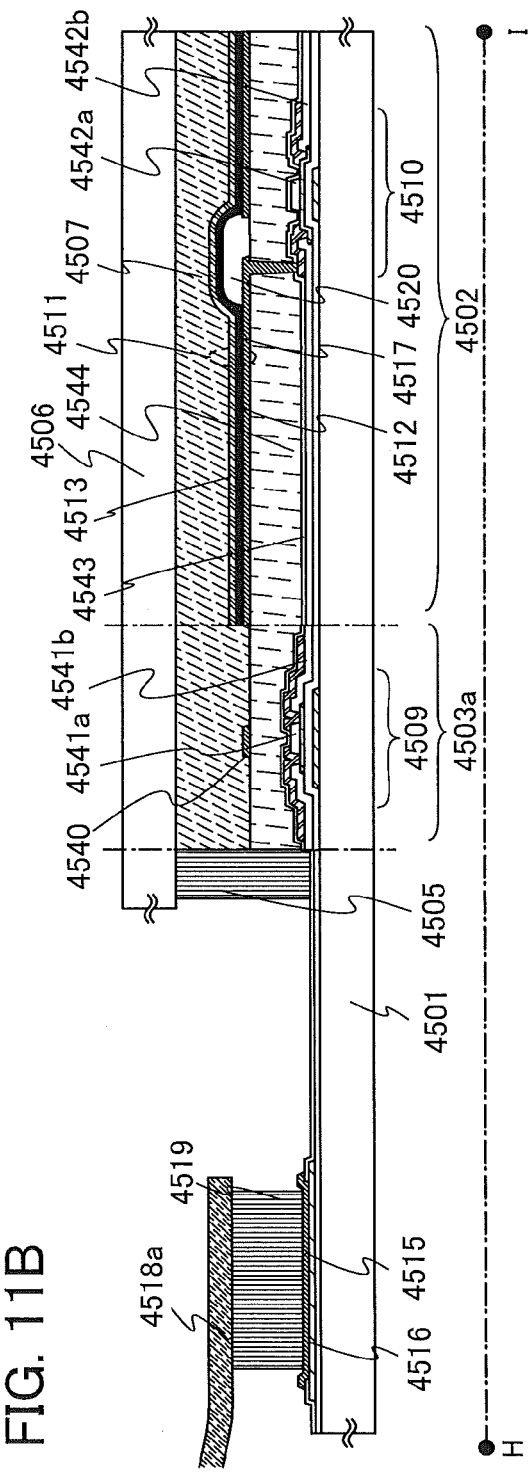

Next, an appearance and a cross section of a light-emitting display panel (also referred to as a light-emitting panel), which is one embodiment of the semiconductor device, will be described with reference to FIGS. 11A and 11B. FIG. 11A is a plan view of a panel in which a thin film transistor and a light-emitting element are sealed between a first substrate and a second substrate with a sealant FIG. 11B is a cross-sectional view taken along line H-I of FIG. 11A.

A sealant 4505 is provided so as to surround a pixel portion 4502, signal line drive circuits 4503a and 4503b, and scan line drive circuits 4504a and 4504b, which are provided over a first substrate 4501. In addition, a second substrate 4506 is provided over the pixel portion 4502, the signal line drive circuits 4503a and 4503b, and the scan line drive circuits 4504a and 4504b. Accordingly, the pixel portion 4502, the signal line drive circuits 4503a and 4503b, and the scan line drive circuits 4504a and 4504b are sealed together with a filler 4507, by the first substrate 4501, the sealant 4505, and the second substrate 4506. It is preferable that a panel be thus packaged (sealed) with a protective film (such as a bonding film or an ultraviolet curable resin film) or a cover material with high air-tightness and little degasification so that the panel is not exposed to the outside air.

The pixel portion 4502, the signal line drive circuits 4503a and 4503b, and the scan line drive circuits 4504a and 4504b which are formed over the first substrate 4501 each include a plurality of thin film transistors. A thin film transistor 4510 included in the pixel portion 4502 and a thin film transistor 4509 included in the signal line drive circuit 4503a are illustrated as an example in FIG. 11B.

As the thin film transistors 4509 and 4510, the highly reliable thin film transistor including an oxide semiconductor layer which is described in any of Embodiments 1, 2, 5, and 6 can be employed. The thin film transistors 4509 and 4510 are n-channel thin film transistors. The thin film transistors 260 and 270 described in Embodiments 1, 2, 5, and 6 can be used as the thin film transistor 4509 for the drive circuit, and the thin film transistors 420, 448, 220, 280, and 290 can be used as the thin film transistor 4510 for a pixel. In this embodiment, the thin film transistors 4509 and 4510 are n-channel thin film transistors.

A conductive layer 4540 is provided over part of the insulating layer 4544, which overlaps with a channel formation region of an oxide semiconductor layer in the thin film transistor 4509 for the drive circuit. The conductive layer 4540 is provided at the position overlapping with the channel formation region of the oxide semiconductor layer, whereby the variation in threshold voltage of the thin film transistor 4509 before and after the BT test can be reduced. A potential of the conductive layer 4540 may be the same or different from that of a gate electrode layer of the thin film transistor 4509. The conductive layer 4540 can also function as a second gate electrode layer. Alternatively, the potential of the conductive layer 4540 may be GND or 0 V, or the conductive layer 4540 may be in a floating state.

In the thin film transistor 4509, the insulating layer 4541a serving as a channel protective layer and the insulating layer 4541b which covers a peripheral portion (and the side surface) of the oxide semiconductor layer are formed. In a similar manner, in the thin film transistor 4510, the insulating layer 4542a serving as a channel protective layer and the insulating layer 4542b which covers a peripheral portion (and the side surface) of the oxide semiconductor layer are formed.

The insulating layers 4541b and 4542b which cover the peripheral portion (and the side surface) of the oxide semiconductor layer increases the distance between the gate electrode layer and the wiring layer (e.g., a source wiring layer or a capacitor wiring layer) over or in the periphery of the gate electrode layer, whereby parasitic capacitance can be reduced. The insulating layers 4541a, 4541b, 4542a, and 4542b may be formed of a material and a method similar to the material and method for the oxide insulating layers 426a and 426b described in Embodiment 1. In addition, in order to reduce the surface roughness due to the thin film transistors, the thin film transistors are covered with the insulating layer 4543 serving as a planarizing insulating film. Here, as the insulating layers 4541a, 4541b, 4542a, and 4542b, a silicon oxide film is formed by a sputtering method according to Embodiment 1.

The insulating layer 4543 is formed over the insulating layers 4541a, 4541b, 4542a, and 4542b. The insulating layer 4543 can be formed using the same material and method as the insulating layer 428 and the protective insulating layer 403 described in Embodiment 1. The insulating layer 4543 is illustrated as a single layer in FIG. 10B, but is the stack of the insulating layer 428 and the protective insulating layer 403 which are formed using different materials. Here, as the insulating layer 4543, a silicon oxide film formed by a sputtering method and a silicon nitride film formed by a plasma CVD method are stacked.

The insulating layer 4544 is formed as the planarizing insulating film. The insulating layer 4544 can be formed using the same material and method as the planarizing insulating layer 404 described in Embodiment 1. Here, acrylic is used for the insulating layer 4544.

In this embodiment, a plurality of thin film transistors in the pixel portion may be surrounded together by a nitride insulating film. For example, a structure may be employed in which a nitride insulating film is used as the insulating layer 4543 and the gate insulating layer, and the insulating layer 4543 is in contact with the gate insulating layer at least in the periphery surrounding the pixel portion over the active matrix substrate as illustrated in FIGS. 11A and 11B. By employing above structure, entry of moisture from the outside can be prevented. Moreover, entry of moisture from the outside can be prevented in the long term even after the device is completed as a semiconductor device, for example, as a display device; thus, the long-term reliability of the device can be improved.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that although the light-emitting element 4511 has a stacked-layer structure including the first electrode layer 4517, an electroluminescent layer 4512, and a second electrode layer 4513 in this embodiment, the structure of the light-emitting element 4511 is not limited. The structure of the light-emitting element 4511 can be changed as appropriate depending on, for example, the direction in which light is extracted from the light-emitting element 4511.

A partition wall 4520 is formed using an organic resin film, an inorganic insulating film, or organic polysiloxane. It is particularly preferable that the partition wall 4520 be formed of a photosensitive material to have an opening over the first electrode layer 4517 so that a sidewall of the opening is formed as an inclined surface with a continuous curvature.

The electrical field light-emitting layer 4512 may be forced using either a single layer or a stack of plural layers.

In order to prevent entry of oxygen, hydrogen, moisture, carbon dioxide, or the like into the light-emitting element 4511, a protective film may be formed over the second electrode layer 4513 and the partition wall 4520. As the protective film, a silicon nitride film, a silicon nitride oxide film, a DLC (Diamond-Like Carbon) film, or the like can be formed.

In addition, a variety of signals and potentials are supplied from FPCs 4518a and 4518b to the signal line drive circuits 4503a and 4503b, the scan line drive circuits 4504a and 4504b, or the pixel portion 4502.

A connection terminal electrode 4515 is formed using the same conductive film as the first electrode layer 4517 included in the light-emitting element 4511. A terminal electrode 4516 is formed using the same conductive film as the source and drain electrode layers included in the thin film transistors 4509 and 4510.

The connection terminal electrode 4515 is electrically connected to a terminal included in the FPC 4518a through an anisotropic conductive film 4519.

The second substrate 4506 located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen may be used as the filler.

If needed, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting element. Further, the polarizing plate or the circularly polarizing plate may be provided with an anti-reflection film. For example, anti-glare treatment by which reflected light can be diffused by projections and depressions of the surface so as to reduce the glare can be performed.

As the signal line drive circuits 4503a and 4503b and the scan line drive circuits 4504a and 4504b, drive circuits formed by using a single crystal semiconductor film or a polycrystalline semiconductor film over a substrate separately prepared may be mounted. Alternatively, only the signal line drive circuits or part thereof, or only the scan line drive circuits or part thereof may be separately formed and then mounted. This embodiment is not limited to the structure illustrated in FIGS. 11A and 11B.

Through the above steps, a highly reliable light-emitting device (a display panel) can be manufactured as a semiconductor device.

This embodiment can be implemented in combination with any of the structures described in Embodiments 1 to 4 and 6 to 8, as appropriate.

Embodiment 12

Figure 20:
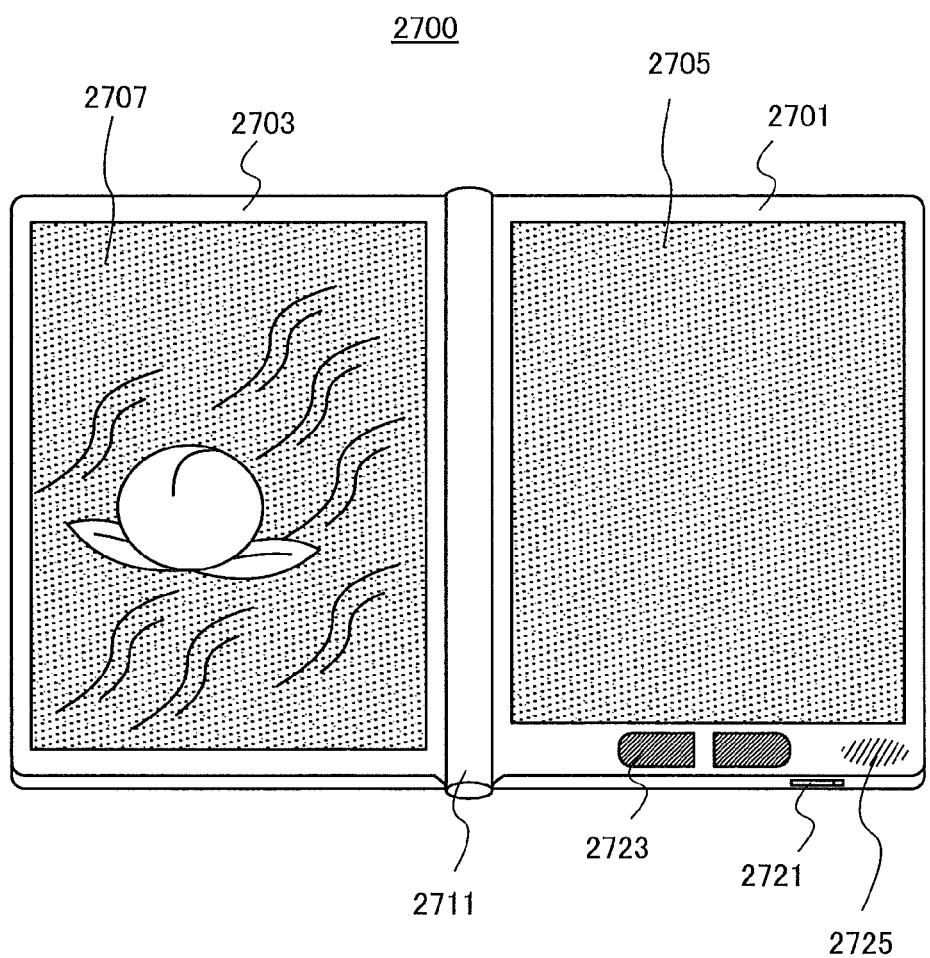
FIG. 20 is an external view illustrating an example of an e-book.

The semiconductor device disclosed in this specification can be applied to an electronic paper. An electronic paper can be used for electronic devices for displaying information in all fields. For example, an electronic paper can be applied to an electronic book (an e-book), a poster, an advertisement in a vehicle such as a train, or a display of a variety of cards such as a credit card. FIG. 20 illustrates an example of the electronic devices.

FIG. 20 illustrates an example of an electronic book 2700. For example, the electronic book 2700 includes two housings, a housing 2701 and a housing 2703. The housing 2701 and the housing 2703 are combined with a hinge 2711 so that the electronic book 2700 can be opened and closed along the hinge 2711. With such a structure, the electronic book 2700 can be handled like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right (the display portion 2705 in FIG. 20) can display text and a display portion on the left (the display portion 2707 in FIG. 20) can display graphics.

FIG. 20 illustrates an example in which the housing 2701 is provided with an operation portion and the like. For example, the housing 2701 is provided with a power button 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (an earphone terminal, a USB terminal, a terminal connectable to a variety of cables such as an AC adapter or a USB cable), a storage medium insertion portion, and the like may be provided on the back surface or the side surface of the housing. Moreover, the electronic book 2700 may have the function of an electronic dictionary.

The electronic book 2700 may be configured to wirelessly transmit and receive data. Through wireless communication, desired book data or the like can be purchased and downloaded from an electronic book server.

Embodiment 13

A semiconductor device disclosed in this specification can be applied to a variety of electronic devices (including game machines). Examples of such electronic devices are a television device (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio playback device, a large-sized game machine such as a pinball machine, and the like.

Figure 21A:
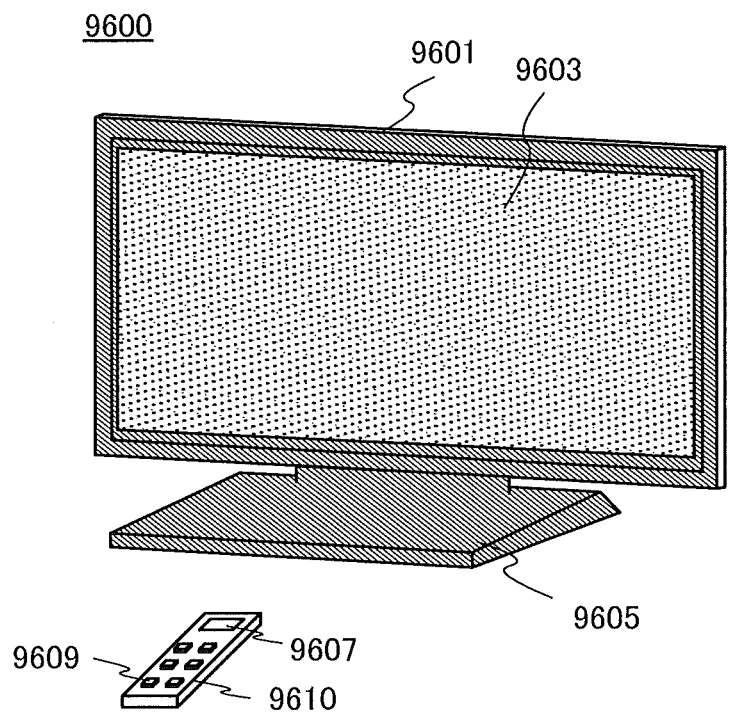
FIGS. 21A and 21B are external views respectively illustrating an example of a television set and an example of a digital photo frame.

FIG. 21A illustrates an example of a television device 9600. In the television device 9600, a display portion 9603 is incorporated in a housing 9601. The display portion 9603 can display images. Here, the housing 9601 is supported by a stand 9605.

The television device 9600 can be operated with an operation switch of the housing 9601 or a separate remote control 9610. Channels can be switched and volume can be controlled with operation keys 9609 of the remote control 9610, whereby an image displayed on the display portion 9603 can be controlled. Moreover, the remote control 9610 may be provided with a display portion 9607 for displaying data outputted from the remote control 9610.

Note that the television device 9600 is provided with a receiver, a modem, and the like. With the receiver, general TV broadcasts can be received. Moreover, when the display device is connected to a communication network with or without wires via the modem, one-way (from a sender to a receiver) or two-way (e.g., between a sender and a receiver or between receivers) information communication can be performed.

Figure 21B:
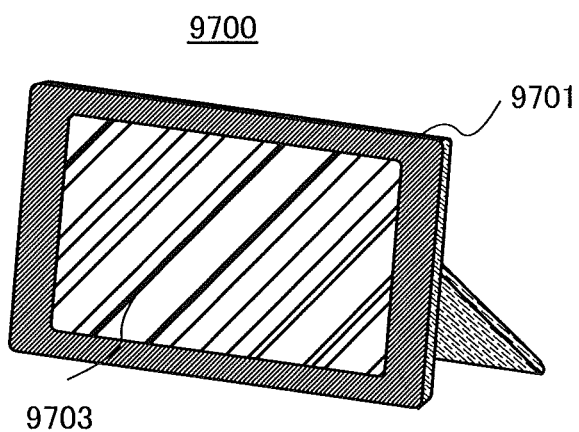

FIG. 21B illustrates an example of a digital photo frame 9700. For example, in the digital photo frame 9700, a display portion 9703 is incorporated in a housing 9701. The display portion 9703 can display a variety of images. For example, the display portion 9703 can display image data taken with a digital camera or the like and function as a normal photo frame.

Note that the digital photo frame 9700 is provided with an operation portion, an external connection terminal (a USB terminal, a terminal connectable to a variety of cables such as a USB cable), a storage medium insertion portion, and the like. Although these components may be provided on the same surface as the display portion, it is preferable to provide them on the side surface or the back surface for design aesthetics. For example, storage medium storing image data taken with a digital camera are inserted into the storage medium insertion portion of the digital photo frame, and the data are loaded, whereby the image can be displayed on the display portion 9703.

The digital photo frame 9700 may be configured to transmit and receive data wirelessly. Through wireless communication, desired image data can be loaded to be displayed.

Figure 22A:
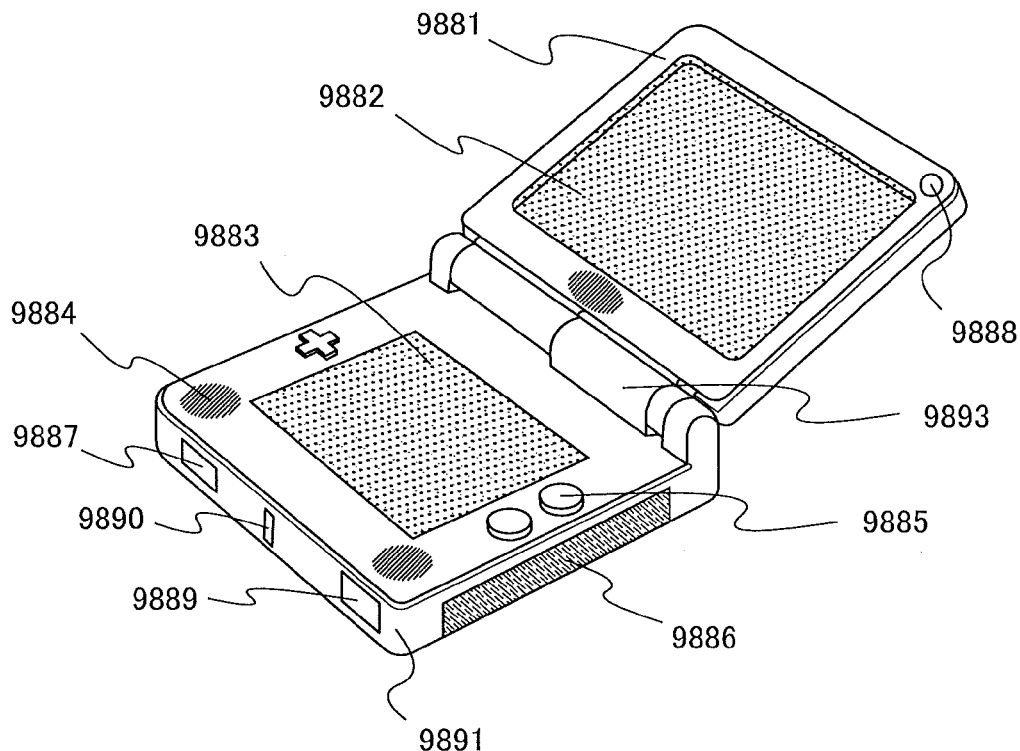
FIGS. 22A and 22B are external views each illustrating an example of an amusement machine.

FIG. 22A illustrates a portable game console including two housings, a housing 9881 and a housing 9891 which are jointed with a joint portion 9893 so that the portable game console can be opened or folded. A display portion 9882 and a display portion 9883 are incorporated in the housing 9881 and the housing 9891, respectively. In addition, the portable game console illustrated in FIG. 22A is provided with a speaker portion 9884, a storage medium insertion portion 9886, an LED lamp 9890, input means (operation keys 9885, a connection terminal 9887, a sensor 9888 (having the function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game console is not limited to the above and other structures provided with at least the semiconductor device disclosed in this specification can be employed. The portable game console may include an additional accessory as appropriate. The portable game console illustrated in FIG. 22A has the function of reading a program or data stored in a storage medium to display it on the display portion, and the function of sharing information with another portable game console by wireless communication. Note that the function of the portable game console illustrated in FIG. 22A is not limited to those described above, and the portable game console can have a variety of functions.

Figure 22B:
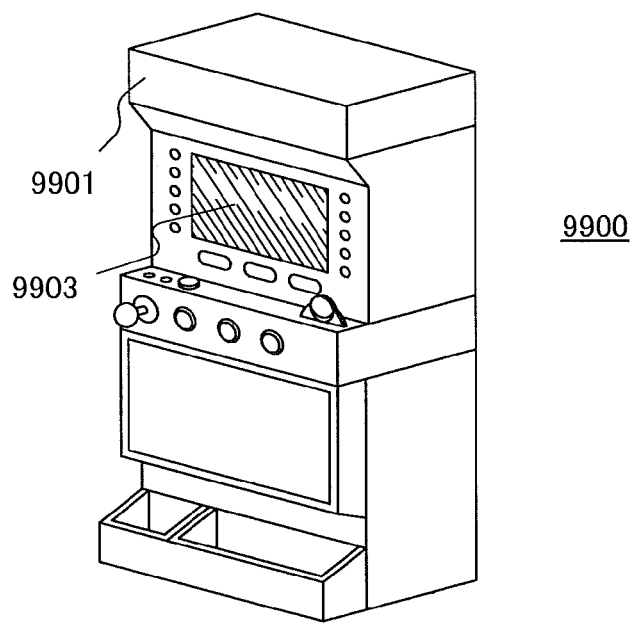

FIG. 22B illustrates an example of a slot machine 9900 which is a large-sized game machine. In the slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and other structures provided with at least a semiconductor device disclosed in this specification may be employed. The slot machine 9900 may include an additional accessory as appropriate.

Figure 23A:
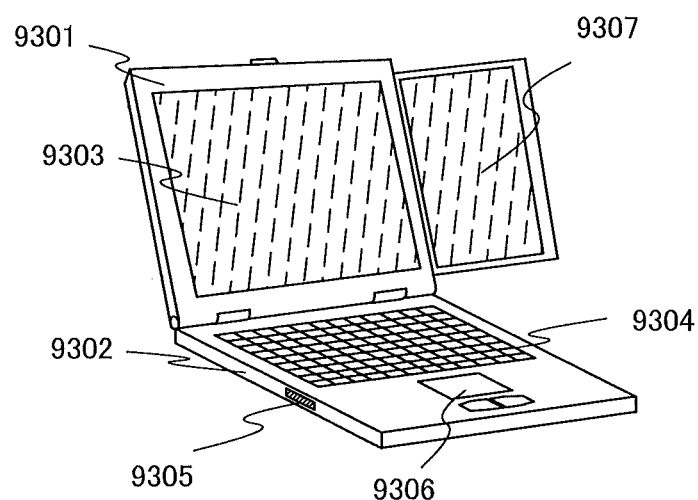
FIGS. 23A and 23B are external views respectively illustrating an example of a portable computer and an example of a mobile phone.

FIG. 23A is a perspective view illustrating an example of a portable computer.

In the portable computer illustrated in FIG. 23A a top housing 9301 having a display portion 9303 and a bottom housing 9302 having a keyboard 9304 can overlap with each other by closing a hinge unit which connects the top housing 9301 and the bottom housing 9302. The portable computer illustrated in FIG. 23A is conveniently carried. In the case of using the keyboard for input of data, the hinge unit is opened so that a user can input data looking at the display portion 9303.

The bottom housing 9302 includes a pointing device 9306 with which input can be performed, in addition to the keyboard 9304. When the display portion 9303 is a touch screen, the user can input data by touching part of the display portion. The bottom housing 9302 includes an arithmetic function portion such as a CPU or hard disk. In addition, the bottom housing 9302 includes another device, for example, an external connection port 9305 into which a communication cable conformable to communication standards of a USB is inserted.

The top housing 9301 further includes a display portion 9307 which can be stored in the top housing 9301 by being slid therein. With the display portion 9307, a large display screen can be realized. In addition, the user can adjust the angle of a screen of the stowable display portion 9307 which can be stored. If the display portion 9307 which can be stored is a touch screen, the user can input data by touching part of the display portion 9307 which can be stored.

The display portion 9303 or the display portion 9307 which can be stored is formed using an image display device such as a liquid crystal display panel or a light-emitting display panel using an organic light-emitting element, an inorganic light-emitting element, or the like.

In addition, the portable computer illustrated in FIG. 23A can be provided with a receiver and the like and can receive a TV broadcast to display an image on the display portion. The user can watch a TV broadcast with the whole screen of the display portion 9307 by sliding and exposing the display portion 9307 and adjusting the angle thereof, with the hinge unit which connects the top housing 9301 and the bottom housing 9302 closed. In this case, the hinge unit is not opened and display is not performed on the display portion 9303. In addition, start up of only a circuit for displaying a TV broadcast is performed. Thus, power consumption can be minimized, which is advantageous for the portable computer whose battery capacity is limited.

Figure 23B:
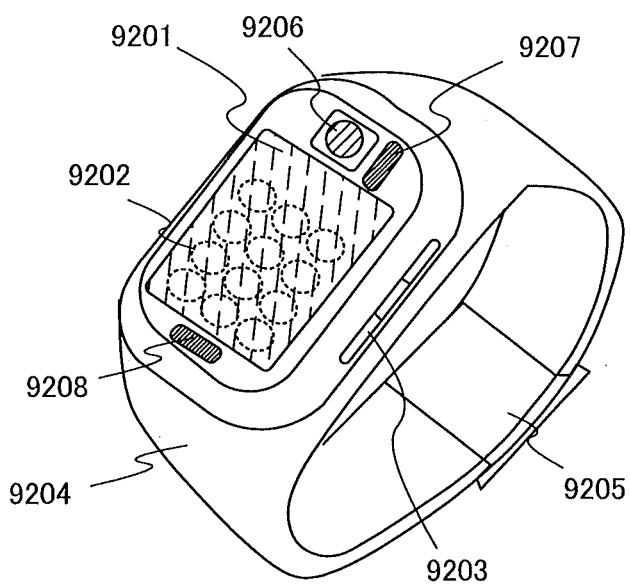

FIG. 23B is a perspective view of an example of a mobile phone that the user can wear on the wrist like a wristwatch.

This mobile phone is formed with a main body which includes a communication device including at least a telephone function, and battery; a band portion 9204 which enables the main body to be worn on the wrist; an adjusting portion 9205 for adjusting the band portion to fit the wrist; a display portion 9201; a speaker 9207; and a microphone 9208.

In addition, the main body includes operation switches 9203. The operation switches 9203 can serve, for example, as a power switch, a switch for changing display, or a switch for instruction to start taking images. The operation switches 9203 may be a switch for starting a program for the Internet when the switch is pushed. The operation switches 9203 can be configured to have respective functions.

The user can input data into this mobile phone by touching the display portion 9201 with a finger or an input pen, controlling the operation switches 9203, or inputting voice into the microphone 9208. In FIG. 23B, display buttons 9202 are displayed on the display portion 9201. The user can input data by touching the display buttons 9202 with a finger or the like.

Further, the main body includes a camera portion 9206 including an image capturing means having the function of converting an image of an object, which is formed through a camera lens, to an electronic image signal. Note that the camera portion is not necessarily provided.

The mobile phone illustrated in FIG. 23B is provided with a receiver of a TV broadcast and the like, and can display an image on the display portion 9201 by receiving the TV broadcast. In addition, the mobile phone is provided with a storage device such as a memory, and can record the TV broadcast in the memory. The mobile phone illustrated in FIG. 23B may have the function of collecting location information, such as GPS.

An image display device such as a liquid crystal display panel or a light-emitting display panel using an organic or inorganic light-emitting element is used as the display portion 9201. The mobile phone illustrated in FIG. 23B is compact and lightweight and thus has limited battery capacity. For the above reason, a panel which can be driven with low power consumption is preferably used as a display device for the display portion 9201.

Note that although FIG. 23B illustrates the electronic device which is worn on the wrist, this embodiment is not limited thereto as long as an electronic device is portable.

Embodiment 14

In this embodiment, as one mode of a semiconductor device, examples of display devices each including the thin film transistor described in any of Embodiments 1, 2, 5, and 6 will be described with reference to FIG. 24 to FIG. 35. In this embodiment, examples of liquid crystal display devices in each of which a liquid crystal element is used as a display element will be described with reference to FIG. 24 to FIG. 35. The thin film transistor described in any of Embodiments 1, 2, 5, and 6 can be used as TFTs 628 and 629 used for the liquid crystal display devices in FIG. 24 to FIG. 35. The TFTs 628 and 629 can be manufactured through a process similar to that described in any of Embodiments 1, 2, 5, and 6 and have excellent electric characteristics and high reliability. The TFT 628 and the TFT 629 include a channel protective layer 608 and a channel protective layer 611, respectively, and are bottom gate thin film transistors including microcrystalline semiconductor films as channel formation regions.

First, a vertical alignment (VA) liquid crystal display device is described. The VA mode of a liquid crystal display device is a kind of mode in which alignment of liquid crystal molecules of a liquid crystal display panel is controlled. In the VA liquid crystal display device, liquid crystal molecules are aligned in a vertical direction with respect to a panel surface when no voltage is applied. In this embodiment, in particular, a pixel is divided into some regions (subpixels), and molecules are aligned in different directions in their respective regions. This is referred to as multi-domain or multi-domain design. Liquid crystal display devices of the multi-domain design will be described below.

Figure 24:
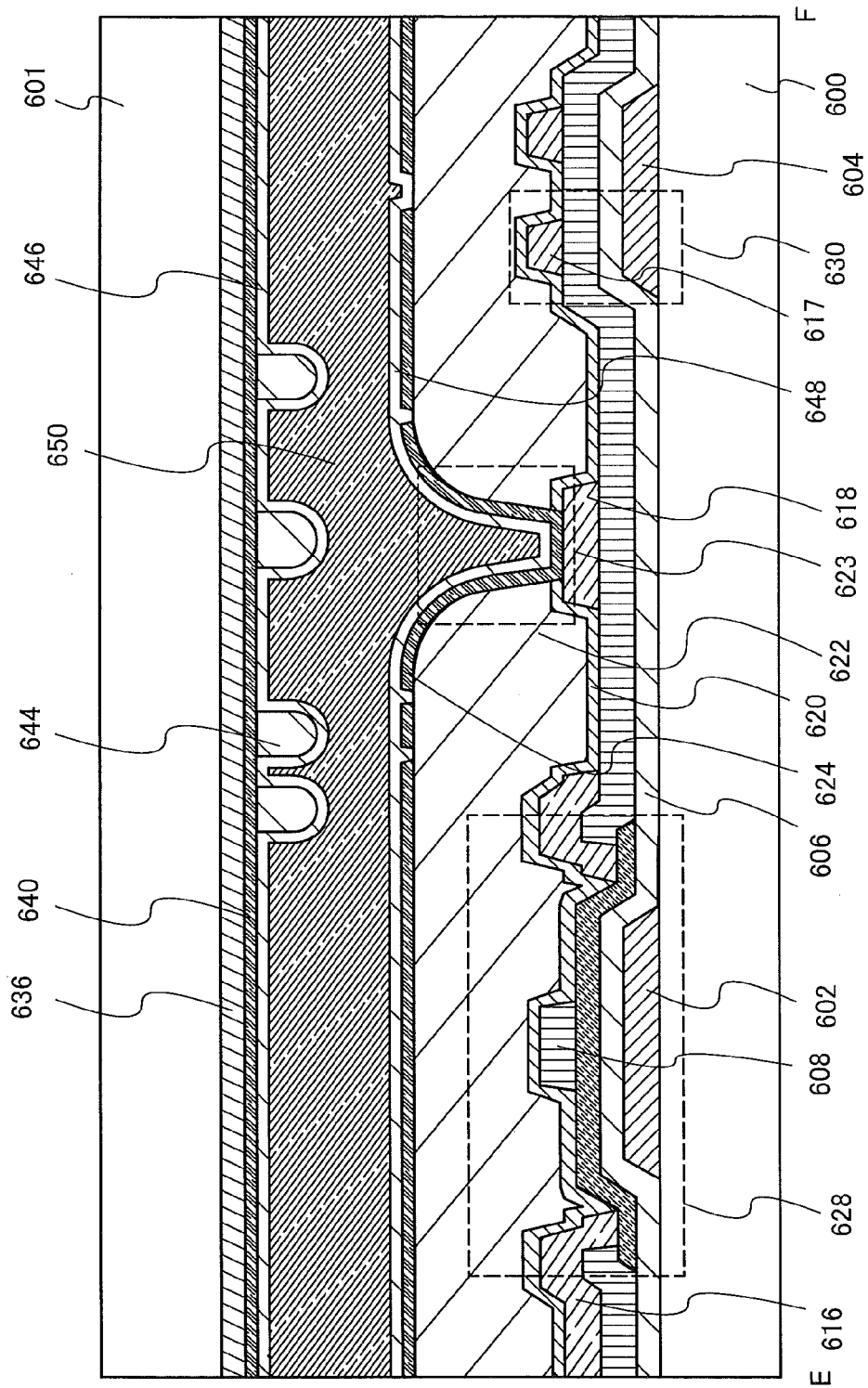
FIG. 24 illustrates a semiconductor device.
Figure 25:
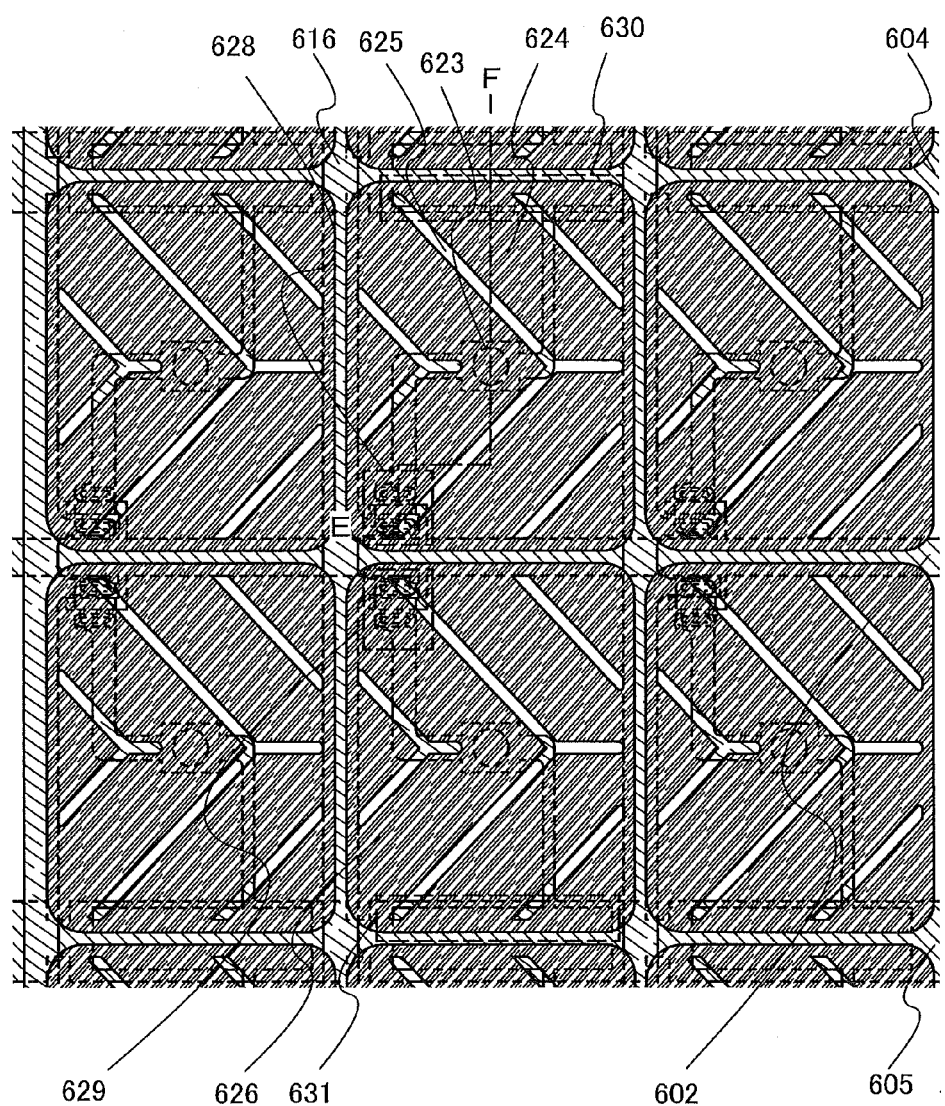
FIG. 25 illustrates a semiconductor device.
Figure 26:
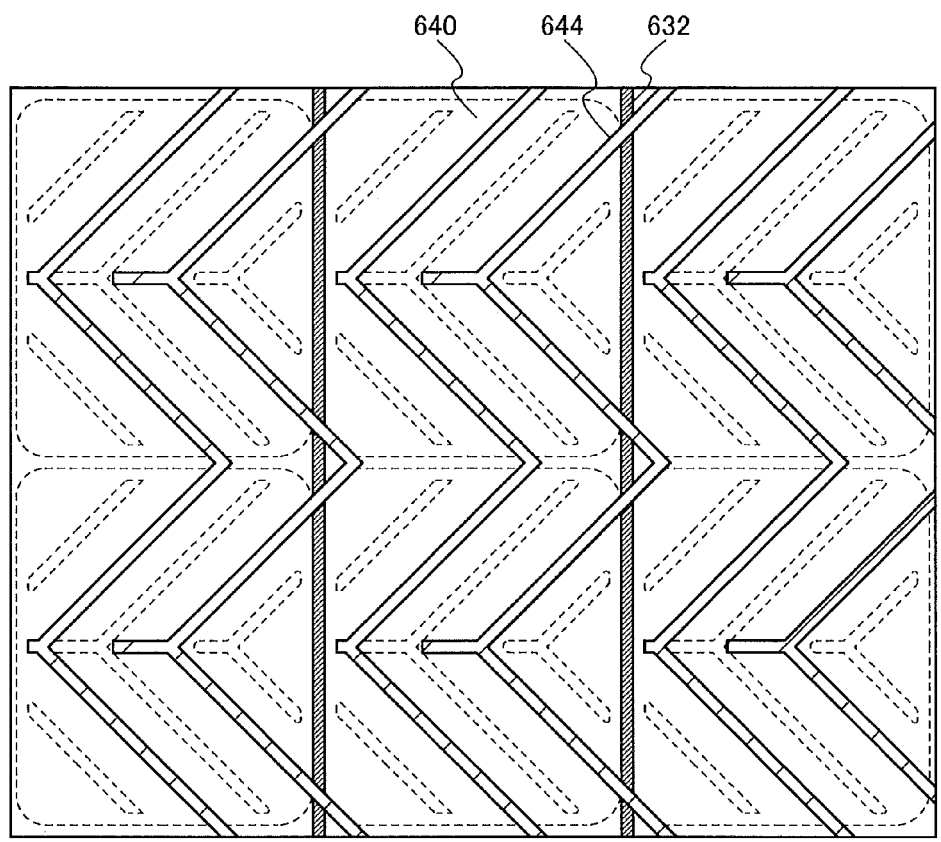
FIG. 26 illustrates a semiconductor device.

FIG. 25 and FIG. 26 illustrate a pixel electrode and a counter electrode, respectively. FIG. 25 is a plan view showing the substrate side where the pixel electrode is formed. FIG. 24 illustrates a cross-sectional structure taken along section line E-F in FIG. 25. FIG. 26 is a plan view showing the substrate side where the counter electrode is formed. Description below will be made with reference to those drawings.

In FIG. 24, a substrate 600 over which a TFT 628, a pixel electrode 624 connected to the TFT 628, and a storage capacitor portion 630 are formed and a counter substrate 601 on which a counter electrode 640 and the like are provided overlap with each other, and liquid crystal is injected between the substrate 600 and the counter substrate 601.

At the position where the counter substrate 601 is provided with a spacer, a first coloring film, a second coloring film, a third coloring film, and the counter electrode 640 are formed. With this structure, the height of the projection 644 for controlling orientation of liquid crystals is made different from that of the spacer. An alignment film 648 is formed over the pixel electrode 624, and an alignment film 646 is similarly formed on the counter electrode 640. A liquid crystal layer 650 is formed between the substrate 600 and the counter substrate 601.

A columnar spacer may be used, or bead spacers may be dispersed. When the spacer has a light-transmitting property, it may be formed over the pixel electrode 624 formed over the substrate 600.

The TFT 628, the pixel electrode 624 connected to the TFT 628, and the storage capacitor portion 630 are formed over the substrate 600. The pixel electrode 624 is connected to a wiring 618 through a contact hole 623 which penetrates an insulating film 620 covering the TFT 628, a wiring 616, and the storage capacitor portion 630 and also penetrates a third insulating film 622 covering the insulating film 620. The insulating film 620 is a stack of an insulating layer and a protective insulating layer. The insulating layer in contact with the semiconductor layer is a silicon oxide film formed by a sputtering method, and the protective insulating layer over the insulating layer is a silicon nitride film formed by a sputtering method. Note that in FIG. 24, the insulating film 620 which is a stacked layer is illustrated as a single layer for simplification. As the TFT 628, the thin film transistor shown in any of Embodiments 1, 2, 5, and 6 can be used as appropriate. Further, the storage capacitor portion 630 includes: a first capacitor wiring 604 which is formed at the same time as a gate wiring 602 of the TFT 628; a gate insulating film 606; and a second capacitor wiring 617 which is formed at the same time as the wiring 616 and the wiring 618.

The pixel electrode 624, the liquid crystal layer 650, and the counter electrode 640 overlap with each other, whereby a liquid crystal element is formed.

FIG. 25 illustrates a planar structure over the substrate 600. The pixel electrode 624 is formed using the material given in Embodiment 1. The pixel electrode 624 is provided with slits 625. The slits 625 are provided for controlling the alignment of the liquid crystals.

A TFT 629, a pixel electrode 626 connected to the TFT 629, and a storage capacitor portion 631 which are illustrated in FIG. 25 can be formed in a similar manner to the TFT 628, the pixel electrode 624, and the storage capacitor portion 630, respectively. Both the TFTs 628 and 629 are connected to the wiring 616. One pixel of this liquid crystal display panel includes the pixel electrode layers 624 and 626. The pixel electrode layers 624 and 626 are each included in a sub pixel.

FIG. 26 illustrates a structure of the counter substrate side. The counter electrode 640 is formed over the light blocking film 632. The counter electrode 640 is preferably formed using a material similar to that of the pixel electrode 624. The protrusions 644 which control the alignment of the liquid crystals are formed on the counter electrode 640.

Figure 27:
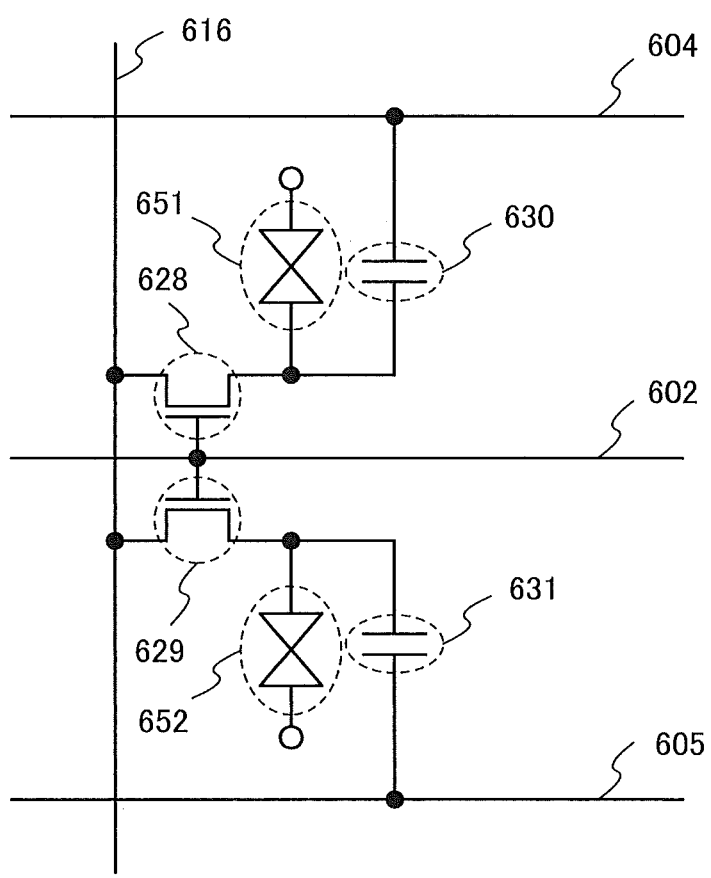
FIG. 27 illustrates a semiconductor device.

FIG. 27 illustrates an equivalent circuit of this pixel structure. Both the TFTs 628 and 629 are connected to the gate wiring 602 and the wiring 616. In that case, when potentials of the capacitor wiring 604 and a capacitor wiring 605 are different from each other, operations of liquid crystal elements 651 and 652 can be different from each other. In other words, the alignment of the liquid crystals is precisely controlled and a viewing angle is increased by separate control of potentials of the capacitor wirings 604 and 605.

When voltage is applied to the pixel electrode 624 provided with the slits 625, a distorted electric field (an oblique electric field) is generated in the vicinity of the slits 625. The protrusions 644 on the counter substrate 601 side and the slits 625 are alternately arranged so that the oblique electric field is effectively generated to control the alignment of the liquid crystals, whereby the direction of the alignment of the liquid crystals varies depending on the location. In other words, a viewing angle of the liquid crystal display panel is increased by use of such a multi-domain configuration.

Next, a VA liquid crystal display device, which is different from the above-described device, will be described with reference to FIG. 28 to FIG. 31.

Figure 28:
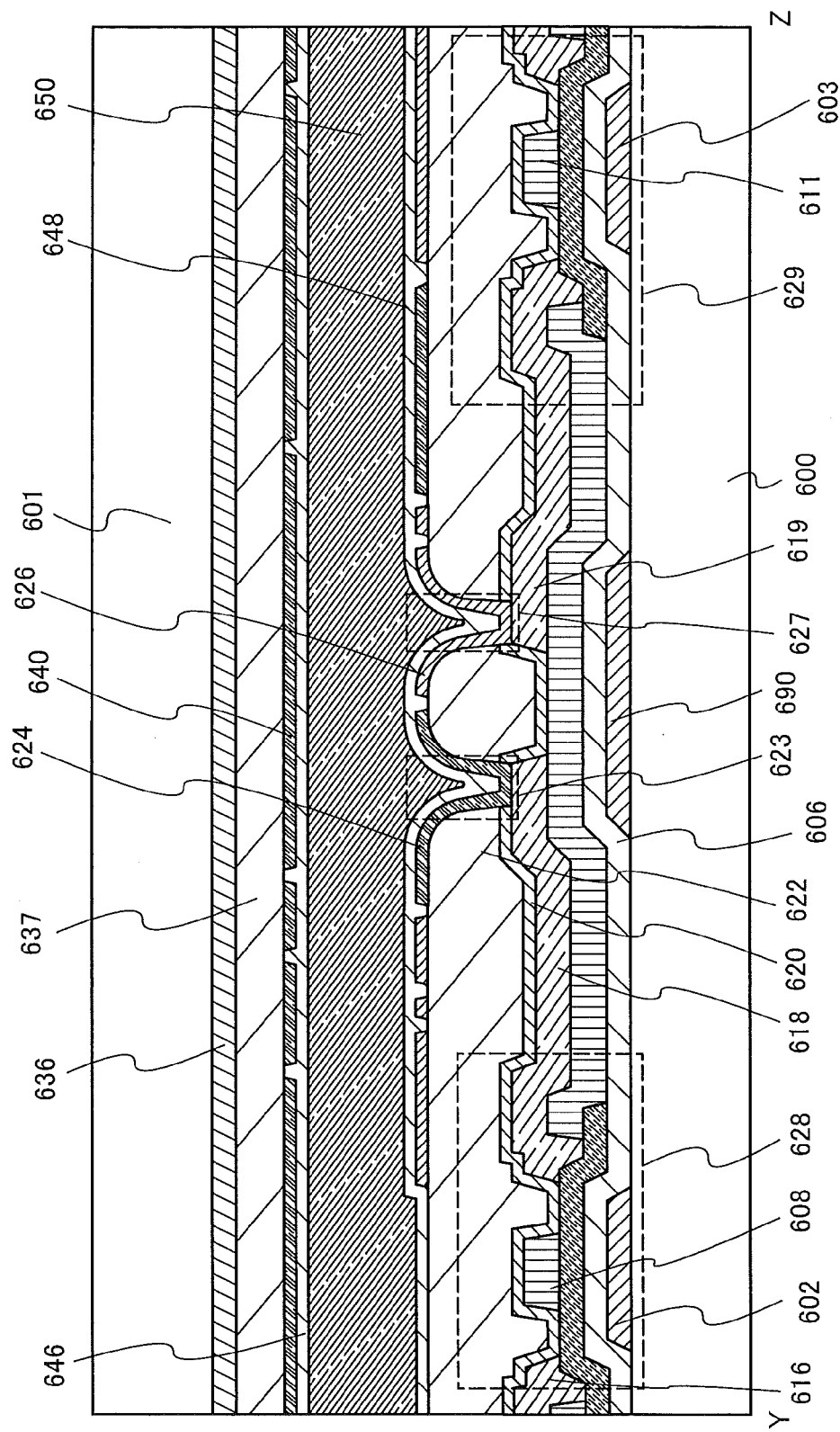
FIG. 28 illustrates a semiconductor device.
Figure 29:
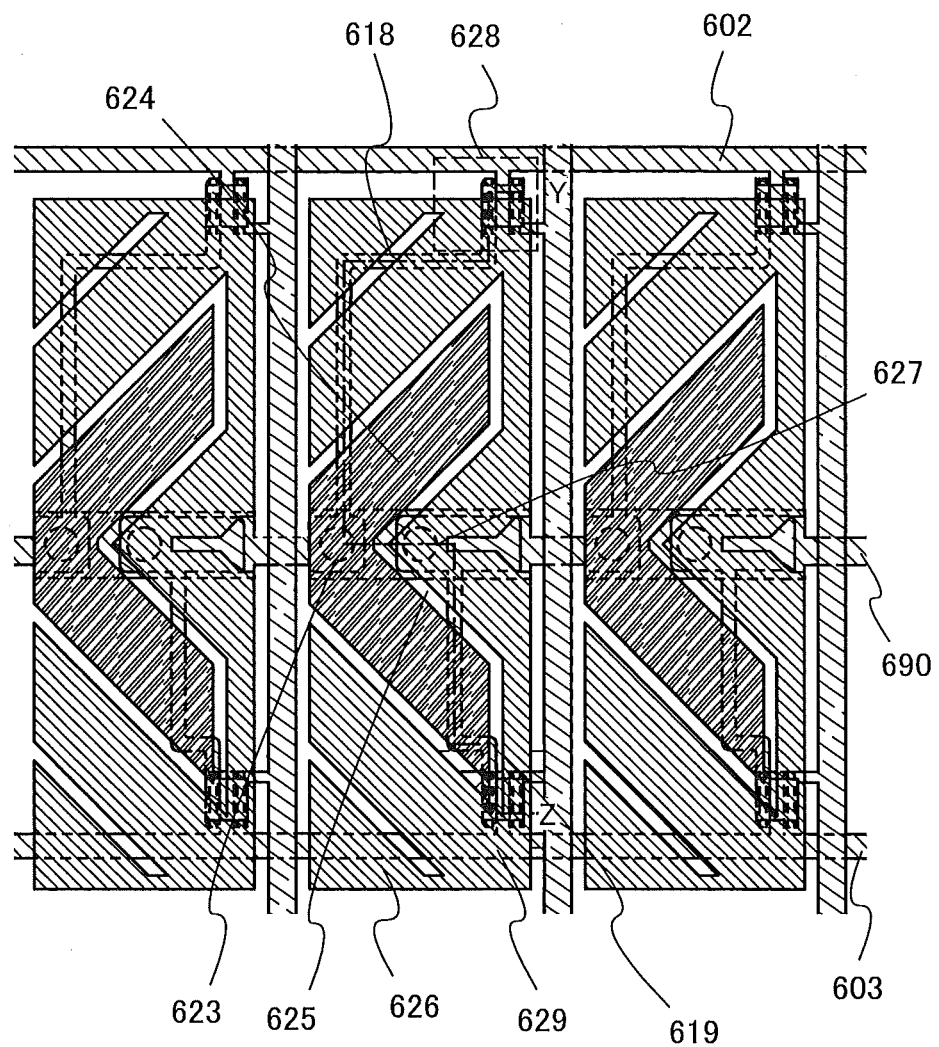
FIG. 29 illustrates a semiconductor device.

FIG. 28 and FIG. 29 illustrate a pixel structure of a VA liquid crystal display panel. FIG. 29 is a plan view of the substrate 600. FIG. 28 illustrates a cross-sectional structure taken along section line Y-Z in FIG. 29. Description below will be given with reference to both the drawings.

In this pixel structure, a plurality of pixel electrodes are provided in one pixel, and a is connected to each of the pixel electrodes. The plurality of TFTs are driven by different gate signals. In other words, signals applied to individual pixel electrodes in a multi-domain pixel are controlled independently of each other.

In the contact hole 623, the pixel electrode 624 is connected to the TFT 628 through the wiring 618. In a contact hole 627, the pixel electrode 626 is connected to the TFT 629 through a wiring 619. The gate wiring 602 of the TFT 628 is separated from a gate wiring 603 of the TFT 629 so that different gate signals can be supplied. On the other hand, a wiring 616 serving as a data line is shared by the TFTs 628 and 629. As each of the TFTs 628 and 629, the thin film transistor described in Embodiments 1, 2, 5, and 6 can be used as appropriate. Further, a capacitor wiring 690 is provided. The insulating film 620 is a stack of an insulating layer and a protective insulating layer. The insulating layer in contact with the semiconductor layer is a silicon oxide film formed by a sputtering method, and the protective insulating layer over the insulating layer is a silicon nitride film formed by a sputtering method. Note that in FIG. 28, the insulating film 620 which is a stacked layer is illustrated as a single layer for simplification.

Figure 31:
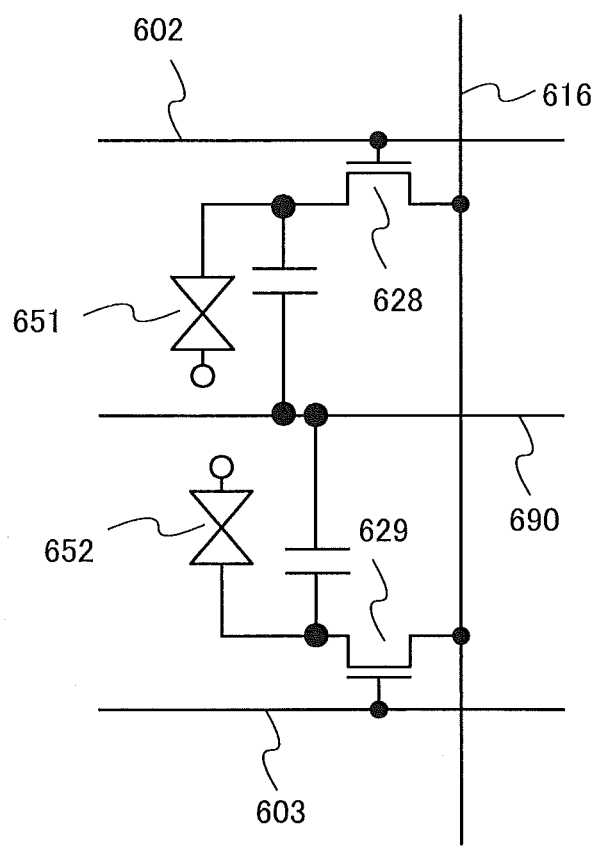
FIG. 31 illustrates a semiconductor device.

The shape of the pixel electrode 624 is different from that of the pixel electrode 626, and the pixel electrode layers are separated by slits 625. The pixel electrode 626 is formed so as to surround the pixel electrode 624 which has a V shape. Timing of voltage application to the pixel electrode layers 624 and 626 are made to be different by the TFTs 628 and 629, whereby alignment of liquid crystals is controlled. FIG. 31 illustrates an equivalent circuit of this pixel structure. The TFT 628 is connected to the gate wiring 602, and the TFT 629 is connected to the gate wiring 603. When different gate signals are supplied to the gate wirings 602 and 603, operation timing of the TFTs 628 and 629 can be different.

Figure 30:
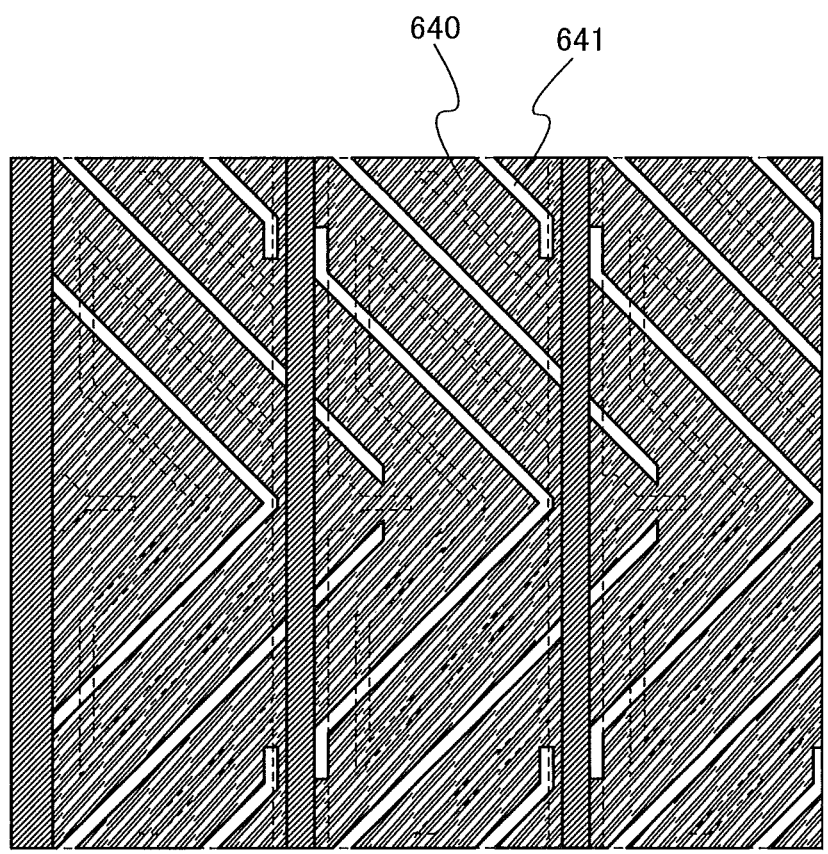
FIG. 30 illustrates a semiconductor device.

The counter substrate 601 is provided with the second coloring film 636 and the counter electrode 640. A planarization film 637 is formed between the second coloring film 636 and the counter electrode 640 to prevent alignment disorder of the liquid crystals. FIG. 30 illustrates a structure of the counter substrate side. The counter electrode 640 is an electrode shared by different pixels and has slits 641. The slits 641 and the slits 625 on the pixel electrode 624 and 626 sides are alternately arranged with each other so that an oblique electric field is effectively generated, whereby the alignment of the liquid crystals can be controlled. Accordingly, the alignment of the liquid crystals can vary depending on the location, which leads to a wider viewing angle.

The pixel electrode 624, the liquid crystal layer 650, and the counter electrode 640 overlap with each other, so that a first liquid crystal element is formed. Further, the pixel electrode 626, the liquid crystal layer 650, and the counter electrode 640 overlap with each other, so that a second liquid crystal element is formed. Furthermore, the multi-domain structure is employed in which the first liquid crystal element and the second liquid crystal element are provided for one pixel.

Next, a liquid crystal display device in a horizontal electric field mode will be described. In the horizontal electric field mode, an electric field in a horizontal direction is applied to liquid crystal molecules in a cell, whereby liquid crystals are driven to express a gray scale. With this method, a viewing angle can be increased to about 180°. A liquid crystal display device in the horizontal electric field mode will be described below.

Figure 32:
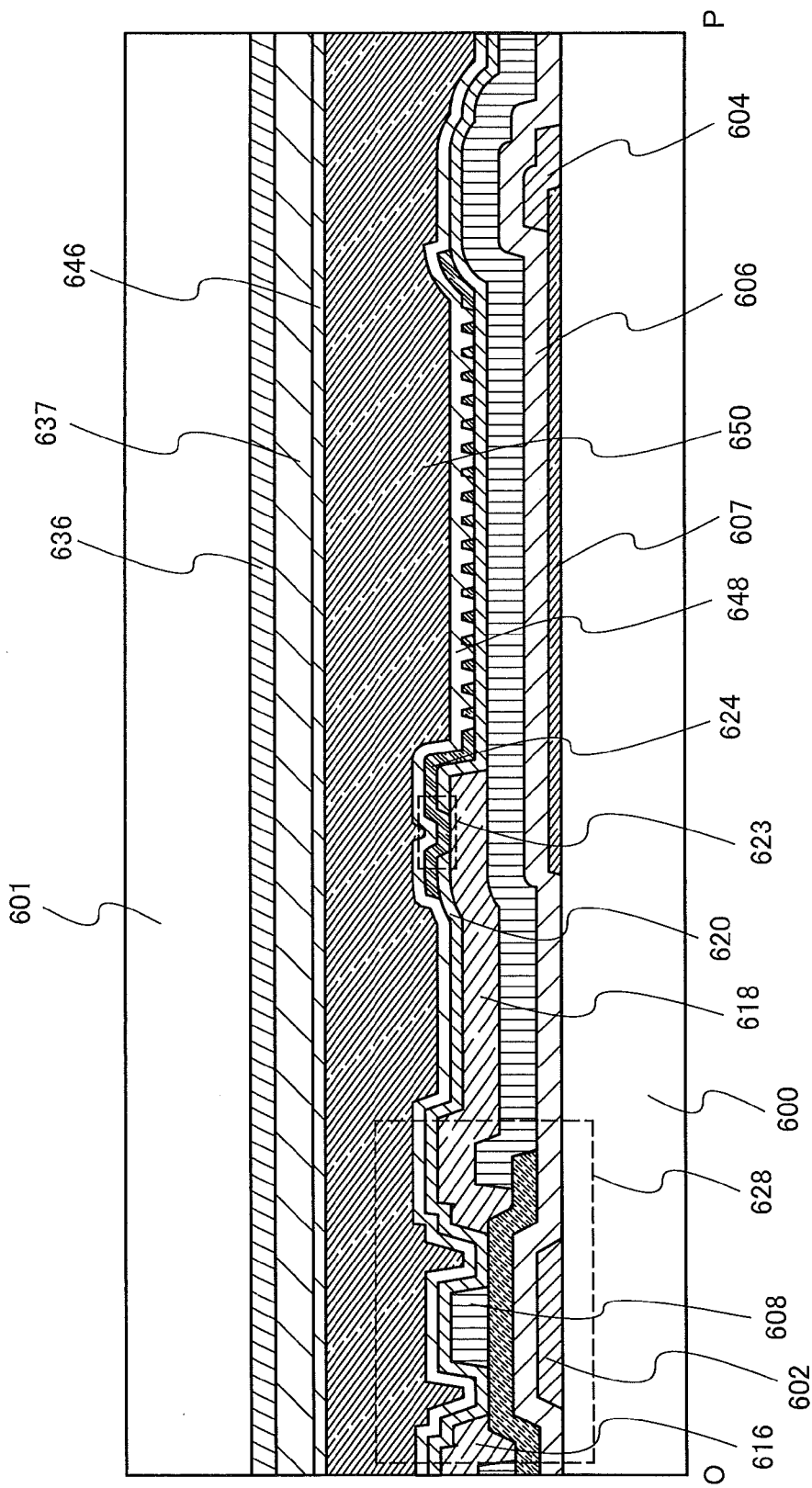
FIG. 32 illustrates a semiconductor device.

In FIG. 32, the substrate 600 over which the TFT 628, and the pixel electrode 624 connected to the TFT 628, are formed overlaps with the counter substrate 601, and liquid crystals are injected between the substrate 600 and the counter substrate 601. The counter substrate 601 is provided with the second coloring film 636, the planarization film 637, and the like. The pixel electrode is provided for the substrate 600, and not for the counter substrate 601. A liquid crystal layer 650 is formed between the substrate 600 and the counter substrate 601.

A first pixel electrode 607 and the capacitor wiring 604 connected to the first pixel electrode 607, and the TFT 628 described in any of Embodiments 1, 2, 5, and 6 are foamed over the substrate 600. The first pixel electrode 607 can be formed of a material similar to that of the pixel electrode layer 427 described in Embodiment 1. Further, the first pixel electrode 607 is formed in a shape compartmentalized roughly in accordance with a pixel shape. Note that the gate insulating film 606 is formed over the first pixel electrode 607 and the capacitor wiring 604.

The wirings 616 and 618 of the TFT 628 are formed over the gate insulating film 606. The wiring 616 is a data line through which a video signal travels and is a wiring extending in one direction in a liquid crystal display panel. The wiring 616 is also connected to a source region or a drain region of the TFT 628, and serves as one of source and drain electrodes. The wiring 618 serves as the other of the source and drain electrodes and is connected to the second pixel electrode 624.

The second insulating film 620 is formed over the wirings 616 and 618. The insulating film 620 is a stack of an insulating layer and a protective insulating layer. The insulating layer in contact with the semiconductor layer is a silicon oxide film formed by a sputtering method, and the protective insulating layer over the insulating layer is a silicon nitride film formed by a sputtering method. Note that in FIG. 32, the insulating film 620 which is a stacked layer is illustrated as a single layer for simplification. Further, the second pixel electrode 624 that is connected to the wiring 618 through the contact hole formed in the insulating film 620 is formed over the insulating film 620. The pixel electrode 624 is formed using the same material as the pixel electrode layer 427 described in Embodiment 1.

In such a manner, the TFT 628 and the pixel electrode 624 connected to the TFT 628 are formed over the substrate 600. Note that a storage capacitor is formed with the pixel electrode 607 and the pixel electrode 624.

Figure 33:
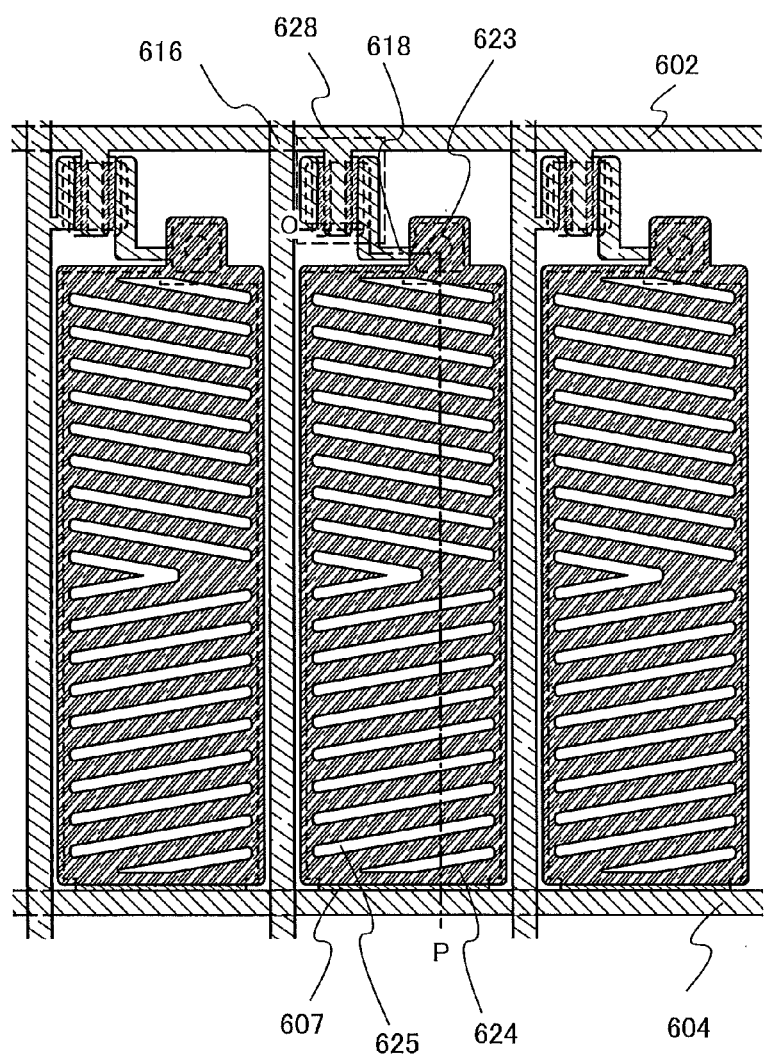
FIG. 33 illustrates a semiconductor device.

FIG. 33 is a plan view illustrating a structure of the pixel electrode. FIG. 32 illustrates a cross-sectional structure taken along section line O-P in FIG. 33. The pixel electrode 624 is provided with slits 625. The slits 625 are provided for controlling alignment of liquid crystals. In that case, an electric field is generated between the pixel electrode 607 and the pixel electrode 624. The thickness of the gate insulating film 606 formed between the pixel electrode 607 and the pixel electrode 624 is 50 nm to 200 nm, which is much smaller than the thickness of the liquid crystal layer which is 2 μm to 10 μm. Thus, an electric field is generated substantially in parallel (in a horizontal direction) to the substrate 600. The alignment of the liquid crystals is controlled with this electric field. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle. In addition, since both the pixel electrode 607 and the pixel electrode 624 are light-transmitting electrodes, an aperture ratio can be improved.

Next, a different example of the liquid crystal display device in the horizontal electric field mode will be described.

Figure 34:
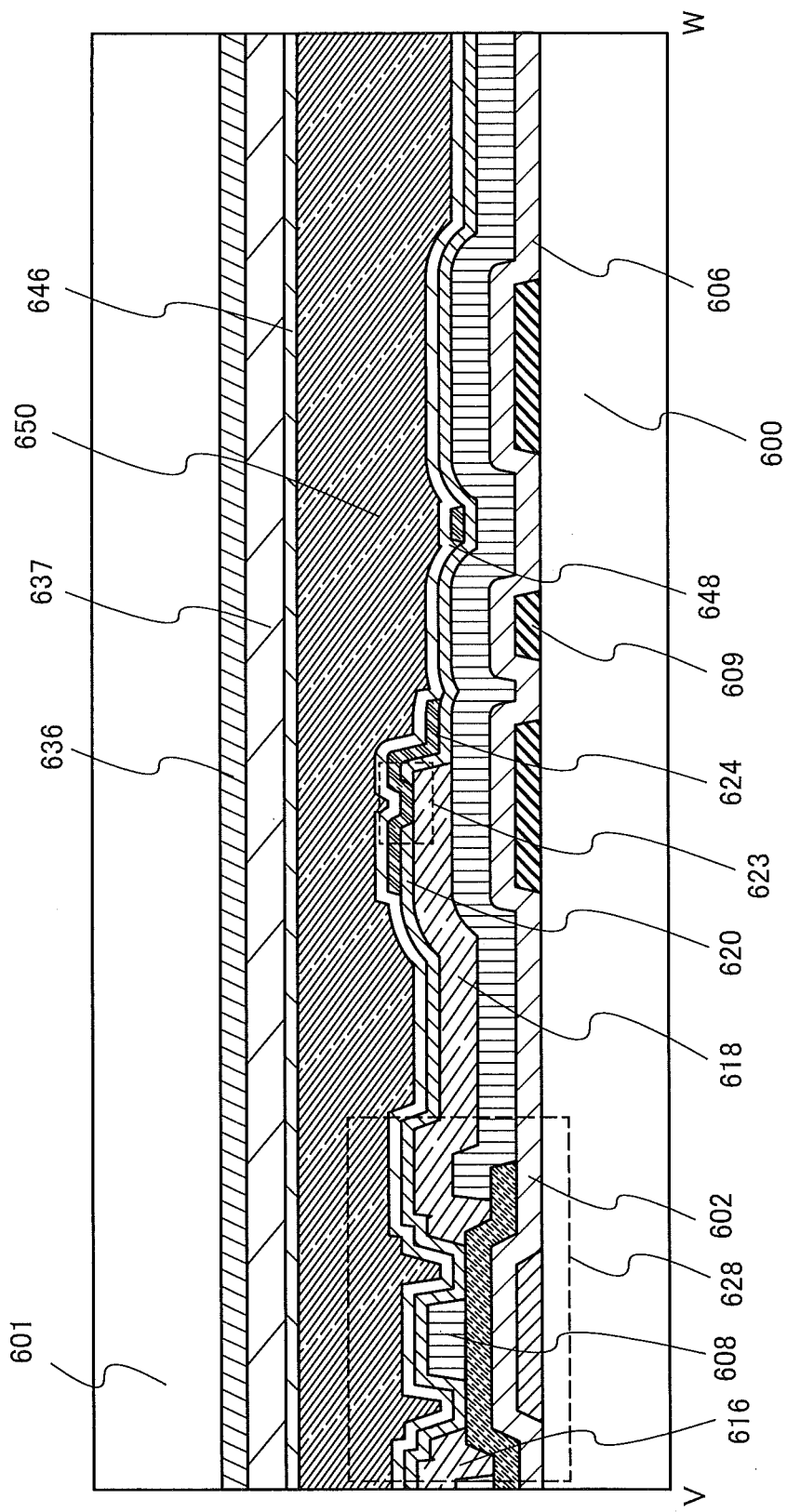
FIG. 34 illustrates a semiconductor device.
Figure 35:
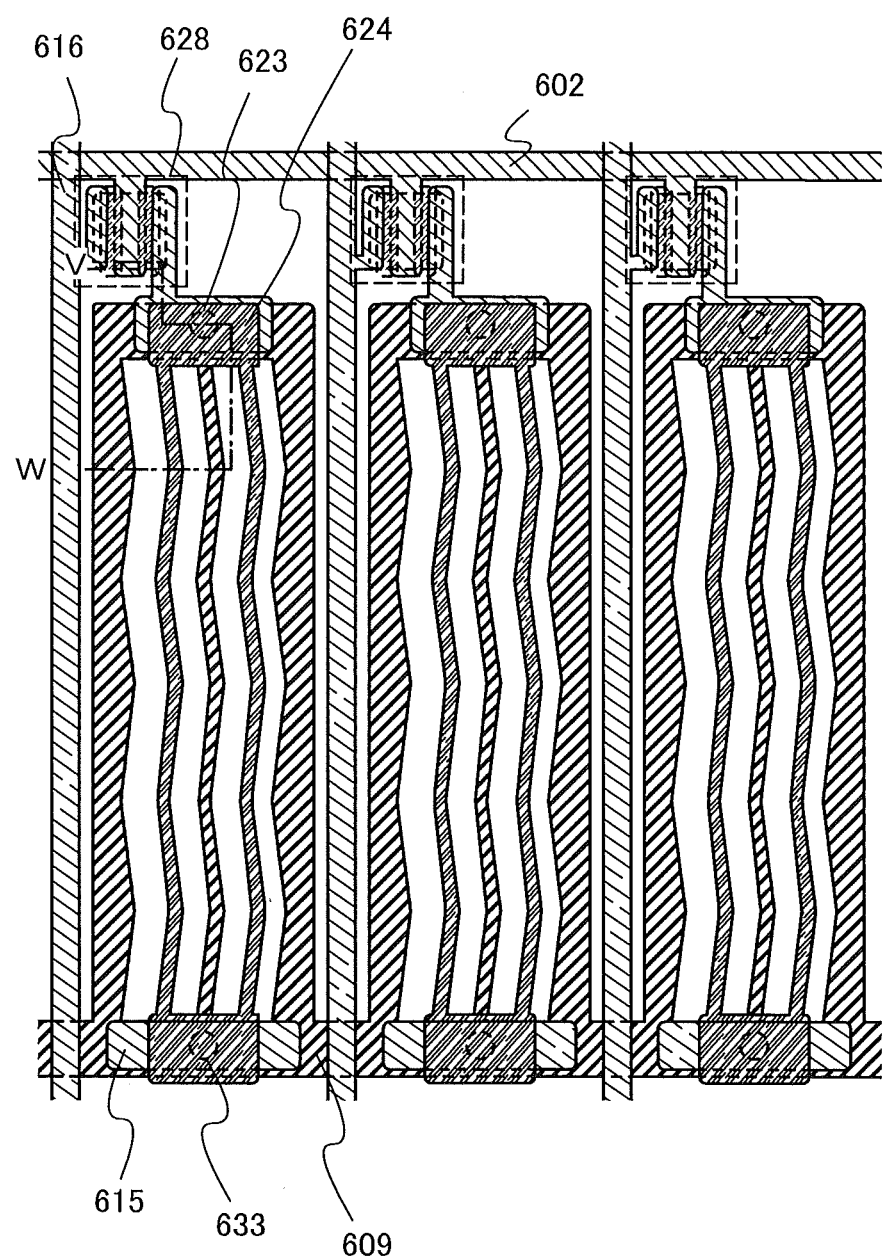
FIG. 35 illustrates a semiconductor device.

FIG. 34 and FIG. 35 illustrate a pixel structure of a liquid crystal display device in an IPS mode. FIG. 35 is a plan view. FIG. 34 illustrates a cross-sectional structure taken along section line V-W in FIG. 35. Description below will be given with reference to both the drawings.

In FIG. 34, the substrate 600 over which the TFT 628 and the second pixel electrode 624 connected to the TFT 628 are formed overlaps with the counter substrate 601, and liquid crystals are injected between the substrate 600 and the counter substrate 601. The counter substrate 601 is provided with the second coloring film 636, the planarization film 637, and the like. The pixel electrode 624 is provided on the side of substrate 600, and not on the side of the counter substrate 601. The liquid crystal layer 650 is formed between the substrate 600 and the counter substrate 601.

A common potential line 609 and the TFT 628 described in any of Embodiments 1, 2, 5, and 6 are formed over the substrate 600. The common potential line 609 can be formed at the same time as the gate wiring 602 of the TFT 628.

The wirings 616 and 618 of the TFT 628 are formed over the gate insulating film 606. The wiring 616 is a data line through which a video signal travels and is a wiring extending in one direction in a liquid crystal display panel. The wiring 616 is also connected to the source region or the drain region of the TFT 628, and serves as one of source and drain electrodes. The wiring 618 serves as the other of the source and drain electrodes and is connected to the pixel electrode 624.

The second insulating film 620 is formed over the wirings 616 and 618. Further, the pixel electrode 624 that is connected to the wiring 618 in the contact hole formed in the insulating film 620 is formed over the insulating film 620. The insulating film 620 is a stack of an insulating layer and a protective insulating layer. The insulating layer in contact with the semiconductor layer is a silicon oxide film formed by a sputtering method, and the protective insulating layer over the insulating layer is a silicon nitride film formed by a sputtering method. Note that in the drawing, the insulating film 620 which is a stacked layer is illustrated as a single layer for simplification. The pixel electrode 624 is formed using the same material as the pixel electrode layer 427 described in Embodiment 1. Note that as shown in FIG. 35, the pixel electrode 624 is formed so as to generate a horizontal electric field with a comb-shaped electrode which is formed at the same time as the common potential line 609. Further, the pixel electrode layer 624 is formed so that comb-teeth portions of the pixel electrode layer 624 and those of the comb-like electrode that is formed at the same time as the common potential line 609 are alternately arranged.

The alignment of the liquid crystals is controlled by an electric field generated due to a potential applied to the pixel electrode 624 and a potential of the common potential line 609. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle.

In such a manner, the TFT 628 and the pixel electrode 624 connected to the TFT 628 are formed over the substrate 600. The gate insulating film 606 is provided between the common potential line 609 and a capacitor electrode 615 to form a storage capacitor. The capacitor electrode 615 and the pixel electrode 624 are connected to each other through a contact hole 633.

Through the above process, a liquid crystal display device can be manufactured as a display device. The liquid crystal display devices of this embodiment are highly reliable liquid crystal display devices.

This application is based on Japanese Patent Application serial no. 2009-180077 filed with the Japan Patent Office on Jul. 31, 2009, the entire contents of which are hereby incorporated by reference.

REFERENCE NUMERALS

10: pulse output circuit, 11: first wiring, 12: second wiring, 13: third wiring, 14: fourth wiring, 15: fifth wiring, 21: first input terminal, 22: second input terminal, 23: third input terminal, 24: fourth input terminal, 25: fifth input terminal, 26: first output terminal, 27: second output terminal, 28: thin film transistor, 31: transistor, 32: transistor, 33: transistor, 34: transistor, 35: transistor, 36: transistor, 37: transistor, 38: transistor, 39: transistor, 40: transistor, 41: transistor, 42: transistor, 43: transistor, 51: power supply line, 52: power supply line, 53: power supply line, 61: period, 62: period, 200: substrate, 202: gate insulating layer, 203: protective insulating layer, 204: planarizing insulating layer, 205: common potential line, 206: common electrode layer, 207: oxide semiconductor layer, 208: oxide insulating layer, 209: common potential line, 216: insulating layer, 220: thin film transistor, 221: terminal, 222: terminal, 223: connection electrode layer, 225: conductive layer, 226: electrode layer, 227: pixel electrode layer, 230: capacitor wiring layer, 231: capacitor electrode, 236: metal wiring layer, 237: metal wiring layer, 241: metal wiring layer, 242: metal wiring layer, 243: metal wiring layer, 244: metal wiring layer, 250: capacitor wiring layer, 251: oxide semiconductor layer, 254: source wiring, 255: terminal electrode, 256: source wiring, 257: terminal electrode, 260: thin film transistor, 261: gate electrode layer, 263: channel formation region, 264a: high-resistance source region, 264b: high-resistance drain region, 264c: region, 264d: region, 265a: source electrode layer, 265b: drain electrode layer, 266: oxide insulating layer, 266b: oxide insulating layer, 267: conductive layer, 270: thin film transistor, 271: gate electrode layer, 273: channel formation region, 274a: high-resistance source region, 274b: high-resistance drain region, 274c: region, 274d: region, 274e: region, 274f: region, 275a: source electrode layer, 275b: drain electrode layer, 276, oxide insulating layer, 276b: oxide insulating layer, 277: conductive layer, 280: thin film transistor, 282a: gate insulating layer, 282b: gate insulating layer, 282c: gate insulating layer, 286b: oxide insulating layer, 290: thin film transistor, 292a: gate insulating layer, 292b: gate insulating layer, 400: substrate, 402: gate insulating layer, 403: protective insulating layer, 404: planarizing insulating layer, 420: thin film transistor, 421a: gate electrode layer, 421b: gate electrode layer, 422: oxide semiconductor layer, 423: channel formation region, 424a: high-resistance source region, 424b: high-resistance drain region, 424c: region, 424d: region, 424e: high-resistance source region, 424f: high-resistance drain region, 425a: source electrode layer, 425b: drain electrode layer, 426a: oxide insulating layer, 426b: oxide insulating layer, 427: pixel electrode layer, 428: insulating layer, 429: oxide semiconductor layer, 441: contact hole, 442: oxide semiconductor layer, 448: thin film transistor, 580: substrate, 581: thin film transistor, 583: insulating film, 585: insulating layer, 587: electrode layer, 588: electrode layer, 589: spherical particle, 590a: black region, 590b: white region, 594: cavity, 595: filler, 596: substrate, 600: substrate, 601: counter substrate, 602: gate wiring, 603: gate wiring, 604: capacitor wiring, 605: capacitor wiring, 606: gate insulating film, 607: electrode layer, 608: channel protective layer, 609: common potential line, 611: channel protective layer, 615: capacitor electrode, 616: wiring, 617: capacitor wiring, 618: wiring, 619: wiring, 620: insulating film, 621: insulating film, 622: insulating film, 623: contact hole, 624: pixel electrode, 625: slit, 626: pixel electrode, 627: contact hole, 628: TFT, 629: TFT, 630: storage capacitor portion, 631: storage capacitor portion, 632: light shielding film, 633: contact hole, 636: coloring film, 637: planarization film, 640: counter electrode layer, 641: slit, 644: projection, 646: alignment film, 648: alignment film, 650: liquid crystal layer, 651: liquid crystal element, 652: liquid crystal element, 690: capacitor wiring, 2600: TFT substrate, 2601: counter substrate, 2602: sealant, 2603: pixel portion, 2604: display element, 2605: coloring layer, 2606: polarization plate, 2607: polarization plate, 2608: wiring circuit portion, 2609: flexible wiring board, 2610: cold cathode tube, 2611: reflector plate, 2612: circuit board, 2613: diffuser panel, 2700: electronic book, 2701: housing, 2703: housing, 2705: display portion, 2707: display portion, 2711: hinge, 2721: power button, 2723: operation key, 2725: speaker, 4001: substrate, 4002: pixel portion, 4003: signal line drive circuit, 4004: scan line drive circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4020: insulating layer, 4021: insulating layer, 4030: pixel electrode layer, 4031: counter electrode layer, 4032: insulating layer, 4040: conductive layer, 4041a: insulating layer, 4041b: insulating layer, 4042a: insulating layer, 4042b: insulating layer, 4501: substrate, 4502: pixel portion, 4503a, 4503b: signal line drive circuit, 4504a, 4504b: scan line drive circuit, 4505: sealant, 4506: substrate, 4507: filler, 4509: thin film transistor, 4510: thin film transistor, 4511: light-emitting device, 4512: electroluminescent layer, 4513: electrode layer, 4515: connection terminal electrode, 4516: terminal electrode, 4517: electrode layer, 4518a, 4518b: FPC, 4519: anisotropic conductive film, 4520: partition wall, 4540: conductive layer, 4541a: insulating layer, 4541b: insulating layer, 4542a: insulating layer, 4542b: insulating layer, 4543: insulating layer, 4544: insulating layer, 5300: substrate, 5301: pixel portion, 5302: scan line drive circuit, 5303: scan line drive circuit, 5304: signal line drive circuit, 5305: timing control circuit, 5601: shift register, 5602: switching circuit, 5603: thin film transistor, 5604: wiring, 5605: wiring, 6400: pixel, 6401: switching transistor, 6402: light-emitting element driving transistor, 6403: capacitor, 6404: light-emitting device, 6405: signal line, 6406: scan line, 6407: power supply line, 6408: common electrode, 7000: protective insulating layer, 7001: TFT, 7002: light-emitting device, 7003: cathode, 7004: light-emitting layer, 7005: anode, 7006: insulating layer, 7007: planarizing insulating layer, 7009: partition wall, 7011: light-emitting element driving TFT, 7012: light-emitting device, 7013: cathode, 7014: light-emitting layer, 7015: anode, 7016: cover film, 7017: conductive film, 7021: light-emitting element driving TFT, 7022: light-emitting device, 7023: cathode, 7024: light-emitting layer, 7025: anode, 7027: conductive film, 9201: display portion, 9202: display button, 9203: operation switch, 9204: band portion, 9205: adjusting portion, 9206: camera portion, 9207: speaker, 9208: microphone, 9301: top housing, 9302: bottom housing, 9303: display portion, 9304: keyboard, 9305: external connection port, 9306: pointing device, 9307: display portion, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: input means (operation key), 9886: recording medium insertion portion, 9887: connection terminal, 9888: sensor, 9889: microphone, 9890: LED lamp, 9891: housing, 9893: joint portion, 9900: slot machine, 9901: housing, 9903: display portion.

The invention claimed is:

1. A semiconductor device comprising:
   a substrate;
   a gate electrode layer on the substrate;
   a silicon nitride layer on the gate electrode layer;
   a first silicon oxide layer on the silicon nitride layer;
   a oxide semiconductor layer on and in contact with the first silicon oxide layer;
   a second silicon oxide layer on and in contact with a channel formation region of the oxide semiconductor layer and covering lateral end portions of the oxide semiconductor layer;
   a first conductive layer and a second conductive layer each on and in contact with the second silicon oxide layer
   a third silicon oxide layer on and in contact with the first conductive layer, the second conductive layer and the second silicon oxide layer;

a planarizing insulating layer on the third silicon oxide layer, the planarizing insulating layer comprising an organic material; and a pixel electrode layer on the planarizing insulating layer, wherein each of the first conductive layer and the second conductive layer are on and in contact with the oxide semiconductor layer through an opening formed in the second silicon oxide layer and overlapping with the gate electrode layer, and wherein the pixel electrode layer is on and in contact with the first conductive layer through an opening formed in the planarizing insulating layer and the third silicon oxide layer.

2. The semiconductor device according to claim 1, the oxide semiconductor layer further comprising:

a first portion and a second portion each in contact with the third silicon oxide layer, wherein the first portion and the second portion are localized between the first conductive layer and the second conductive layer when seen in a cross-section view taken along a length direction of the channel formation region.

3. The semiconductor device according to claim 1, further comprising:

an inorganic layer interposed between the third silicon oxide layer and the planarizing insulating layer.

4. The semiconductor device according to claim 1, further comprising:

an alignment layer on and in contact with the pixel electrode layer.

5. The semiconductor device according to claim 1, wherein the first conductive layer and the second conductive layer are each a stack of two layers and comprise titanium and copper, wherein the gate electrode layer comprises titanium, and wherein the pixel electrode layer is an ITO layer.

6. The semiconductor device according to claim 1, wherein the semiconductor device is a display panel.

7. An electronic device including the semiconductor device according to claim 1.

8. A semiconductor device comprising:

a substrate;

a gate electrode layer on the substrate;

a silicon nitride layer on and in contact with the gate electrode layer;

a first silicon oxide layer on and in contact with the silicon nitride layer;

a oxide semiconductor layer on and in contact with the first silicon oxide layer;

a second silicon oxide layer on and in contact with a channel formation region of the oxide semiconductor layer and covering lateral end portions of the oxide semiconductor layer;

a first conductive layer and a second conductive layer each on and in contact with the second silicon oxide layer a third silicon oxide layer on and in contact with the first conductive layer, the second conductive layer and the second silicon oxide layer;

a planarizing insulating layer on the third silicon oxide layer, the planarizing insulating layer comprising an organic material; and a pixel electrode layer on and in contact with the planarizing insulating layer, wherein each of the first conductive layer and the second conductive layer are on and in contact with the oxide semiconductor layer through an opening formed in the second silicon oxide layer and overlapping with the gate electrode layer, and wherein the pixel electrode layer is on and in contact with the first conductive layer through an opening formed in the planarizing insulating layer and the third silicon oxide layer.

9. The semiconductor device according to claim 8, the oxide semiconductor layer further comprising:

a first portion and a second portion each in contact with the third silicon oxide layer, wherein the first portion and the second portion are localized between the first conductive layer and the second conductive layer when seen in a cross-section view taken along a length direction of the channel formation region.

10. The semiconductor device according to claim 8, further comprising:

an inorganic layer interposed between the third silicon oxide layer and the planarizing insulating layer.

11. The semiconductor device according to claim 8, further comprising:

an alignment layer on and in contact with the pixel electrode layer.

12. The semiconductor device according to claim 8, wherein the first conductive layer and the second conductive layer are each a stack of two layers and comprise titanium and copper, wherein the gate electrode layer comprises titanium, and wherein the pixel electrode layer is an ITO layer.

13. The semiconductor device according to claim 8, wherein the semiconductor device is a display panel.

14. An electronic device including the semiconductor device according to claim 8.

15. A semiconductor device comprising:

a substrate;

a gate electrode layer on the substrate;

a silicon nitride layer on the gate electrode layer;

a first silicon oxide layer on the silicon nitride layer;

a oxide semiconductor layer on and in contact with the first silicon oxide layer;

a second silicon oxide layer on and in contact with a channel formation region of the oxide semiconductor layer and covering lateral end portions of the oxide semiconductor layer;

a first conductive layer and a second conductive layer each on and in contact with the second silicon oxide layer a third silicon oxide layer on and in contact with the first conductive layer, the second conductive layer and the second silicon oxide layer;

a planarizing insulating layer on the third silicon oxide layer, the planarizing insulating layer comprising an organic material; and a pixel electrode layer on the planarizing insulating layer, wherein the oxide semiconductor layer entirely overlaps with the gate electrode layer;

wherein each of the first conductive layer and the second conductive layer are on and in contact with the oxide semiconductor layer through an opening formed in the second silicon oxide layer and entirely overlapping with the gate electrode layer, and wherein the pixel electrode layer is electrically connected to the first conductive layer through an opening formed in the planarizing insulating layer and the third silicon oxide layer.

16. The semiconductor device according to claim 15, further comprising:

an inorganic layer interposed between the third silicon oxide layer and the planarizing insulating layer.

17. The semiconductor device according to claim 15, further comprising:
an alignment layer on and in contact with the pixel electrode layer.

18. The semiconductor device according to claim 15,
wherein the first conductive layer and the second conductive layer are each a stack of two layers and comprise titanium and copper,
wherein the gate electrode layer comprises titanium, and
wherein the pixel electrode layer is an ITO layer.

19. The semiconductor device according to claim 15,
wherein the semiconductor device is a display panel.

20. The semiconductor device according to claim 19,
wherein the oxide semiconductor layer is comprised in a driver circuit of the display panel.

21. An electronic device including the semiconductor device according to claim 15.

22. A semiconductor device comprising:
a substrate;
a gate electrode layer on the substrate;
a silicon nitride layer on and in contact with the gate electrode layer;
a first silicon oxide layer on and in contact with the silicon nitride layer;
a oxide semiconductor layer on and in contact with the first silicon oxide layer;
a second silicon oxide layer on and in contact with a channel formation region of the oxide semiconductor layer and covering lateral end portions of the oxide semiconductor layer;
a first conductive layer and a second conductive layer each on and in contact with the second silicon oxide layer
a third silicon oxide layer on and in contact with the first conductive layer, the second conductive layer and the second silicon oxide layer;
a planarizing insulating layer on the third silicon oxide layer, the planarizing insulating layer comprising an organic material; and
a pixel electrode layer on and in contact with the planarizing insulating layer,
wherein the oxide semiconductor layer entirely overlaps with the gate electrode layer;
wherein each of the first conductive layer and the second conductive layer are on and in contact with the oxide semiconductor layer through an opening formed in the second silicon oxide layer and entirely overlapping with the gate electrode layer, and
wherein the pixel electrode layer is electrically connected to the first conductive layer through an opening foliated in the planarizing insulating layer and the third silicon oxide layer.

23. The semiconductor device according to claim 22, further comprising:
an inorganic layer interposed between the third silicon oxide layer and the planarizing insulating layer.

24. The semiconductor device according to claim 22, further comprising:
an alignment layer on and in contact with the pixel electrode layer.

25. The semiconductor device according to claim 22,
wherein the first conductive layer and the second conductive layer are each a stack of two layers and comprise titanium and copper,
wherein the gate electrode layer comprises titanium, and
wherein the pixel electrode layer is an ITO layer.

26. The semiconductor device according to claim 22,
wherein the semiconductor device is a display panel.

27. The semiconductor device according to claim 26,
wherein the oxide semiconductor layer is comprised in a driver circuit of the display panel.

28. An electronic device including the semiconductor device according to claim 22.

* * * * *

UNITED STATES PATENT AND TRADEMARK OFFICE
CERTIFICATE OF CORRECTION

PATENT NO.        : 8,809,856 B2
APPLICATION NO.   : 13/784908
DATED             : August 19, 2014
INVENTOR(S)       : Shunpei Yamazaki et al.

It is certified that error appears in the above-identified patent and that said Letters Patent is hereby corrected as shown below:

In the Specification

Column 4, line 8, replace "fainted" with --formed--;

Column 10, line 10, replace "farmer" with --formed--;

Column 28, line 49, replace "Si" with --S1--;

Column 28, line 64, replace "5603k" with --5603_k--;

Column 29, line 26, replace "5605_y" with --5605_N--;

Column 30, line 14, replace "IV)" with --N)--;

Column 40, line 32, after "effect" replace ";" with --,--;

Column 45, line 15, replace "framed" with --formed--;

Column 47, line 30, replace "forced" with --formed--;

Column 53, line 54, replace "a is" with --a TFT is--;

Column 54, line 58, replace "foamed" with --formed--; and

In the Claims

Column 62, line 14, in claim 22, replace "foliated" with --formed--.

Signed and Sealed this
Twenty-third Day of June, 2015

Michelle K. Lee
*Director of the United States Patent and Trademark Office*